(12) United States Patent
Hiramoto et al.

(10) Patent No.: US 6,767,655 B2
(45) Date of Patent: Jul. 27, 2004

(54) MAGNETO-RESISTIVE ELEMENT

(75) Inventors: Masayoshi Hiramoto, Nara (JP);
Nozomu Matukawa, Nara (JP);
Akihiro Odagawa, Nara (JP); Kenji Iijima, Kyoto (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 270 days.

(21) Appl. No.: 09/931,113

(22) Filed: Aug. 16, 2001

(65) Prior Publication Data
US 2002/0055016 A1 May 9, 2002

(30) Foreign Application Priority Data

Aug. 21, 2000 (JP) .................................... 2000-249340
Oct. 30, 2000 (JP) .................................... 2000-330254

(51) Int. Cl.[7] ............................ G11B 5/31; G11B 5/33; G11B 5/39; H01F 10/26; H01F 10/32
(52) U.S. Cl. ................ 428/692; 360/324; 360/324.1; 360/324.11; 360/324.12; 427/130
(58) Field of Search ................ 428/692, 694 MM, 428/457; 360/324–324.2, 313, 314, 311; 427/130

(56) References Cited

U.S. PATENT DOCUMENTS

| 5,390,061 | A | | 2/1995 | Nakatani et al. |
|---|---|---|---|---|
| 5,408,377 | A | * | 4/1995 | Gurney et al. ............. 360/113 |
| 5,648,885 | A | * | 7/1997 | Nishioka et al. ........... 360/113 |
| 5,650,958 | A | | 7/1997 | Gallagher et al. |
| 5,901,018 | A | * | 5/1999 | Fontana, Jr. et al. ........ 360/104 |
| 5,949,622 | A | * | 9/1999 | Kamiguchi et al. ......... 360/113 |
| 5,953,248 | A | | 9/1999 | Chen et al. |
| 6,046,892 | A | * | 4/2000 | Aohima et al. ............. 360/113 |
| 6,051,309 | A | | 4/2000 | Fujikata et al. |
| 6,108,177 | A | * | 8/2000 | Gill ........................ 360/324.12 |
| 6,133,732 | A | * | 10/2000 | Hayashi et al. ............. 324/252 |
| 6,221,172 | B1 | | 4/2001 | Saito et al. |
| 6,271,997 | B1 | * | 8/2001 | Gill ............................ 360/314 |
| 6,275,363 | B1 | * | 8/2001 | Gill ........................... 360/324.2 |
| 6,313,973 | B1 | * | 11/2001 | Fuke et al. ............... 360/324.1 |
| 6,329,078 | B1 | * | 12/2001 | Tsuge .......................... 428/678 |
| 6,407,890 | B1 | * | 6/2002 | Gill ............................ 360/314 |
| 6,424,506 | B1 | | 7/2002 | Saito et al. |
| 6,639,764 | B2 | * | 10/2003 | Saito et al. ............ 360/324.11 |

FOREIGN PATENT DOCUMENTS

| DE | 199 34 009 | 1/2000 |
|---|---|---|
| EP | 0 913 830 | 5/1999 |
| EP | 1 033 764 | 9/2000 |

OTHER PUBLICATIONS

S. Cardoso et al.; "High thermal stability tunnel junctions"; Journal of Applied Physics; vol. 87, No. 9; May 1, 2000; pp. 6058–6060.

Proceedings of 112th Study Group of the Magnetics Society of Japan, pp. 35–42.

(List continued on next page.)

Primary Examiner—Paul Thibodeau
Assistant Examiner—Nikolas J Uhlir
(74) Attorney, Agent, or Firm—Merchant & Gould P.C.

(57) ABSTRACT

The present invention provides a vertical current-type magneto-resistive element. The element includes an intermediate layer and a pair of magnetic layers sandwiching the intermediate layer, and at least one of a free magnetic layer and a pinned magnetic layer is a multilayer film including at least one non-magnetic layer and magnetic layers sandwiching the non-magnetic layer. The element area defined by the area of the intermediate layer through which current flows perpendicular to the film is not larger than 1000 $\mu m^2$.

62 Claims, 15 Drawing Sheets

OTHER PUBLICATIONS

Parkin S S P et al: "Exchange–Biased Magnetic Tunnel Junctions and Application to Nonvolatile Magnetic Random Access Memory (Invited)", Journal of Applied Physics. American Institute of Physics, New York, US, vol. 85, No. 8, Apr. 15, 1000, PP 5828–5833.

Moon K–S et al: "Exchange–Biased Magnetic Tunnel Junctions: Dependence of Offset Field on Junction Width" Applied Physics Letters, American Institute of Physics. New York, US, vol. 74, No. 24, Jun. 14, 1999, PP 3690–3692.

Veloso A et al: "Spin Valve Sensors with Synthetic Free and Pinned Layers" Journal of Applied Physics, American Institute of Physics. New York, US, vol. 87, No. 0, May 1, 2000, PP 5744–5746.

Saito M. et al: "PTMN Spin Valve with Synthetic Ferrimagnet Free and Pinned Layers", Journal of Applied Physics, American Institute of Physics. New York, US, vol. 87, No. 9, May 1, 2000, PP 6974–6976.

Hu Y M et al: "Magnetic Anisotrophy of UN180FE20/MO/CO Spin–Valve Films Grown by MBE" IEEE Transactions on Magnetics, IEEE Inc., New York, US, vol. 33, No. 5, Part 2, Sep. 1997, PP 3952–3954.

Sakakima H et al: "Enhancement of MR ratios using thin oxide layers in PtMn and alpha–Fe2O3–based spin valves-"Journal of Magnetism and Magnetic Materials, Elsevier Science Publishers, Amsterdam, NL, vol. 210, No. 1–3, Feb. 2000, PP 20–24.

Cardoso S et al: "High Thermal Stability Tunnel Junctions", Journal of Applied Physics, American Institute of Physics, New York, US, vol. 87, No. 9, May 1, 2000, PP 6058–6060.

* cited by examiner

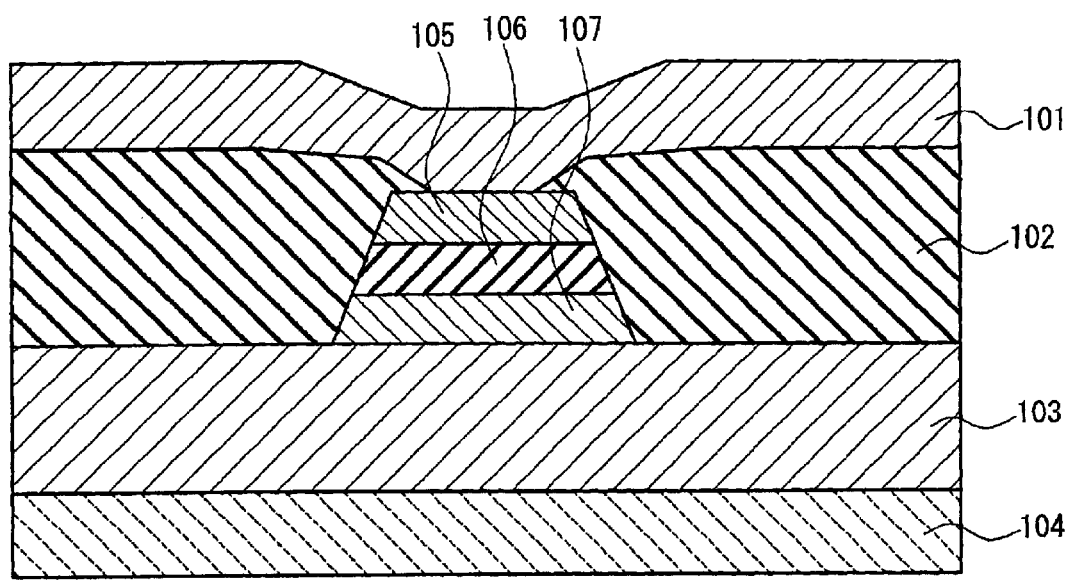
F I G. 1

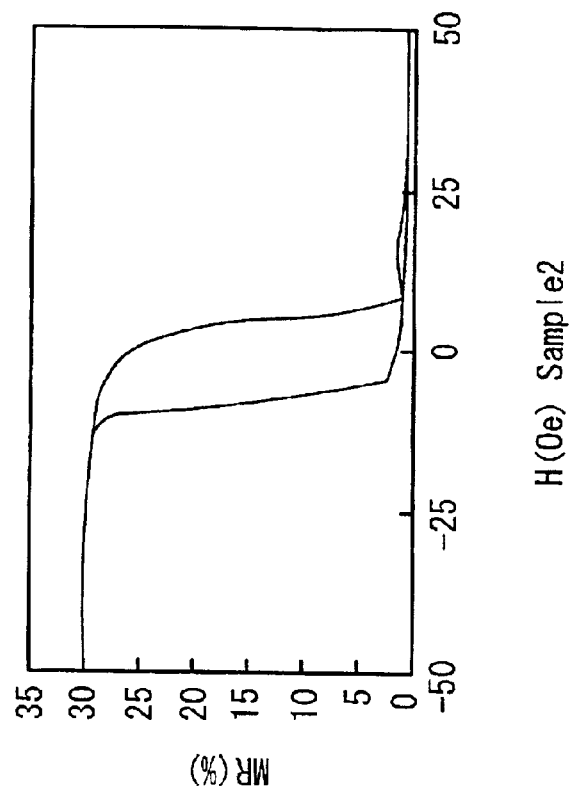
F I G. 3B
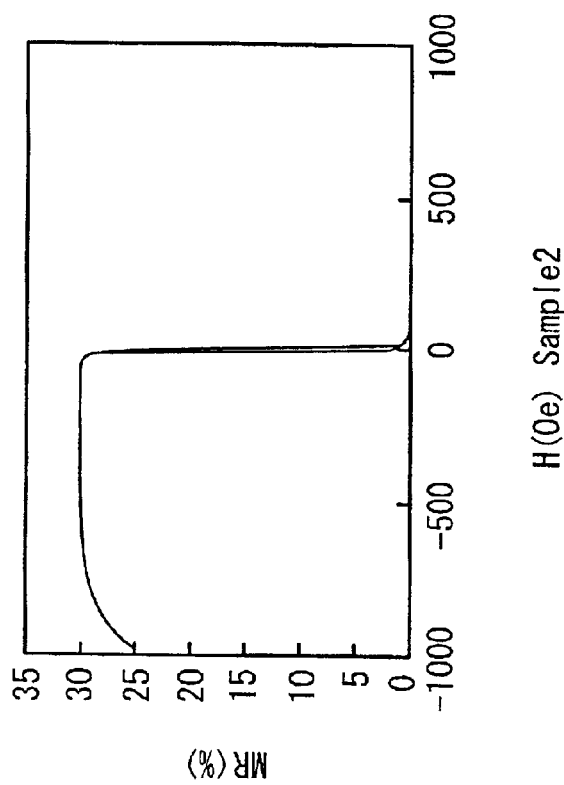
F I G. 3A

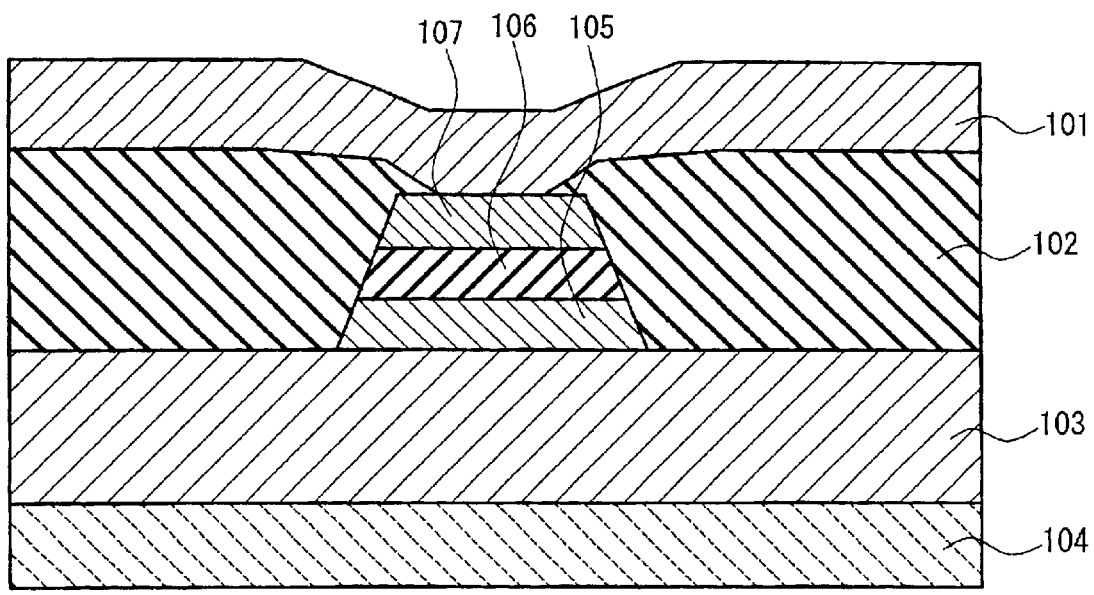
F I G. 7
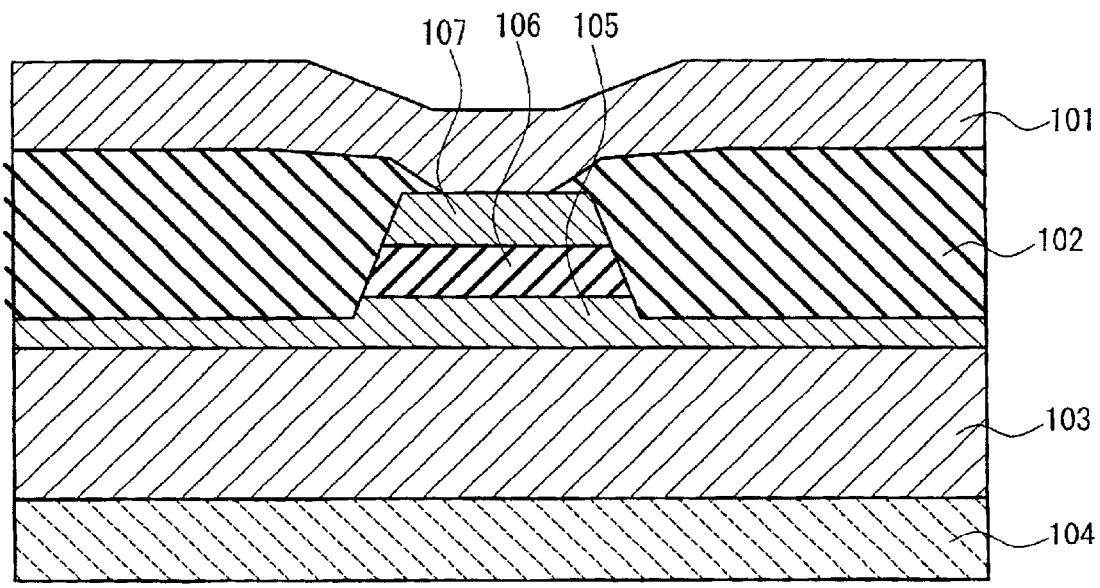
F I G. 8

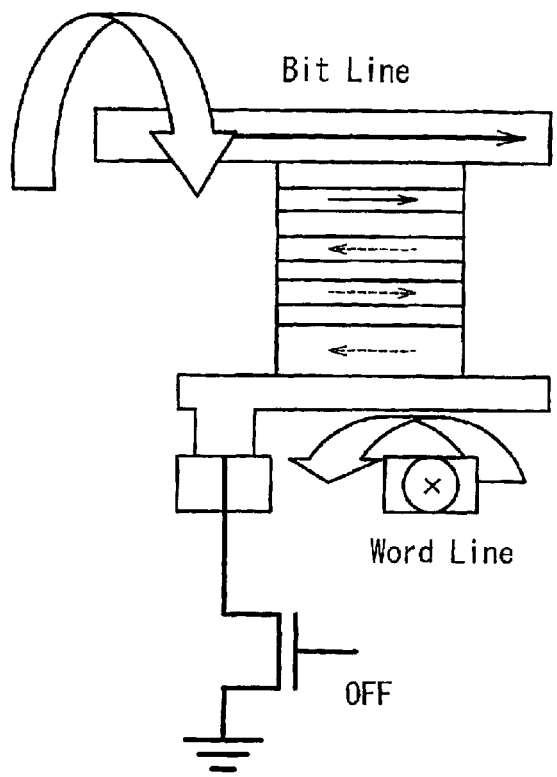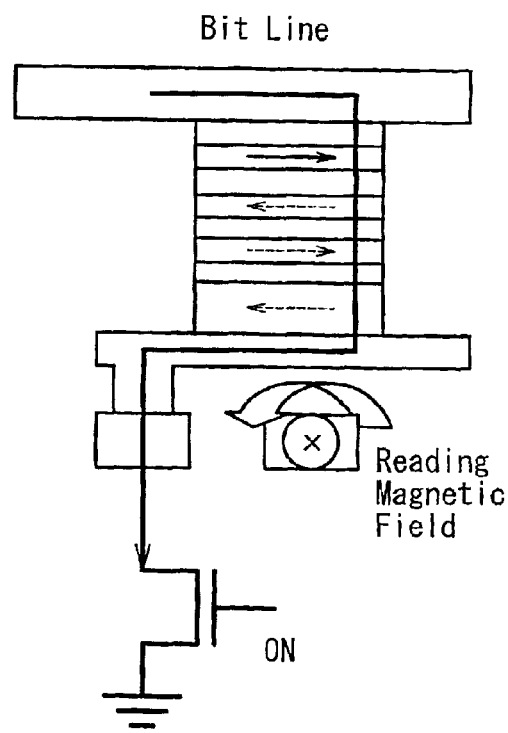
Write Operation          Read Operation
F I G. 17A          F I G. 17B

MAGNETO-RESISTIVE ELEMENT

BACKGROUND OF THE INVENTION

1. Field of the Invention

The present invention relates to magneto-resistive elements that are widely used, for example, in magnetic random access memory (MRAM) used in data communication terminals, for example, and to manufacturing methods for the same.

2. Description of the Related Art

It is known that when a current flows through a multilayer film including ferromagnetic material/intermediate layer/ferromagnetic material in a direction traverse to the intermediate layer, a magneto-resistive effect occurs due to the spin tunneling effect if the intermediate layer is a tunneling insulating layer, and a magneto-resistive effect occurs due to the CPP (current perpendicular to the plane)-GMR effect if the intermediate layer is a conductive metal, such as Cu. Both magneto-resistive effects depend on the size of the angle between the magnetizations of the magnetic materials sandwiching the intermediate layers (magnetization displacement angle). In the former, the magneto-resistive effect occurs due to changes of the transition probability of tunneling electrons flowing through the two magnetic layers depending on the magnetization displacement angle, and in the latter the magneto-resistive effect occurs due to changes in the spin-dependent scattering.

When such a TMR element is used for a magnetic head or an MRAM device, one of the two magnetic layers sandwiching the intermediate layer can serve as a pinned magnetic layer, in which magnetization rotations with respect to an external field are difficult, by layering an antiferromagnetic material of FeMn or IrMn onto it, whereas the other layer serves as a free magnetic layer, in which magnetization rotations with respect to an external field are easy (spin-valve element).

When applying these vertical current-type resistive elements for example to a magnetic head or memory elements of an MRAM, for example in a reproduction element for tape media, then the area of the intermediate layer through which current flows should be not larger than several 1000 $\mu m^2$, in order to achieve the demanded high recording densities or high installation densities. Especially in HDDs and MRAMs or the like, an element area of not more than several $\mu m^2$ is desired. If the element area is large, magnetic domains form relatively easily in the free magnetic layer Therefore, there are the problems of Barkhausen noise due to magnetic wall transitions when used as a reproduction element, and instabilities of the switching magnetization when used for the memory operation of MRAMs. On the other hand, in a region, in which the film thickness of the free magnetic layer with respect to the element area cannot be ignored, the demagnetizing field due to shape anisotropies becomes large, so that especially when used as a reproduction head, the decrease of the reproduction sensitivity brought about by an increase of the coercivity becomes a problem. When used as an MRAM, the increase of the reversal magnetic field becomes a problem.

In order to suppress the demagnetizing field, the film thickness of the free magnetic layer can be made thinner. However, at submicron dimensions, the film thickness of the magnetic layer necessary to suppress the demagnetizing field becomes less than 1 nm, which is below the physical film thickness limit of magnetic films.

Using the TMR elements for an MRAM, a thermal process at about 400° C. is performed in a semiconductor process of hydrogen sintering or a passivation process. However, it has been reported that in conventional pinned layers, in which IrMn or FeMn is arranged in contact with a magnetic layer, the MR is decreased by the decrease of the spin polarizability of the magnetic layer due to diffusion of Mn at temperatures of about 300° C. or above, and the decrease of the pinning magnetic field due to the dilution of the composition of the antiferromagnetic material (see S. Cardoso et.al., J. Appl.Phys. 87, 6058(2000)).

In previously proposed methods for reading non-volatile MRAM elements, the read-out is difficult when there are large variations in element resistance or in the resistance of switching element and electrode, because what is read out is the change of magnetic resistance of the magneto-resistive element with respect to the total resistance of magneto-resistive elements connected in series to a switching element and an electrode. In order to improve the SIN, a method of reading an element with the voltage between that element and a reference element has been proposed, but in that case, the higher integration of the elements becomes a problem, because the reference element is necessary (see p. 37, Proceedings of $112^{th}$ Study Group of the Magnetics Society of Japan).

SUMMARY OF THE INVENTION

According to a first aspect of the present invention, a vertical current-type magneto-resistive element includes an intermediate layer and a pair of magnetic layers sandwiching the intermediate layer, wherein one of the magnetic layers is a free magnetic layer in which magnetization rotation with respect to an external magnetic field is easier than in the other magnetic layer, wherein the free magnetic layer is a multilayer film including at least one non-magnetic layer and magnetic layers sandwiching the non-magnetic layer, and wherein an element area through which current flows is not larger than 1000 $\mu m^2$, preferably not larger than 10 $\mu m^2$, more preferably not larger than 1 $\mu m^2$, most preferably not larger than 0.1 $\mu m^2$. The element area is defined by the area of the intermediate layer through which the current flows perpendicular to the film plane. Providing the free magnetic layer as a multilayer structure of magnetic and non-magnetic layers suppresses the demagnetizing field, which increases as the element area becomes smaller. Here, the magnetic and non-magnetic layers can be single layers or multilayers. It is preferable that the free magnetic layer performs magnetization rotation at an external magnetic field causing magnetization rotation that is at least 50 Oe (ca. 4 kA/m) smaller than that required for magnetization rotation of the other magnetic layers (usually, the pinned magnetic layer). Especially when the element is used for a memory, it is preferable that magnetization rotation at a value of 10 to 500 Oe is possible.

It is preferable that, in particular near 0.5 nm of the interface with the intermediate layer, the magnetic layers are made of a ferromagnetic or ferrimagnetic material including at least 50 wt % of (i) a Co-based amorphous material such as CoNbZr, CoTaZr, CoFeB, CoTi, CoZr, CoNb, CoMoBZr, CoVZr, CoMoSiZr, CoMoZr, CoMoVZr or CoMnB, (ii) an Fe-based microcrystal material, such as FeSiNb or Fe(Si, Al,Ta,Nb,Ti)N, (iii) a magnetic material containing at least 50 wt % of a ferromagnetic metal element selected from Fe, Co and Ni, for example ferromagnetic or dilute magnetic materials like FeCo alloy, NiFe alloy, NiFeCo alloy, FeCr, FeSiAl, FeSi, FeAl, FeCoSi, FeCoAl, FeCoSiAl, FeCoTi, Fe(Ni)Co)Pt, Fe(Ni)(Co)Pd, Fe(Ni)(Co)Rh, Fe(Ni)(Co)Ir or Fe(Ni)(Co)Ru, (iv) a nitride, such as FeN, FeTiN, FeAlN, FeSiN, FeTaN, FeCoN, FeCoTiN, FeCoAlN, FeCoSiN, FeCoTaN, (v) $Fe_3O_4$, (vi) a half metal, such as XMnSb (wherein X is at least one selected from Ni, Cu and Pt), LaSrMnO, LaCaSrMnO or $CrO_2$, (vii), a spinel oxide such as a perovskite oxide, MnZn ferrite or NiZn ferrite, or (viii) a garnet oxide. In this specification, elements or layers in parentheses are optional ones.

It is preferable that the area of the free magnetic layer is wider than the element area. If the area of the free magnetic layer is substantially the same as the element area, then the MR decreases due to the influence of disturbances of the domain structure that occur at the edge of the free magnetic layer. When the area of the free magnetic layer is larger than the element area, and when the free magnetic layer is formed to cover the element area sufficiently, then the edges of the free magnetic layer are separated from the element area, so that the magnetization direction inside the free magnetic layer that contributes to the magnetic resistance can be kept uniform.

It is preferable that the magneto-resistive element includes a non-magnetic layer with a thickness d in the range of $2.6\,nm \leq d < 10\,nm$, because that facilitates magnetization rotation of the free magnetic layer. It seems that the demagnetizing field energy is reduced by the magnetostatic coupling of the magnetic poles occurring due to the shape anisotropy between the magnetic layers located on both sides of the non-magnetic layer. By providing the free magnetic layer with the above-described configuration, the magnetic domains are simplified, and a high MR can be attained. If "d" is 10 nm or more, then the magnetostatic coupling between the magnetic layers becomes weak and the coercivity increases. If "d" is less than 2.6 nm, then the exchange coupling becomes dominant. In that case, it is preferable that the thickness of the magnetic layers is at least 1 nm and at most 100 nm, in which range suitable magnetostatic coupling is attained. The non-magnetic material can be any non-magnetic metal, oxide, nitride or carbide, such as Ti, Zr, Hf, V, Nb, Ta, Cr, Mo, W Al, $SiO_2$, SiC, $Si_3N_4$, $Al_2O_3$, AlN, $Cr_2O_3$, $Cr_2N$, TiO, TiN, TiC, $HfO_2$, HfN, HfC, $Ta_2O_5$, TaN, TaC, BN or $B_4C$, and preferably it is a material at which mutual diffusion with the magnetic layer does not occur easily when thermally processing at 200° C. to 400° C.

It is preferable that when the magnetic layers constituting the free magnetic layer are coupled by magnetostatic coupling, taking the magnetic layers that are arranged at positions m (m=1, 2, ... ) from the intermediate layer as magnetic layers m, and taking the product Mm×dm of average saturation magnetization Mm of the magnetic layers m and their average layer thickness dm, the sum of the products Mm×dm for odd m is substantially equal to the sum of the products Mm×dm for even m. This is, because by stopping magnetic field leakages from the magnetic layer and simplifying the magnetic domains, a magneto-resistive element with improved magnetization responsiveness with respect to an external magnetic field and with a higher MR can be attained. Here, "substantially equal" means that differences of up to ±10% can be tolerated.

It should be noted that throughout this specification, "saturation magnetization" means the value of the magnetization that can be effectively attained by the magnetic layers constituting the free magnetic layer when applying an external magnetic field of a size as under actual usage conditions of the element. That is to say, it is different from the saturation magnetization as determined by the material composition. This is because, especially in magnetic layers of about several nm thickness per layer, the domain forms that can be obtained depend on the substantial film density and film structure, which change with the type of primer layer and the growth process of the magnetic layer, as well as the film thickness.

When the magnetic layers constituting the free magnetic layer are coupled by magnetostatic coupling, the sum of the products Mm×dm for odd m may be different from the sum of the products Mm×dm for even m. When they are substantially the same, then the leakage flux between the magnetic layers constituting the free magnetic layer is mainly closed by magnetostatic coupling. Consequently, even when processing so as to provide the free magnetic layers with shape anisotropies, a bistable magnetization state, which usually can be observed in single-layer magnetic films, is difficult to attain. Therefore, the element becomes difficult to apply to devices in which the free magnetic layer serves as the memory. However, if the sum of the products Mm×dm for odd m is different from the sum of the products Mm×dm for even m, that is, if it is not substantially the same, then a magneto-resistive element can be attained, in which magnetization reversals are easy and a bistable magnetization state can be preserved.

It is preferable that the magneto-resistive element includes a non-magnetic layer with a thickness d in the range of $0.3\,nm < d < 2.6\,nm$. The magnetization rotation of the free magnetic layer becomes easier when the thickness of the non-magnetic layer is in that range. This seems to be because the demagnetizing field energy is reduced by antiferromagnetic coupling between the magnetic layers adjacent to the non-magnetic layer. When the free magnetic layer has the above-described structure, the domains are simplified, and a high MR can be attained. When "d" is 0.3 or less, then the thermal stability deteriorates. When "d" is 2.6 nm or more, the magnetostatic coupling becomes dominant. Moreover, for the coupling brought about by a thermal process with at least 260° C., "d" is preferably in the range of 0.8 nm to 2.6 nm. In that case, it is preferable that the thickness of the magnetic layers is at least 0.5 nm and at most 100 nm, in which range suitable antiferromagnetic coupling is attained.

The non-magnetic material can be a conductive metal or metal compound, and in particular, Cu, Ag, Au, Ru, Rh, Ir, Re and Os are preferable. Also preferable are alloys of these metals and alloys or compounds containing at least 50 wt % of these metal elements. These alloys and compounds have excellent thermal stability, and the element resistance is increased in particular when used for CPP-GMR.

When the magnetic layers constituting the free magnetic layer are coupled by antiferromagnetic coupling, it is preferable that taking the magnetic layers arranged at positions m (m=1, 2, ... ) from the intermediate layer as magnetic layers m, and taking the product Mm×dm of average saturation magnetization Mm of the magnetic layers m and their average layer thickness dm, the sum of the products Mm×dm for odd m is different from the sum of the products Mm×dm for even m. If the product Mm×dm of the layers for odd m is the same as that of the layers for even m, then magnetization rotation is difficult when the external magnetic field is weak, because the magnetic layers are coupled by antiferromagnetic coupling. By making the extent to which the demagnetizing field increases different (for example, 0.5 to 2 T•nm), magnetization rotations in response to an external magnetic field become even easier, and a magneto-resistive element with a low reversal magnetic field and high MR can be attained.

It is preferable that in the above-described element, the free magnetic layer includes a first magnetic layer, a non-magnetic layer and a second magnetic layer, layered in that order from the intermediate layer, and when an average film thickness of the first magnetic layer is d1, its average saturation magnetization is M1, an average film thickness of the second magnetic layer is d2, and its average saturation magnetization is M2, then $$1.1 < (M1 \times d1 + M2 \times d2)/S < 20;$$

(wherein S is the absolute value of M1×d1−M2×d2); and (i) taking the effective film thickness d11 of the first magnetic layer as $$d11 = (M1 \times d1 - M2 \times d2)/M1$$

when M1×d1−M2×d2>0, and (ii) taking the effective film thickness d22 of the second magnetic layer as $$d22 = (M2 \times d2 - M1 \times d1)/M2$$

when M1×d1−M2×d2<0, and taking as Nm the demagnetizing factor in the free magnetic layer surface in a direction of an applied external magnetic field, determined from the effective film thickness d11 or d22 and the free magnetic layer surface shape, then Nm<0.02. When the value of (M1×d1+M2×d2)/S is 1.1 or less, then the effect of simplifying the magnetic domains becomes weak, and when it is 20 or greater, then there is a considerable increase in the coercivity. Moreover, if the demagnetizing factor Nm of an applied magnetic field direction, determined from the surface shape of the free magnetic layer (for example, circular or rectangular) and the effective film thickness d11 or d22, is 0.02 or greater, then there are disturbances in the magnetic domain shape, and there is an increase in the energy necessary for magnetization rotation.

It is preferable that, when M2×d2>M1×d1, the magnetic material constituting the second magnetic layer is a soft magnetic material or a hard magnetic material, and the magnetic material constituting the first magnetic layer is a high spin polarization material at least at an interface with the intermediate layer. If the product M2×d2 of the soft magnetic material is larger than the product M1×d1 of the high spin polarization material, then the magnetization rotation in response to an external magnetic field is easy, and a magneto-resistive element with few magnetic domain disturbances and a high MR can be attained. Such a magneto-resistive element with easy magnetization rotation can be used as a magnetic sensor, but if the free magnetic layer is used for a memory element, then it can be used as a stable magnetic memory by providing a suitable shape anisotropy in the film plane of the free magnetic layer. On the other hand, if the product M2×d2 of the hard magnetic material is larger than the product M1×d1 of the high spin polarization material, then the magnetization rotation in response to an external magnetic field is difficult, and a magneto-resistive element with few magnetic domain disturbances and a high MR can be attained. Using a hard magnetic material, a stable magnetic memory can be attained, even with small shape anisotropies. Here, it is preferable to use a material with a spin polarizability of at least 0.45, more preferably at least 0.5, as the high spin polarization material.

It is preferable to use, for example, CoPt, FePt, CoCrPt, CoTaPt, FeTaPt or FeCrPt as the hard magnetic material.

For the soft magnetic material, it is preferable to use an alloy such as $Ni_{81}Fe_{19}$, FeSiAl, FeSi or $Fe_{90}Co_{10}$, a Co-based amorphous material such as CoNbZr, CoTaZr, CoFeB, CoTi, CoZr, CoNb, CoMoBZr, CoVZr, CoMoSiZr, CoMoZr, CoMoVZr or CoMnB, an Fe-based microcrystal material such as FeSiNb or Fe(Si, Al, Ta, Nb, Ti)N, or an oxide material such as MnZn ferrite or NiZn ferrite.

In the high spin polarization material, it is preferable to include at least 50 wt % of (i) a metal ferromagnetic material of which at least 50 wt % is made of a ferromagnetic metal element selected from Fe, Co and Ni, for example a FeCo alloy with the composition $Fe_xCo_{(100-x)}$ ($15 \leq X \leq 100$), NiFe alloy with the composition $Ni_xFe_{(100-x)}$ ($40 \leq X \leq 70$), NiFeCo alloy, ferromagnetic or dilute magnetic alloys, such as FeCr, FeSiAl, FeSi, FeAl, FeCoSi, FeCoAl, FeCoSiAl, FeCoTi, Fe(Ni)(Co)Pt, Fe(Ni)(Co)Pd, Fe(Ni)(Co)Rh, Fe(Ni)(Co)Ir and Fe(Ni)(Co)Ru, (ii) a nitride such as FeN, FeTiN, FeAlN, FeSiN, FeTaN, FeCoN, FeCoTiN, FeCoAlN, FeCoSiN, FeCoTaN, (iii) $Fe_3O_4$, (iv) a half metal ferromagnetic material, such as XMnSb (wherein X is at least one selected from Ni, Cu and Pt), LaSrMnO, LaCaSrMnO or $CrO_2$, (v) an oxide, such as a perovskite oxide, a spinel oxide, or a garnet oxide.

In the above-described element, it is also possible that the free magnetic layer includes a first magnetic layer, a non-magnetic layer and a second magnetic layer, layered in that order from the intermediate layer, and when an average film thickness of the first magnetic layer is d1, its average saturation magnetization is M1, an average film thickness of the second magnetic layer is d2, and its average saturation magnetization is M2, then M2×d2>M1×d1, and a magneto-resistive element can be devised in which the magnetic resistance displays at least one maximum or minimum in response to a change of the external magnetic field. Here, the two magnetic layers constituting the free magnetic layer are coupled by antiferromagnetic coupling or magnetostatic coupling through the non-magnetic layer, such that it can be made sure that their magnetizations are antiparallel to one another. If the behavior of the magnetization rotation with respect to the size of the magnetic field is different, then it is also possible to use magnetic layers (free magnetic layers) in which magnetization rotations are possible on both sides of the intermediate layer. When two free magnetic layers are arranged so as to sandwich the intermediate layer, at least one free magnetic layer, preferably at least the layer in which magnetization rotated more easily, includes a first magnetic layer, a non-magnetic layer and a second magnetic layer, and the relation M2×d2>M1×d1 is satisfied, then the magnetic resistance displays at least one minimum or maximum with respect to changes in the external magnetic field.

When an external magnetic field is applied, first, the second magnetic layer is rotated in the direction of the external magnetic field. The first magnetic layer is coupled to the second magnetic layer by antiferromagnetic or magnetostatic coupling, and is oriented in substantially the opposite direction with respect to the external magnetic field. Furthermore, when a larger external magnetic field is applied, a spin-flop reversal occurs (in the following, magnetostatic coupling reversals with strong coupling are also referred to as "spin flops"), and all magnetic layers are oriented in the direction of the external magnetic field. Consequently, when the magnetization direction of the other magnetic layer flanking the intermediate layer is regarded as substantially constant, the magnetic resistance displays a maximum or minimum with respect to changes of the external magnetic field near the spin flops. Assuming that M2×d2<M1×d1, this maximum or minimum does not appear clearly. If the two magnetic layers that sandwich the intermediate layer both include a first magnetic layer, a non-magnetic layer, a second magnetic layer, formed in that order from the intermediate layer, and the relation $M2 \times d2 > M1 \times d1$ is satisfied, wherein an average film thickness of the first magnetic layer is d1, its average saturation magnetization is M1, an average film thickness of the second magnetic layer is d2, and its average saturation magnetization is M2, and if they have a different coercivity or spin flop magnetic field with respect to the external magnetic field, then it is possible to attain at least two maxima or minima.

The maxima or minima with respect to the external magnetic field allow a multi-level response of the magnetic resistance with respect to the external magnetic field. If a magnetic field is applied in a direction in which a spin flop occurs in the free magnetic layer, then it is possible to non-destructively read out, with the change of the magnetic resistance when applying an external magnetic field, the magnetization direction of at least the second magnetic layer that has been as stored the magnetization direction, utilizing the fact that it returns reversibly when the external magnetic field is removed.

The intensity of the spin flop magnetic field can be controlled by the type and thickness of the magnetic films, and the type and thickness of the non-magnetic films. The coercivity can be easily adjusted with the crystal grain size of the material, the crystal magnetic anisotropic energy of the material itself, the element shape, the film thicknesses, and the shape magnetic anisotropic energy, which is a function of the saturation magnetization.

In the above-described element, it is preferable that the free magnetic layer comprises a first magnetic layer, a first non-magnetic layer, a second magnetic layer, a second non-magnetic layer, and a third magnetic layer, layered in that order from the intermediate layer, and when an average film thickness of the magnetic layer n is dn, and its average saturation magnetization is Mn (with n=1, 2, 3), then $M3 \times d3 > M1 \times d1$ and $M3 \times d3 > M2 \times d2$; and, with respect to an external magnetic field, a coupling magnetic field of the first magnetic layer and the second magnetic layer may be smaller than a memory reversal magnetic field. In this element, the memory direction of the magnetization of the third magnetic layer is detected with the change of the magnetic resistance when applying a magnetic field that is smaller than the memory reversal magnetic field but larger than the coupling magnetic field in a memory direction of the magnetization of the third magnetic layer.

Here, the third magnetic layer, which is a memory layer, has the highest coercivity or magnetization reversal magnetic field of all magnetic layers constituting the free magnetic layer, and is coupled strongly with the second magnetic layer by antiferromagnetic coupling, ferromagnetic coupling or magnetostatic coupling. The second magnetic layer and the first magnetic layer are coupled by antiferromagnetic coupling or magnetostatic coupling. The other ferromagnetic layer flanking the intermediate layer has a magnetization reversal magnetic field that is high with respect to the free magnetic layer, and it can be regarded substantially as a pinned magnetic layer. If, for example, the third magnetic layer and the second magnetic layer, as well as the second magnetic layer and the first magnetic layer are mutually coupled by antiferromagnetic coupling, then a spin flop occurs between the first magnetic layer and the second magnetic layer due to a step (i) of applying an external magnetic field in a direction that is the same as the magnetization direction stored by the third magnetic layer, and the magnetization of the second magnetic layer changes to parallel to the external magnetic field. In this step (i), there is hardly any change in the magnetization displacement angle between the pinned layer and the first magnetic layer.

When removing the external magnetic field, the magnetization of the second magnetic layer returns to its initial state. Of course, it is also possible to use a magnetic field of a strength at which no spin flops occur between the first magnetic layer and the second magnetic layer. On the other hand, in a step (ii) of applying an external magnetic field antiparallel to the magnetization direction that is stored by the third magnetic layer, the magnetization direction of the first magnetic layer is changed to be parallel to the external magnetic field, and the magnetization displacement angle between the pinned magnetic layer and the first magnetic layer changes.

If the external magnetic field is of a strength at which the third magnetic layer is not reverted, then, when the external magnetic field of (ii) is removed, the magnetization of the first magnetic layer returns to its initial state. By applying the external magnetic fields corresponding to these steps (i) and (ii), and detecting the change of the magnetic resistance, it is possible to determine the memory state of the magnetization of the third magnetic layer non-destructively. Usually, in vertical current-type magneto-resistive elements, the element resistance including the wiring resistance is detected, and the magnetization is detected, but because of variations of the element resistance and variations of the wiring resistance, it is not possible to make a decision if there is not a considerable change in the magnetic resistance. In order to overcome these issues, it has been proposed to read the operation voltage of a reference element, but this leads to more complicated wiring and lower circuit integration. There is also the possibility of detecting the memory state by applying an external magnetic field and changing the memory direction, but this destructs the memory state. With the present invention, the memory state of the magneto-resistive element can be detected non-destructively.

In the above-described element, the free magnetic layer is sandwiched by two intermediate layers, and includes magnetic and non-magnetic layers layered in alternation. The two magnetic layers (pinned magnetic layers), in which magnetization rotation is difficult, should be arranged on the outer sides of the two intermediate layers, with respect to the free magnetic layer. In the free magnetic layer sandwiched by the two pinned magnetic layers, the softness of the free magnetic layer and the symmetry of the response with respect to external magnetic fields is significantly harmed by the magnetic coupling with the pinned magnetic layers. If the free magnetic layer is devised as a multilayer structure with magnetostatic coupling or antiferromagnetic coupling, then the influence of the magnetic field leaking from the pinned magnetic layers can be reduced. Moreover, letting the free magnetic layer have a multilayer structure is also effective for suppressing the demagnetizing field of the free magnetic layer that comes with miniaturization.

In the above-described element, it is preferable that the free magnetic layer is sandwiched by two intermediate layers, and is made of 2n magnetic layers (with n being an integer of 1 or greater) and 2n−1 non-magnetic layers layered in alternation. Two magnetic layers in which magnetization rotations are difficult (pinned magnetic layers) should be further placed in opposition to the free magnetic layer on the outer sides of the two intermediate layers.

If the coupling among the magnetic layers forming the free magnetic layer is relatively weak, then the magnetization response to external magnetic fields is good. This seems to be because the 2n magnetic layers perform magnetization rotation under the loose constraints of the respective magnetization, so that the demagnetizing energy is suitably lowered. On the other hand, when the magnetic coupling sandwiching the non-magnetic material is strong, there is the effect that the domain structure of the 2n magnetic layers is improved, or the demagnetizing field is suppressed. It should be noted that the strength of the magnetic coupling, such as the magnetostatic coupling or antiferromagnetic coupling between the magnetic layers, can be controlled by the type and thickness of the non-magnetic material.

It is also possible practically to connect two magneto-resistive elements in series. In order to let the two elements connected in series display the largest change of magnetic resistance, the magnetization direction with maximum and minimum of the magnetic resistance of the two elements should be the same. If the polarity of the two magneto-resistive elements (that is, when the magnetic layers sandwiching the intermediate layer are parallel, the resistance is low, when they are antiparallel, the resistance is high, or, when the magnetic layers sandwiching the intermediate layer are parallel, the resistance is high, when they are antiparallel, the resistance is low) is the same, then, when the elements take on the same magnetization arrangement, the largest magnetic resistance changes with respect to changes of the external magnetic field can be attained.

If there are 2n magnetic layers and the magnetic coupling between the magnetic layers constituting the free magnetic layer is sufficiently weaker than the external magnetic field, then any of those 2n layers can be aligned easily with the external magnetic field. In this situation, if the polarity of the two magneto-resistive elements is the same, then the maximum magnetic resistance change can be attained when the magnetization directions of the two pinned magnetic layers are parallel.

If there are 2n magnetic layers and the magnetic coupling between the magnetic layers constituting the free magnetic layer is sufficiently stronger than the external magnetic field, and the magnetization of neighboring magnetic layers is anti-parallel, then, if the polarity of the two magneto-resistive elements is the same, the maximum magnetic resistance change can be attained when the magnetization directions of the two pinned magnetic layers are anti-parallel. The magnetization direction of the pinned magnetic layer can be controlled by changing the number of layers of the ferrimagnetic structure.

In the above-described element, it is preferable that the element includes a first pinned magnetic layer, a first intermediate layer, a first magnetic layer, a non-magnetic layer, a second magnetic layer, a second intermediate layer and a second pinned magnetic layer formed in that order, and when an average film thickness of the magnetic layer n (with n being 1 or 2) is dn, and its average saturation magnetization is Mn, then $M2 \times d2 \neq M1 \times d1$. Here, antiferromagnetic coupling or magnetostatic coupling is performed, so that the magnetization of the first magnetic layer is anti-parallel to the magnetization of the second magnetic layer. By making them anti-parallel, magnetization reversals occur with the difference between $M2 \times d2$ and $M1 \times d1$ serving as an effective magnetic layer.

Taking as an example the case where the polarity of a magneto-resistive element including a first pinned magnetic layer, a first intermediate layer and a first magnetic layer is the same as the polarity of a magneto-resistive element including a second magnetic layer, a second intermediate layer and a second pinned magnetic layer, it is preferable that the magnetization directions of the first pinned layer and the second pinned layer are anti-parallel.

The magnetization directions of the first pinned magnetic layer and the second pinned magnetic layer are made anti-parallel for example when the first pinned magnetic layer is a single ferromagnetic layer in contact with a first antiferromagnetic material, and the second pinned magnetic layer is a configured as ferromagnetic material/non-magnetic material/ferromagnetic material contacting a second antiferromagnetic material. This is only an example, and a similar effect also can be attained when changing the number of layers of the ferrimagnetic structure of the pinned layer, the number of layers of the free magnetic layer, or taking magneto-resistive elements with different polarity, which cases utilize the same principle.

In the above-described elements, it is preferable that at least one free magnetic layer is sandwiched by two intermediate layers, and is made of 2n+1 magnetic layers (with n being an integer of 1 or greater) and 2n non-magnetic layers layered in alternation. Two further magnetic layers in which magnetization rotations are difficult (pinned magnetic layers) should be placed in opposition to the free magnetic layer, on the outer side of the two intermediate layers.

If the coupling among the magnetic layers forming the free magnetic layer is relatively weak, then the magnetization response to external magnetic fields is good. This seems to be because the 2n+1 magnetic layers perform magnetization rotation with loose constraints of the respective magnetization, so that the demagnetizing energy is suitably lowered. On the other hand, when the magnetic coupling sandwiching the non-magnetic material is strong, there is the effect that the domain structure of the 2n+1 magnetic layers is improved, or the demagnetizing field is suppressed. It should be noted that the strength of the magnetic coupling, such as the magnetostatic coupling or antiferromagnetic coupling between the magnetic layers, can be controlled by the type and thickness of the non-magnetic material.

If there are 2n+1 magnetic layers and the magnetic coupling between the magnetic layers constituting the free magnetic layer is sufficiently weaker than the external magnetic field, then any of those 2n+1 layers can be aligned easily with the external magnetic field. In this situation, if the polarity of the two magneto-resistive elements is the same, then the maximum magnetic resistance change can be attained when the magnetization directions of the two pinned magnetic layers are parallel.

Similarly, if there are 2n+1 magnetic layers and the magnetic coupling between the magnetic layers constituting the free magnetic layer is sufficiently stronger than the external magnetic field, and the magnetization of neighboring magnetic layers is anti-parallel, then, if the polarity of the two magneto-resistive elements is the same, the maximum magnetic resistance change can be attained when the magnetization directions of the two pinned magnetic layers are parallel.

It is preferable that the magneto-resistive element includes a first pinned magnetic layer, a first intermediate layer, a first magnetic layer, a first non-magnetic layer, a second magnetic layer, a second non-magnetic layer, a third magnetic layer, a second intermediate layer and a second pinned magnetic layer formed in that order, and that, when an average film thickness of the magnetic layer n is dn (with n being 1, 2 or 3), and its average saturation magnetization is Mn, then $M3 \times d3 + M1 \times d1 \neq M2 \times d2$.

Here, the first magnetic layer, the second magnetic layer and the third magnetic layer are coupled by antiferromagnetic coupling or magnetostatic coupling, so that their magnetizations are anti-parallel to one another. When the relation $M3 \times d3 + M1 \times d1 > M2 \times d2$ is satisfied, the first magnetic layer and the third magnetic layer function effectively as magnetic layers with respect to external magnetic fields. In that case, because the second magnetic layer is magnetically coupled to the first magnetic layer and the third magnetic layer, it does not function apparently as a magnetic layer with respect to external magnetic fields, but when the first magnetic layer and the third magnetic layer perform a magnetization rotation in response to the external magnetic field, it performs a substantially simultaneous magnetization rotation while maintaining antiferromagnetic coupling or magnetostatic coupling with those layers. On the other hand, when the relation $M3 \times d3 + M1 \times d1 < M2 \times d2$ is satisfied, then the second magnetic layer functions effectively as a magnetic layer with respect to external magnetic fields. In that case, because the first magnetic layer and the third magnetic layer are magnetically coupled to the second magnetic layer, they do not function apparently as magnetic layers, but when the second magnetic layer perform a magnetization rotation in response to the external magnetic field, they performs a substantially simultaneous magnetization rotation.

If the polarity of a magneto-resistive element including a first pinned magnetic layer, a first intermediate layer and a first magnetic layer is the same as the polarity of a magneto-resistive element including a third magnetic layer, a second intermediate layer and a second pinned magnetic layer, then the maximum magnetic resistance change can be attained when the magnetization directions of the first pinned magnetic layer and the second pinned magnetic layer are the same. However, a similar effect also can be attained when changing the number of layers of the ferrimagnetic structure of the pinned magnetic layer, the number of layers of the free magnetic layer, or taking magneto-resistive elements with different polarity, which cases utilize the same principle.

In the above-described elements, it is preferable that at least one of the magnetic layers of the free magnetic layer has a coercivity or saturation magnetization that is different from the other magnetic layers.

For example, consider the case that the free magnetic layer is a multilayer film of magnetic and non-magnetic layers, and when taking the magnetic layers arranged at positions m (m=1, 2, ... ) from the intermediate layer as magnetic layers m, and taking the product $Mm \times dm$ of average saturation magnetization Mm of the magnetic layers m and their average film thickness dm, the sum of the products $Mm \times dm$ for odd m is substantially the same as the sum of the products $Mm \times dm$ for even m, and the magnetic layers are coupled by antiferromagnetic coupling or magnetostatic coupling. In that configuration, if during the microprocessing, all magnetic layers have the same coercivity by appropriate selection of materials and film thicknesses, then the magnetization rotation of the free magnetic layer is easy, whereas the storage of the magnetization state is difficult. However, when using for one magnetic layer a material whose coercivity is higher than that of the other magnetic layers, the demagnetizing field effect occurring due to the miniaturization can be suppressed, and a suitable coercivity for storing the magnetization state in the free magnetic layer can be created. This configuration has the advantage that a more stable and suitable coercivity can be attained than with storage by uniaxial anisotropy utilizing shape anisotropy, which depends strongly on the precision of the element miniaturization, and in which an overly large coercivity results easily from the miniaturization.

As another example, consider the case that, when taking the magnetic layers constituting the free magnetic layers arranged at positions m (m=1, 2, ... ) from the intermediate layer as magnetic layers m, and taking the product $Mm \times dm$ of average saturation magnetization Mm of the magnetic layers m and their average layer thickness dm, the sum of the products $Mm \times dm$ for odd m is different from the sum of the products $Mm \times dm$ for even m, and the magnetic layers are coupled by antiferromagnetic coupling or strong magnetostatic coupling. The reversal magnetic field of the miniaturized elements is substantially proportional to the difference of the product $Mm \times dm$ of the odd layers and the even layers. Mm or dm can be controlled to preserve a suitable reversal magnetic field in the microprocessed elements. However, in microprocessed elements of submicron dimension, there are technical limitations to the actual control of the film thickness, and variations in the reversal magnetic fields occur. Consequently, the variations in the reversal magnetic fields of elements in large areas can be controlled when a material with small M is chosen for the magnetic layers responsible for the reversal magnetic field.

It also is preferable to combine at least two magneto-resistive elements. A magneto-resistive element A has a free magnetic layer as described above, wherein the free magnetic layer comprises a first magnetic layer, a first non-magnetic layer and a second magnetic layer, layered in that order from the intermediate layer, and wherein $M2 \times d2 > M1 \times d1$. A magneto-resistive element B has an intermediate layer and a free magnetic layer, wherein the free magnetic layer comprises a first magnetic layer and a second magnetic layer, positioned in that order from the intermediate layer, and wherein $M3 \times d3 > M4 \times d4$. The element A and the element B respond to the same external magnetic field, and the output of element A and B is added to or subtracted from one another. The free magnetic layer in the element B may be composed of magnetic layers.

In this configuration, the first magnetic layer of the element A and the second magnetic layer of the element B point in the same direction as the external magnetic field. Consequently, the first magnetic layer in opposition to the intermediate layer points into different directions in element A and element B. If the pinned layers in element A and element B are oriented in the same direction, then, with respect to external magnetic fields of the same direction, the orientation of the external magnetic field at which element A has the largest resistance is different from that at which element B has the largest resistance. When used as a device, the peripheral circuit resistance is added to the resistance value of the magneto-resistive element, so that an adequate S/N ratio cannot be attained, but when combining the elements A and B as described above, the base resistance (circuit resistance+element resistance for low resistances) is canceled, thus attaining a high S/N ratio.

In another configuration of the present invention, the vertical current-type magneto-resistive element includes an intermediate layer; and a pair of magnetic layers sandwiching the intermediate layer; wherein one of the magnetic layers is a pinned magnetic layer in which magnetization rotation with respect to an external magnetic field is more difficult than in the other magnetic layer; wherein the pinned magnetic layer is in contact with a primer layer or an antiferromagnetic layer; and wherein an element area, which is defined by the area of the intermediate layer through which current flows perpendicular to the film plane, is not larger than 1000 $\mu m^2$, preferably not larger than 10 $\mu m^2$, more preferably not larger than 1 $\mu m^2$, most preferably not larger than 0.1 $\mu m^2$.

The pinned magnetic layer has a multilayer structure including a non-magnetic layer and magnetic layers sandwiching the non-magnetic layer, and a thickness d of the non-magnetic layer is in the range of 0.3 nm<d<2.6 nm.

It is preferable that magnetization rotation of the pinned magnetic layer occurs at field strengths that are at least 50 Oe higher than for the other magnetic layer (free magnetic layer).

With this configuration, the non-magnetic layer and the magnetic layers are coupled by antiferromagnetic coupling, the domains are simplified, and a high MR can be attained. In this situation, when d is 0.3 nm or less, the thermal stability deteriorates. When d is 2.6 nm or higher, the afore-mentioned magnetostatic coupling becomes dominant. If thermal processing is performed at temperatures of 300° C. or higher, then it is preferable that d is in the range of 0.7 nm to 2.6 nm. It is preferable that the thickness of the magnetic layers is about 0.3 nm to 10 nm, in which range strong antiferromagnetic coupling is attained.

For the non-magnetic material, it is possible to use a conductive metal or a metal compound, in particular Cu, Ag, Au, Ru, Rh, Ir, Re or Os. Furthermore, it is also possible to use metal alloys of these, or an alloy or compound containing at least 50 wt % of these metals.

Magnetization rotation with respect to external magnetic fields can be made difficult with a configuration in which, when the magnetic layers m are the magnetic layers in the pinned magnetic layer that are arranged at positions m (with m being an integer of 1 or greater) from the intermediate layer, Mm is an average saturation magnetization of the magnetic layers m and dm is their respective average layer thickness, then the sum of the products Mm×dm for odd m is substantially equal to the sum of the products Mm×dm for even m.

However, when the free magnetic layer is domain controlled by a bias magnetic field, or when the free magnetic layer is positively coupled with the intermediate layer, due to the so-called orange peel effect or the like, then it is also possible to generate a bias by letting the sum of the products Mm×dm for odd m slightly deviate from the sum of the products Mm×dm for even m, in order to rectify magnetic field shifts. However, it is preferable that the upper limit for this slight deviation is not larger than 2 nmT, expressed by saturation magnetization×film thickness.

It is also possible to combine two or more elements, including a magneto-resistive element A including a pinned magnetic layer, in which 2n imagnetic layers and 2n−1 non-magnetic layers (with n being an integer of 1 or greater) are layered in alternation from the intermediate layer; and a magneto-resistive element B, in which 2n+1 magnetic layers and 2n non-magnetic layers are layered in alternation from the intermediate layer (with n=1, 2, 3 . . . ); wherein the element A and the element B respond to the same external magnetic field; and wherein the outputs of element A and element B are added to or subtracted from one another. Here, it is preferable that the magnetization directions of the magnetic layers constituting the pinned magnetic layers are antiparallel, due to antiferromagnetic coupling or magnetostatic coupling.

With this configuration, if the polarity of the element A and the element B is the same (that is, if the magnetization directions of the magnetic layers sandwiching the intermediate layer are parallel, then the resistance is low (or high), and if the magnetization directions are antiparallel, then the resistance is high (or low)), then, with respect to external magnetic fields from the same direction, the directions of the external magnetic fields for which element A has its maximum resistance and for which B has its maximum resistance are different. When used as a device, the peripheral circuit resistance is added to the resistance value of the magneto-resistive element, so that an adequate S/N ratio cannot be attained, but when combining the elements A and B as described above, the base resistance (circuit resistance +element resistance for low resistances) is canceled, thus attaining a high S/N ratio.

The thermal resistance is further improved when at least a portion of the non-magnetic material of the free magnetic layers, or of the non-magnetic material of the pinned magnetic layers is made of at least one compound selected from oxides, nitrides, carbides and borides. This is, because the energy value for these compounds is more stable than the energy value for mutual diffusions with the magnetic layers. However, overall, the non-magnetic layers should have a sufficiently low resistance.

As an example in which a portion of the non-magnetic material is of the above-mentioned compound, the non-magnetic film can be a multilayer film of at least one layer of non-magnetic material including at least one selected from oxides, nitrides, carbides and borides, and at least one non-magnetic metal layer. For example, the thermal resistance improves when using a multilayer film of at least two layers including a non-magnetic metal X (X=Cu, Ag, Au, Ru, Rh, Ir, Re, Os) and an R selected from oxides, nitrides, carbides and borides (R=$SiO_2$, SiC, $Si_3N_4$, $Al_2O_3$, AlN, $Cr_2O_3$, $Cr_2N$, TiO, TiN, TiC, $HfO_2$, HfN, HfC, $Ta_2O_5$, TaN, TaC, BN, $B_4C$. or mixtures of the above).

When using a primer layer that includes at least one element selected from the elements of groups IVa to VIa and VIII (but excluding Fe, Co and Ni) and Cu, then, especially when the pinned layer is a multilayer film including magnetic and non-magnetic layers, strong antiferromagnetic coupling is attained directly after the film formation, without using an antiferromagnetic material such as IrMn, FeMn or the like. Moreover, since no Mn-including antiferromagnetic material is used, the decrease of the MR due to Mn diffusion during the thermal process can be suppressed. The primer layer preferably is composed of the above at least one element.

If the primer layer is in contact with a magnetic layer, and the primer layer and that magnetic layer include at least one crystal structure selected from fcc and hcp structure, or both include a bcc structure, then the antiferromagnetic coupling between the magnetic layers of the pinned layer becomes particularly strong.

If the antiferromagnetic layer is made of Cr and at least one selected from the group consisting of Mn, Tc, Ru, Rh, Re, Os, Ir, Pd, Pt, Ag, Au and Al, then an excellent thermal resistance is attained. This alloy also can include up to 10 at % of an element other than those mentioned above.

A particularly superior thermal resistance can be attained if the antiferromagnetic layer has a composition that can be expressed by $Cr_{100-x}Me_x$ (wherein Me is at least one selected from the group consisting of Re, Ru and Rh, and $0.1 \leq X \leq 20$).

An excellent thermal resistance can be attained in particular when the antiferromagnetic layer has a composition that can be expressed by $Mn_{100-x}Me_x$ (wherein Me is at least one selected from the group consisting of Pd and Pt, and $40 \leq X \leq 55$). This seems to be because a higher amount of noble metals is contained than in IrMn or FeMn. It is also possible that the MnMe composition contains up to 10 at % of another element such as Tc, Ru, Rh, Re, Os, Ir, Pd, Pt, Ag, Au or Al.

The thermal resistance is further improved when the antiferromagnetic layer is formed on a primer layer, and the primer layer and the antiferromagnetic layer include at least one crystal structure selected from fcc, fct, hcp and hct structure, or the primer layer and the antiferromagnetic layer both include a bcc structure. This seems to be because the crystal growth of the antiferromagnetic layer is promoted by the primer layer, and by reducing strain, the diffusion of elements constituting the antiferromagnetic material can be suppressed.

The crystallinity of the antiferromagnetic layer can be improved in particular when the antiferromagnetic layer can be expressed by $Mn_{100-x}Me_x$ (wherein Me is at least one selected from the group consisting of Pd and Pt, and $40 \leq X \leq 55$), and the primer layer is made of NiFe or NiFeCr. In that case, a considerable increase of thermal resistance for thermal processing at temperatures of at least 300° C. can be observed.

This seems to be the effect of decreasing strain by increasing the crystallinity, and suppressing grain growth during the thermal processing.

When the magnetic layer in contact with the antiferromagnetic layer is made of Co, the mutual diffusion of antiferromagnetic material is suppressed even better.

It is preferable that at least a portion of the magnetic layer in contact with at least one selected from the antiferromagnetic layer and the non-magnetic layer is made of a ferromagnetic material including at least one element selected from the group consisting of oxygen, nitrogen and carbon. This is because the deterioration of the MR based on inter-layer diffusion during the thermal process can be suppressed by using a material that is relatively thermally stable. This magnetic layer also can be of (i) a three-layer structure such as (metal ferromagnetic material)/(ferromagnetic material including oxygen, nitrogen or carbon)/(metal ferromagnetic material), (ii) a two-layer structure such as (ferromagnetic material including oxygen, nitrogen or carbon)/(metal ferromagnetic material), or (iii) the entire magnetic layer can be made of a ferromagnetic material including oxygen or nitrogen. As a ferromagnetic material including oxygen, it is preferable to use spinel oxides for which ferrite materials such as $Fe_3O_4$, MnZn ferrite and NiZn ferrite are typical examples, garnet oxides, perovskite oxides, or oxide ferromagnetic materials such as TMO (with T being one selected from Fe, Co and Ni, and M being one selected from Al, Si, Ti, Zr, Hf, V, Nb, Ta, Cr and Mg). As a ferromagnetic material including nitrogen, it is preferable to use a ferromagnetic nitride material such as TN or TMN (with T and M as above). As a ferromagnetic material including carbon, it is preferable to use a ferromagnetic carbide material such as TMC (with T and M as above).

In the above-described elements, it is also possible that at least a portion of the magnetic layer in contact with at least one selected from the antiferromagnetic layer and the non-magnetic layer is made of an amorphous ferromagnetic material, because this suppresses inter-layer diffusion during thermal processing. As an amorphous material, it is preferable to use Co(Fe)NbZr, Co(Fe)TaZr, CoFeB, Co(Fe)Ti, Co(Fe)Zr, Co(Fe)Nb, Co(Fe)MoBZr, Co(Fe)VZr, Co(Fe)MoSiZr, Co(Fe)MoZr, Co(Fe)MoVZr or Co(Fe)MnB.

It is preferable that, when df is a thickness of the pinned magnetic layer and da is a thickness of the ferromagnetic layer, then 2 nm $\leq$ df $\leq$ 50 nm, 5 nm $\leq$ da $\leq$ 100 nm, 0.1 $\leq$ df/da $\leq$ 5.

If the pinned magnetic layer is thinner than 2 nm, then a magnetic deterioration of the pinned layer due to diffusion of antiferromagnetic material may occur. If the pinned magnetic layer is thicker than 50 nm, then domain disturbances may occur due to the increase of the antiferromagnetic field in the film plane caused by miniaturization, or it may not be possible to attain a sufficient pinning magnetic field due to the antiferromagnetic material. If the antiferromagnetic material is thinner than 5 nm, then it may not be possible to attain a sufficient pinning magnetic field. If the antiferromagnetic material is thicker than 100 nm, then inter-layer diffusion may promote magnetic field deterioration of the pinning layer. Especially after thermal processing of at least 350° C., a preferable ratio of df and da with little deterioration of the MR is 0.1 $\leq$ df/da $\leq$ 5. If df/da is smaller than 0.1, then inter-layer diffusion tends to occur, and if it is larger than 5, then the pinning magnetic field due to the antiferromagnetic material tends to become weak, or domain disturbances due to the demagnetizing field tend to become large.

It is also possible that the above-described element is formed on a lower electrode made of a metal multilayer film. The lower electrode through which current flows into the element should have a thickness of several dozen nm to several hundred nm, in order to suppress property variations due to shape effects. Therefore, depending on the thermal processing temperature, grain growth cannot be ignored and contributes to property variations. It is possible to increase the thermal resistance by providing the lower electrode with a multilayer structure of different materials, in order to suppress grain growth.

It is preferable that the metal multilayer film is a multilayer film including a highly conductive metal layer having at least one selected from the group consisting of Ag, Au, Al and Cu as a main component, and a grain-growth suppression layer of a metal (i) having at least one element selected from groups IVa to VIa and VIII (Ti, Zr, Hf, V, Nb, Ta, Cr, Mo, W. Fe, Co, Ni, Ru, Rh, Pd, Os, Ir, Pt) as a main component, or (ii) of a compound selected from the group consisting of conductive oxides, conductive nitrides and conductive carbides. It is preferable that the thickness of the highly conductive metal film is about several nm to 100 nm and that the thickness of the grain-growth suppression layer is about several nm to several nm. In this specification, a main component means a component of 50 wt % or more in the composition.

If the intermediate layer is made of an insulator or a semiconductor including at least one element selected from the group consisting of oxygen, nitrogen, carbon and boron, then a vertical current-type magneto-resistive element utilizing the tunneling magnetic resistance effect can be attained. Examples of preferable materials for the intermediate layer include $SiO_2$, SiC, $Si_3$, $N_4$, $Al_2O_3$, AlN, $Cr_2O_3$, TiC, $HfO_2$, HfN, HfC, $Ta_2O_5$, TaN, TaC, BN, $B_4C$., DLC (Diamond like Carbon) and $C_{60}$, as well as mixtures of these compounds.

If the intermediate layer is made of at least one metal selected from transition metals, or at least one conductive compound selected from compounds of transition metals with oxygen, nitrogen and carbon, then a vertical current-type magneto-resistive element utilizing the CPP-GMR effect having lower coercivity and high thermal resistance can be produced. For this CPP-GMR element, it is preferable that the element area is not larger than 0.01 $\mu m^2$.

When the element area is not larger than 0.01 $\mu m^2$, then the element resistance can be improved, and the problems of deterioration of coercivity due to the miniaturization and deterioration of the thermal resistance both can be solved.

For the intermediate layer, it is preferable to use at least one of the transition metals, in particular V, Nb, Ta, Cr, Mo, W, Cu, Ag, Au, Ru, Rh, Ir, Re or Os. The element resistance can be improved and the thermal resistance can be improved by using a conductive compound of these elements that has been oxidized, nitrided or carbided to an extent at which their conductivity is not lost; or an oxide, nitride, carbide or boride compound XR of an R (with R=$SiO_2$, SiC, $Si_3N_4$, $Al_2O_3$, AlN, $Cr_2O_3$, $Cr_2N$, TiO, TiN, TiC, $HfO_2$, HfN, HfC, $Ta_2O_5$, TaN, TaC, BN, $B_4C$. or composites of the above)

with the above-mentioned transition metals X; or a multilayer film X/R of at least two layers.

If at least a portion of at least one of the magnetic layers sandwiching the intermediate layer comprises a ferromagnetic material including oxygen, nitrogen or carbon, or an amorphous ferromagnetic material, then it is possible to increase the element resistance of the vertical current-type magneto-resistive element due to the CPP-GMR effect. As a ferromagnetic material including oxygen, it is preferable to use spinel oxides for which ferrite materials such as $Fe_3O_4$, MnZn ferrite and NiZn ferrite are typical examples, garnet oxides, perovskite oxides, or oxide ferromagnetic materials such as TMO (with T being one selected from Fe, Co and Ni, and M being one selected from Al, Si, Ti, Zr, Hf. V, Nb, Ta, Cr and Mg). As a ferromagnetic material including nitrogen, it is preferable to use a ferromagnetic nitride material such as TN or TMN (with T and M as above). As a ferromagnetic material including carbon, it is preferable to use a ferromagnetic carbide material such as TMC (with T and M as above). As an amorphous material, it is preferable to use, for example, Co(Fe)NbZr, Co(Fe)TaZr, CoFeB, Co(Fe)Ti, Co(Fe)Zr, Co(Fe)Nb, Co(Fe)MoBZr, Co(Fe)VZr, Co(Fe)MoSiZr, Co(Fe)MoZr, Co(Fe)MoVZr or Co(Fe)MnB.

If the free magnetic layer of the vertical current-type magneto-resistive element serves as a magnetic memory layer, then it can be used as a memory element with high SIN ratio and low power consumption.

If at least a portion of the free magnetic layer of the vertical current-type magneto-resistive element serves as a flux guide, then the element can be used as a magnetic reproduction element with high SIN ratio and low Barkhausen noise.

When "a" is the longest width of the element shape of the free magnetic layer, "b" is its shortest width, and a/b is in the range of 5<a/b<10, then a magneto-resistive element with high memory stability or a magneto-resistive element with high reproduction sensitivity can be produced.

If the vertical current-type magneto-resistive element is subjected first to heat treatment at 300° C. to 450° C., and then to heat treatment in a magnetic field at 200° C. to 400° C., then excellent MR properties can be attained. Here, the former heat treatment may be thermal processing that is e.g. sintering in hydrogen containing atmosphere or formation of a passivation film. Performing heat treatment in a magnetic field after thermal processing near the Neel point or the blocking temperature, the pinned magnetization direction of the antiferromagnetic material in particular is set uniformly.

Especially with elements using an antiferromagnetic layer, an even stronger pinned magnetic field can be attained by heat treatment in a magnetic field at 300° C. to 450° C.

If the vertical current-type magneto-resistive element of the present invention is mounted together with other semiconductor devices, then a heat treatment at 200° C. to 350° C. should be performed in a magnetic field after forming a multilayer film made of at least one antiferromagnetic layer, a pinned magnetic layer, an intermediate layer and a free magnetic layer on a substrate provided with, for example, CMOS semiconductor elements and lead electrodes, and the antiferromagnetic material and free magnetic material etc. are subjected to a uniaxial anisotropy formation step.

It is preferable that this step is performed before the miniaturization of the magnetic multilayer film, when the influence of the demagnetizing film is smallest. In the process of element microprocessing and electrode wiring, oxides of the electrodes etc. are reduced, and with the goal of reducing the wiring resistances, heat treatment is performed in a reducing atmosphere, such as a hydrogen-containing atmosphere, of 300° C. to 450° C. To perform further heat treatment in a magnetic field after performing the heat treatment in the reducing atmosphere is advantageous with regard to the element properties, and considering the oxidation of the electrodes etc., it is advantageous with regard to the manufacturing process to perform the heat treatment in the magnetic field beforehand. In particular, PtMn and PtPdMn are preferable as antiferromagnetic materials.

It is also possible to devise a portable device equipped with a plurality of vertical current-type magneto-resistive elements, wherein data that have been communicated by electromagnetic waves are stored in the free magnetic layers of the vertical current-type magneto-resistive elements. With such a device, it is possible to realize low power consumption due to the low coercivity, in addition to the non-volatility and speed of MRAMs, so that it can be used as a memory necessary for high-speed reading and writing of large capacities, as for video or audio.

The magneto-resistive element can also include a first pinned magnetic layer, a first intermediate layer, a first free magnetic layer, a non-magnetic conductive layer, a second free magnetic layer, a second intermediate layer and a second pinned magnetic layer formed in that order, wherein at least one of the first free magnetic layer and the second free magnetic layer includes one or more magnetic layers and one or more non-magnetic layers layered in alternation.

By electrically connecting, through a non-magnetic conductive layer, in series a first pinned magnetic layer, a first intermediate layer, a first free magnetic layer, a second free magnetic layer, a second intermediate layer and a second pinned magnetic layer, the deterioration of the magnetic resistance at identical bias can be diminished, if the intermediate layers are insulating layers using the tunneling effect. Moreover, if the intermediate layers are made of a conductive material utilizing the CPP-GMR effect, the element resistance can be increased by the serial connection. If the free magnetic layers are in the region sandwiched by the two intermediate layers, variations of the magnetization reversals due to the distribution of the external magnetic field can be suppressed. The demagnetizing field due to miniaturization can be diminished, when at least one of the free magnetic layers has magnetic and non-magnetic layers layered in alternation.

In the magneto-resistive element, it is also preferable that magnetic layers that are adjacent but spaced apart by a non-magnetic conductive layer are magnetized antiparallel to one another. If magnetic layers that are adjacent but spaced apart by a non-magnetic conductive layer are magnetized parallel to one another, then the magnetostatic energy of the neighboring magnetization through the non-magnetic conductive layer is increased, so that non-symmetries with respect to the external magnetic fields occur. Therefore, even when the two free magnetic layers are on the same side of the intermediate layer, the responsiveness of magnetic resistance changes with respect to the external magnetic field deteriorates as a result. By making them antiparallel, the increase of the magnetostatic energy can be minimized, and the element driving stability during miniaturization can be improved.

In the magneto-resistive element, it is preferable that the non-magnetic conductive layer has a thickness of 2.6 nm to 50 nm. If the non-magnetic conductive layer has a thickness of less than 2.6 nm, then antiferromagnetic exchange coupling or ferromagnetic exchange coupling becomes stronger, which is undesirable. If it has a thickness of more than 50 nm, then the influence of the distribution of the external magnetic field cannot be ignored, and the size of the magnetic field felt by the two free magnetic layers may be different. There is no particular limitation with regard to the material of the non-magnetic conductive layer, and it is preferable to use non-magnetic materials that are commonly used for conductive electrode materials, such as Cu, Al, TiN, TiWN, CuAl, CuAlTi, Ag, Au or Pt, whose specific resistance is 11000 Ωcm or less.

It is preferable that the magneto-resistive element includes four pinned magnetic layers, two free magnetic layers, and four intermediate layers, wherein at least one of the free magnetic layers is made of one or more magnetic layers and one or more non-magnetic layers layered in alternation.

A representative example of the above configuration is first antiferromagnetic layer/first pinned magnetic layer/first intermediate layer/first free magnetic layer/second intermediate layer/second pinned magnetic layer/second antiferromagnetic layer/third pinned magnetic layer/third intermediate layer/second free magnetic layer/fourth intermediate layer/fourth pinned magnetic layer/third antiferromagnetic layer. If the pinned magnetic layers are made of a magnetic material with high coercivity, or if they are made of layered ferrimagnetic material, then the antiferromagnetic layers are not always necessary. With this configuration, the total thickness of a TMR element having four intermediate layers or a CPP-GMR element can be minimized, so that it becomes possible to make smaller devices having four intermediate layers. Furthermore, for TMR elements, the bias dependency can be improved considerably, and in CPP-GMR elements, the resistance can be increased. Deteriorating properties due to the demagnetizing field can be suppressed by making the free magnetic layer a multilayer including magnetic and non-magnetic layers. By making the pinned layer a multilayer including magnetic and non-magnetic layers, the magnetic non-symmetry of the free magnetic layers can be improved.

It is also preferable that the magneto-resistive element includes a pinned magnetic layer, an intermediate layer and a free magnetic layer, wherein the free magnetic layer is in contact with a buffer layer, wherein the buffer layer is made of a composition that includes 10 wt % to 50 wt % of a non-magnetic element in a magnetic composition in contact with the buffer layer, and wherein the saturation magnetization of that composition is not more than 0.2 T. If the free magnetic layer is made thinner than 2 nm in order to suppress the demagnetizing field, then the magnetic properties deteriorate because of disturbances of the crystal structure due to making w the layer thin and interface reactions during production. By using, as a buffer layer in contact with the free magnetic layer, a material in which a non-magnetic element has been added to the magnetic material composition constituting the free magnetic layer, if the buffer layer is used as a primer of the free magnetic layer for example, then the crystallinity of the free magnetic layer improves, and if it is used above the free magnetic layer, then it has the effect that the deterioration of the magnetic field due to interface reactions can be suppressed. The free magnetic layer can be a single layer, or it can be a multilayer including magnetic and non-magnetic layers. In the latter case, it is preferable that the buffer layer contacts the magnetic layer.

It is preferable that the saturation magnetization of the buffer layer is not greater than 0.2 T. With regard to maintaining the crystal structure of the buffer layer and suppressing the saturation magnetization, it is also preferable that the non-magnetic element added to the composition of the magnetic layer accounts for 10 wt % to 50 wt %.

It is also preferable that the buffer layer comprises at least one non-magnetic element selected from the group consisting of Cr, Mo and W. By forming an alloy with, for example, Fe, Ni, Co, FeNi, FeCo or CoFeNi, these elements are very effective for making the free magnetic layer thin. Of these materials, an alloy NiFeCr with the magnetic material NiFe is preferable, in particular near the composition $(NiFe)_{61}Cr_{39}$.

It is also preferable that the free magnetic layer is made of at least one non-magnetic layer and magnetic layers sandwiching the non-magnetic layer, and that a total film thickness of the magnetic layers is at least 4 nm. By making the free magnetic layer a multilayer including magnetic and non-magnetic layers, it is possible to suppress an increase in the coercivity that is brought about by making the element smaller. If the free magnetic layer is used as a memory device, there is the advantage that the power consumption drops when memory reversals occur using a current-generating magnetic field. However, on the other hand, with the thermal stability index as expressed by KuV/kBT (wherein Ku is the uniaxial anisotropic energy, V is the volume, and kBT is the Boltzman constant and absolute temperature), when Ku (coercivity=2 Ku/M, wherein M is magnetization) is made small, the thermal stability of the storage becomes poor. However, by increasing the volume V of the magnetic layer included in the multilayered memory (free magnetic layer), the thermal stability can be improved, and it is preferable that the total thickness of the magnetic layers is at least 4 nm, more preferably at least 8 nm.

In the most simple basic configuration of a magneto-resistive element in accordance with the present invention, a current flows through an intermediate layer that is sandwiched by at least two magnetic layers. Most simply, a layering structure of lower electrode/(primer layer or antiferromagnetic layer)/pinned magnetic layer/intermediate layer/free magnetic layer is formed by gas-phase film formation on an insulating or conducting substrate. Alternatively, a layering structure of lower electrode/(primer layer)/free magnetic layer/intermediate layer/pinned magnetic layer/(antiferromagnetic layer) is formed. This multilayer film is processed into a mesa shape, and after the side walls are covered with an inter-layer insulator, an upper electrode is formed. With current flowing between the lower electrode and the upper electrode, a voltage change is read corresponding to the change of the magnetization displacement angle depending on the magnetization between the magnetic layers.

For the gas-phase film formation for forming the magnetic layers, antiferromagnetic layer, inter-layer insulating layer, electrodes, intermediate layer, etc., it is possible to use any of the PVD methods ordinarily used for thin film formation, such as ion beam deposition (IBD), cluster ion beam deposition, or sputtering methods, such as RF, DC, ECR, helicon, ICP sputtering or sputtering with opposing targets, MBE, or ion plating, or any other suitable method. In particular for making the interlayer insulating film and the intermediate layer, it is also possible to use CVD. Furthermore, if the layers are made of an oxide, nitride, carbide or boride, they also can be produced by chemical beam epitaxy, gas source MBE, reactive vapor deposition, or reactive sputtering, or it is possible to form them after the gas-phase film formation by reacting atoms, molecules, ions (plasma), radicals or the like, controlling partial pressures, reaction temperature and time as suitable. Plasma or radicals can be generated by ECR discharge, glow discharge, RF discharge, helicon discharge or ICP discharge.

The mesa processing of the magneto-resistive element of the present invention can be performed by any process that is ordinarily used for microprocessing, for example physical or chemical etching, such as ion milling, RIE, EB, or FIB etching, or photolithography techniques using suitable line widths. In order to make the lower electrode flat, it is also effective to use CMP or cluster ion beam etching to increase the MR.

BRIEF DESCRIPTION OF THE DRAWINGS

FIG. 1 is a cross-sectional view of a vertical current-type magneto-resistive element in accordance with the present invention.

FIGS. 3A and 3B show the MR curve of Sample 2 of Embodiment 1.

FIG. 7 is a cross-sectional view of a vertical current-type magneto-resistive element in accordance with the present invention.

FIG. 8 is a cross-sectional view of a vertical current-type magneto-resistive element in accordance with the present invention.

FIGS. 17A and 17B illustrate the configuration of a non-destructive read-out memory of the present invention.

DESCRIPTION OF THE PREFERRED EMBODIMENTS

WORKING EXAMPLE 1

Figure 2B:
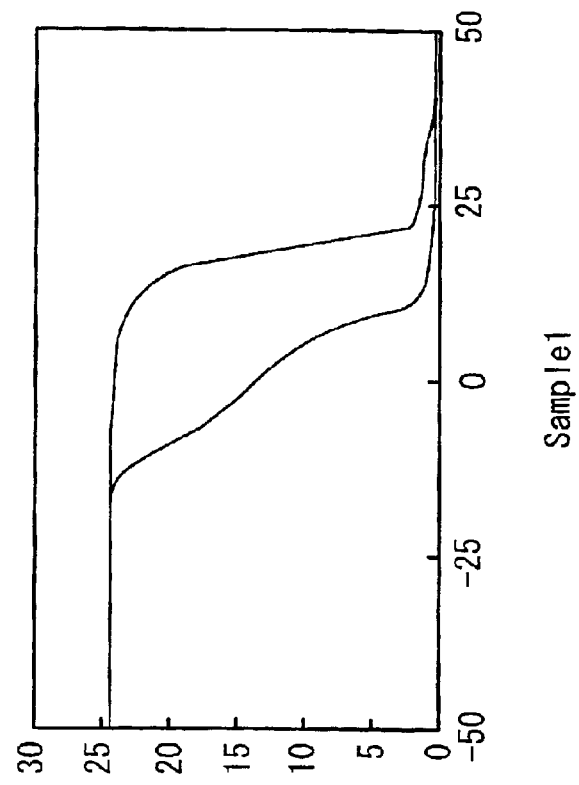
FIGS. 2A and 2B show the MR curve of Sample 1 of Embodiment 1.

The following MR elements were produced by magnetron sputtering on a thermally oxidized Si substrate. The general configuration of these elements is shown in FIG. 1.

Sample 1
Ta(3)/Cu(500)/Ta(3)/PtMn(30)/CoFe(3)/Ru(0.7)/CoFe(3)/Al$_2$O$_3$(1)/NiFe(8)/Ta(3)

Sample 2
Ta(3)/Cu(500)/Ta(3)/PtMn(30)/CoFe(3)/Ru(0.7)/CoFe(3)/Al$_2$O$_3$(1) /NiFe (4)/Ta(3)

Sample 3
Ta(3)/Cu(500)/Ta(3)/PtMn(30)/CoFe(3)/Ru(0.7)/CoFe(3)/Al$_2$O$_3$(1) /NiFe(5)/Ru(0.7)/NiFe(3)/Ta(3)

(The numbers in parentheses indicate the film thicknesses in nm. The film configuration is noted starting at the substrate side. This is also true in the following.)

Here, Ta(3)/Cu(500)/Ta(3) serves as a lower electrode and primer layer 103 on a substrate 104, PtMn is an antiferromagnetic layer (not shown), CoFe(3)/Ru(0.7)/CoFe(3) is a pinned magnetic layer 107, Al$_2$O$_3$ is the intermediate layer 106, and the rest serves as the free magnetic layer 105 (and the last layer Ta(3) as the protective layer).

Figure 2A:
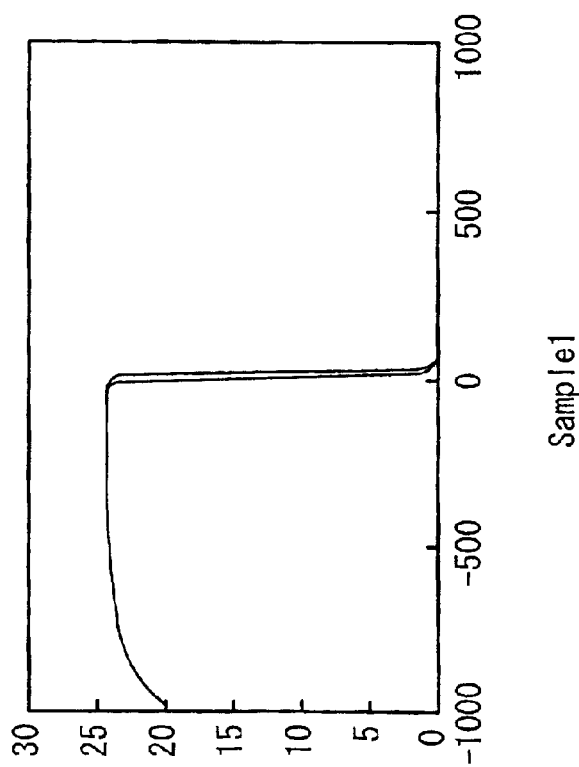
Figure 4B:
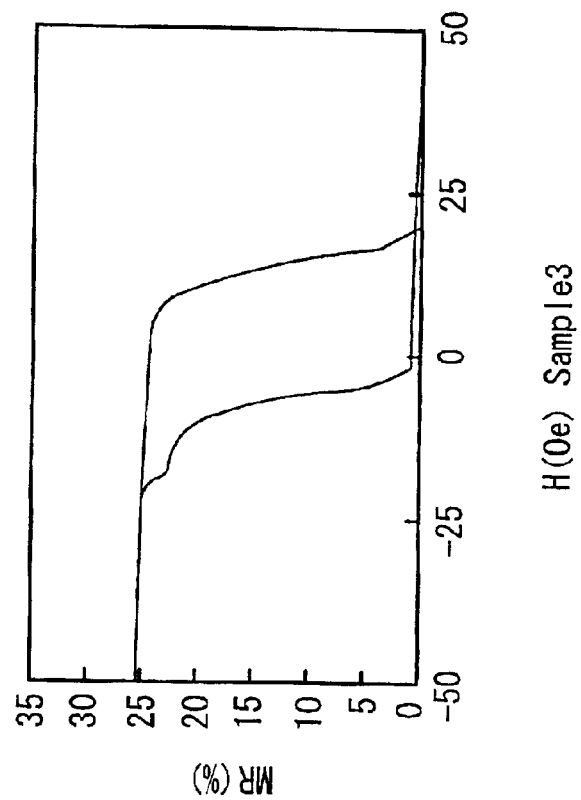
FIGS. 4A and 4B show the MR curve of Sample 3 of Embodiment 1.
Figure 4A:
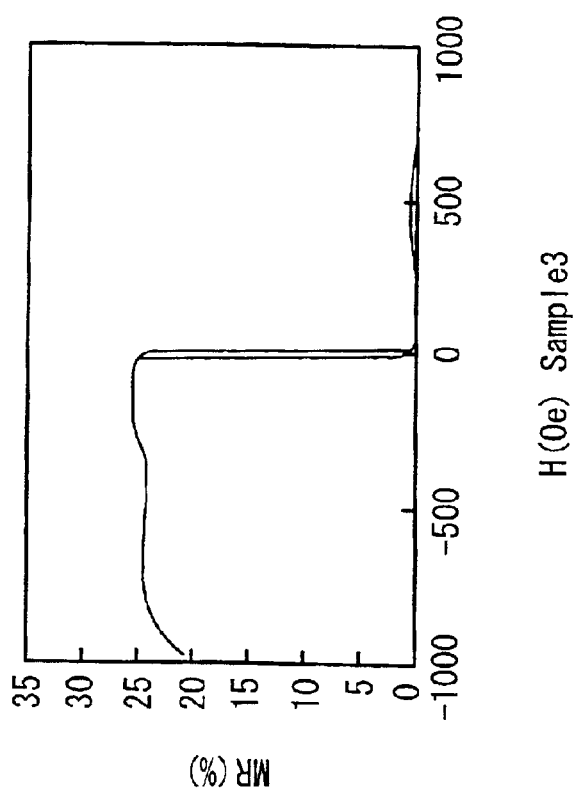
Figure 5:
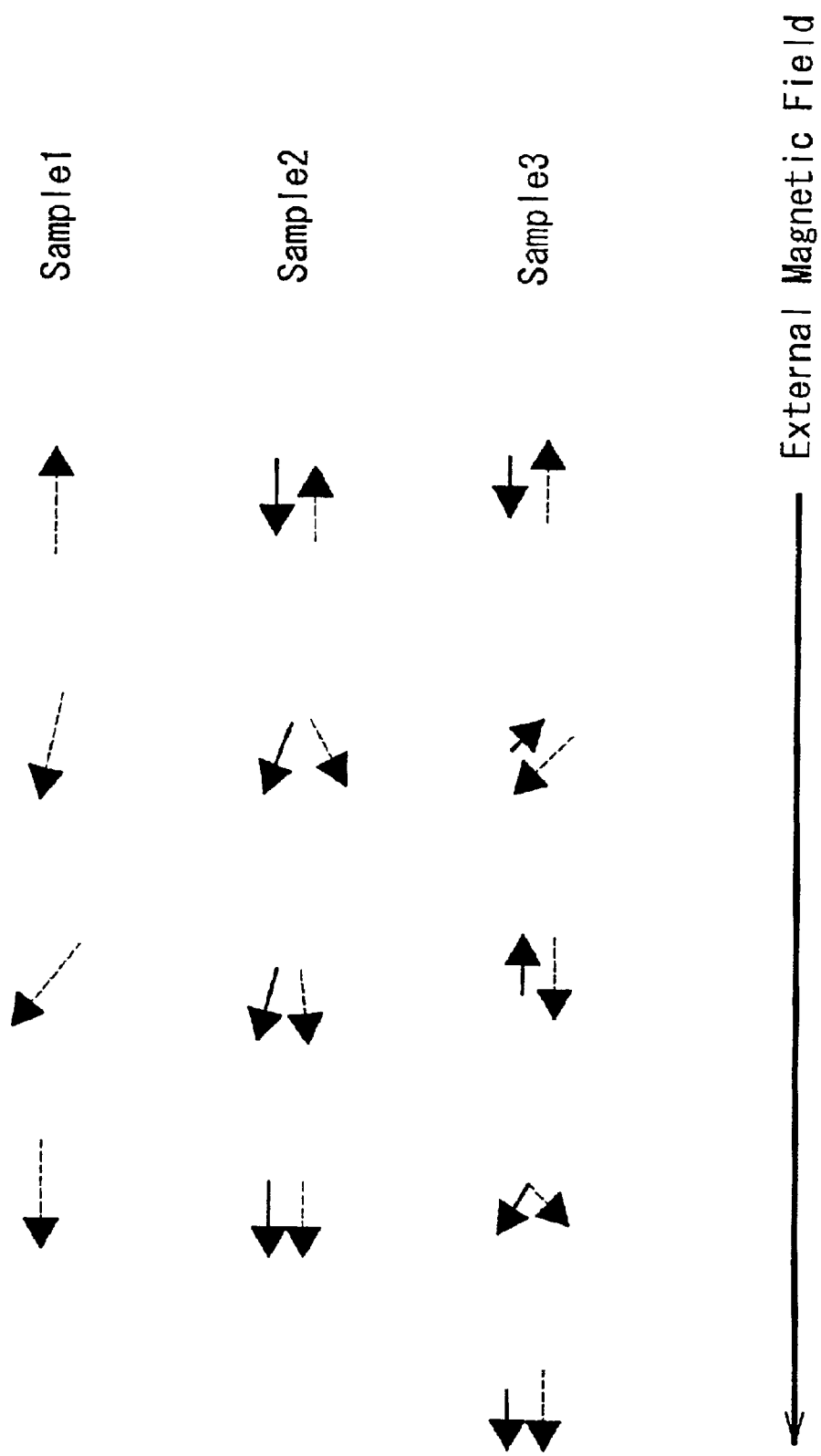
FIG. 5 shows the magnetization response in the free magnetic layer with respect to an external magnetic field.

The parameters for the heat processing were a temperature of 240° C., an electric field of 5 kOe, and a time of 1.5 h. The multilayer films were microprocessed into mesa shape, by photolithography, such that the element area was a square of 2 to 10 μm per side, and after forming the interlayer insulator film, the upper electrode 101 was formed, yielding the vertical current-type magneto-resistive element. As shown in FIG. 1, the area of the free magnetic layer through which the current flows is slightly smaller than that of the element area of the intermediate layer through which the current flows. The MR of the processed element at room temperature was measured by DC four-terminal measurement. FIGS. 2 to 4 show the MR curves (for 5×5 μm$^2$) of the samples 1 to 3. The RA, which means normalized junction resistance, was in all cases ca. 60 to 70 Ωm$^2$. Sample 1 and Sample 2 showed typical spin valve type MR curves, and the MR was 24 and 30%, respectively. On the other hand, in Sample 3, the MR was about 25%, and a characteristic inflection of the MR value could be observed near 400 Oe. It seems that in Sample 3, as the external magnetic field increases, a spin-flop occurs among the magnetic NiFe layers, and this change can be observed as a change in the magnetic resistance. That is to say, it seems that, as in the magnetization response to an external magnetic field in the free magnetic layer shown schematically in FIG. 5, in the Samples 1 and 2, the direction of the magnetization of the free magnetic layer becomes closer to the direction of the external magnetic field as the external magnetic field becomes stronger. On the other hand, in Sample 3, a magnetic layer with large film thickness (the magnetic layer on the side of the intermediate layer) points in the same direction as the external magnetic field, so that the MR becomes maximal (in this working example, when the upper and lower magnetization directions sandwiching the intermediate layer are antiparallel), but it seems that at ca. 400 Oe, the upper and lower magnetic layers sandwiching the non-magnetic layer of the free magnetic layer perform a spin flop (see "a" in FIG. 5), so that the antiparallel state of the magnetizations sandwiching the intermediate layer is broken, and the MR decreases. After that, the magnetic layers forming the free magnetic layers tend to align in the same direction as the external magnetic field, so that the MR begins to increase again.

Then, from the form of the MR curves of the samples over ±50 Oe, it can be seen that the coercivity in Sample 1 is large, and its angular shape is poor. In Sample 2, the coercivity is smallest, and its shape is relatively good. In Sample 3, the angular shape was the best, and a relatively large coercivity was observed.

Figure 6:
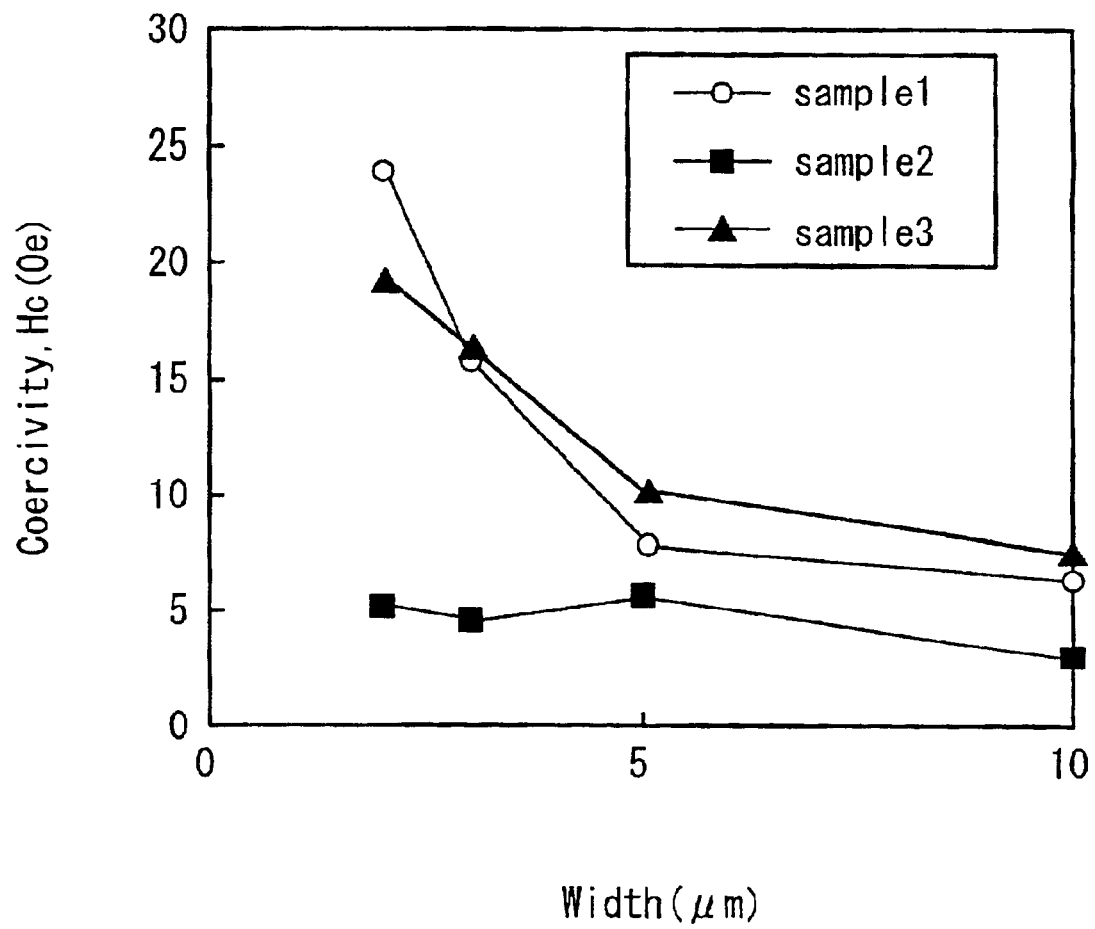
FIG. 6 illustrates the relation between element width and coercivity.

FIG. 6 shows the change of the coercivity over the element width for the various samples. As the element size in Sample 1 becomes smaller, an increase in coercivity can be observed, which seems to be caused by the demagnetizing field. In Sample 3, the increase of the coercivity with respect to the decrease of the element width is more gentle than in Sample 1, and at element sizes below $2\times2$ $\mu m^2$, it tends to be lower than in Sample 1. It seems that due to employing a multilayer structure with non-magnetic layers provided with film thickness differences on magnetic layers, the film thickness of the magnetic layer that is influenced by the demagnetizing field in practice is about 2 nm. On the other hand, in Sample 2, almost no increase of the coercivity with respect to the element width can be observed. This seems to be the result of suppressing the demagnetizing field by magnetostatic coupling of the magnetic fields leaking from the two NiFe layers of the same film thickness sandwiching the non-magnetic Ta layer.

For Sample 2, the change of the coercivity when changing the thickness of the non-magnetic Ta layer sandwiched by NiFe was determined. The element size was $2\times2$ $\mu m^2$. It was found that when the Ta thickness is in the range of 2.6 to 10 nm, a lower coercivity than in Sample 1 was attained. When Ti, Zr, Hf, V, Nb, Ta, Cr, Mo, W, Al, $SiO_2$, SiC, $Si_3N_4$, $Al_2O_3$, AlN, $Cr_2O_3$, $Cr_2N$, TiO, TiN, TiC $HfO_2$, HfN, HfC, $Ta_2O_5$, TaN, TaC, BN and $B_4C$ were examined as non-magnetic layers other than Ta, it was found that a similar effect as with Ta can be attained with non-magnetic metals, oxides, nitrides and with carbides.

Then, the thickness of the two NiFe layers sandwiching the Ta was examined for Sample 2 at an element size of $2\times2$ $\mu m^2$. First, when the thickness of the two layers was held equal and that thickness was changed, a reduction of the coercivity could be ascertained for 1 nm to 100 nm. When samples were produced with different thicknesses of the two NiFe layers sandwiching the Ta in this range of film thickness, it was observed that the coercivity tended to increase compared to the samples with the same film thickness. The relation between the film thickness difference in the magnetic layers was further examined, with the following free magnetic layers Sample a: NiFe(X)/Ta(3)/NiFe(Y)/Ta(3)/NiFe(Z)
Sample b: NiFe(X)/Ta(3)/CoFe(Y)/Ta(3)/NiFe(Z)
Sample c: NiFe(X)/Ta(3)/NiFe(Y)/Ta(3)/CoFe(Z)

wherein X, Y, and Z were varied over several values. As the result, in Sample a, under the condition that the thickness X+Y+Z was constant, a lower coercivity was attained when X+Z=Y, and substantially the lowest value was attained when further X=Z. In Sample b, under the condition that the thickness X+Y+Z was constant, when the saturation magnetization of the NiFe is Ms1 and the saturation magnetization of the CoFe is Ms2, a low coercivity was attained under the condition that Ms1×(X+Z)=Ms2×Y, and the lowest value was attained when X=Z. Furthermore, in Sample c, a low coercivity was attained when Ms1×X+Ms2×Z=Ms1×Y.

Thus, it can be seen that in the magnetic layers constituting the free magnetic layer, taking the magnetic layers m arranged at the position m (m=1, 2, . . . ) from the side of the intermediate layer as the magnetic layers m, and taking the product Mm×dm of the average saturation magnetization Mm of the magnetic layers m and the average layer thickness dm, a magneto-resistive element with low coercivity can be attained when the sum of the products Mm×dm for odd m is substantially equal to the sum of the products Mm×dm for even m.

For Sample 3, the change of the coercivity when taking V, Nb, Ta, Cr, Mo, W, Re, Ru, Os, Rh, Ir, Cu, Ag or Au as the non-magnetic layer sandwiched by NiFe was examined. The size of the element was set to $2\times2$ $\mu m^2$. As in Sample 3, the thickness of the non-magnetic layer at which the value of the coercivity becomes smaller than in Sample 1 has its minimum in the region lower than ca. 1 nm, such as 0.9 nm for V, 0.95 nm for Nb, 0.7 nm for Ta, 0.7 nm for Cr, 0.52 nm for Mo, 0.55 nm for W. 0.42 nm for Re, 0.8 nm for Ru, 0.4 nm for Ir, and 0.8 nm for Cu. It was confirmed that as the thickness of these non-magnetic layers increases, the coercivity increases first to a similar value as in Sample 1, and then decreases again at 1.5 to 2.6 nm, for example at 1.8 nm for V, 2.5 nm for Cr, 1.5 nm for Re, and 2.1 nm for Cu. It should be noted that the layer thicknesses of the non-magnetic layer have been estimated based on the film forming speed, so that there may be a certain discrepancy in the actual film thicknesses. Moreover, even though a decrease of the coercivity can be observed above 2.6 nm, as in Sample 2, spin flops could not be observed. The non-magnetic material of the present embodiment can be a single element, an alloy of several elements, or a compound obtained by reacting a portion of these elements with nitrogen, oxygen, or the like.

Next, in a vertical current-type magneto-resistive element with basically the same configuration as Sample 3 and Sample 1 and an element size of $2\times2$ $\mu m^2$, the dependency of the magnetic layer on the film thickness was determined by changing X in the free magnetic layers with the following configuration:

Sample d: NiFe(2×X)
Sample e: NiFe(5/4×X)/Ru(0.7)/NiFe(3/4×X)
(The numbers in parentheses indicate the NiFe thicknesses in nm.)

As a result, it was confirmed that the coercivity in the configuration of Sample b decreased in the range of 0.5 nm to 100 nm. Above 100 nm, processing the element was difficult, so that no measurement was performed for this range, but it seems that the same effects can be expected.

When the thickness of the two NiFe layers sandwiching the Ru layer was the same in this film thickness range, the MR decreased compared to when the film thicknesses were different.

The relation between the film thickness difference of the magnetic layers was further examined, with the following free magnetic layers Sample f: NiFe(X)/Ru(0.7)/NiFe(Y)/Ru(0.7)/NiFe(Z)
Sample g: NiFe(X)/Ru(0.7)/CoFe(Y)/Ru(0.7)/NiFe(Z)
Sample h: NiFe(X)/Ru(0.7)/NiFe(Y)/Ru(0.7)/CoFe(Z)

wherein X, Y, and Z were varied over several values. As a result, it was found that in Sample f, under the condition that the thickness X+Y+Z is constant, the MR became smaller when X+Z=Y, and substantially the minimum is reached when X=Z. In Sample g, under the condition that the thickness X+Y+Z is constant, when Ms1 is the saturation magnetization of NiFe and Ms2 is the saturation magnetization of CoFe, the MR became smaller under the condition that Ms1×(X+Z)=Ms2×Y, and the minimum value was attained when X=Z. Furthermore, in Sample h, the minimum value of the MR was attained when Ms1×X+Ms2×Z=Ms1×Y.

Thus, it can be seen that in the magnetic layers constituting the free magnetic layer, taking the magnetic layers arranged at the position m (m=1, 2, . . . ) from the side of the intermediate layer as the magnetic layers m, and taking the product Mm×dm of the average saturation magnetization Mm of the magnetic layers m and the average layer thickness dm, a magneto-resistive element with high MR can be attained with a vertical current-type magneto-resistive element, in which the sum of the products Mm×dm for odd m is substantially equal to the sum of the products Mm×dm for even m.

NiFe or CoFe were used for the magnetic layers of the free magnetic layers above, and for the magnetic layers near the intermediate layer of the pinned magnetic layers, but the same effect can also be attained when using the magnetic materials mentioned above.

In the above-described working example, $Al_2O_3$ was used for the intermediate layer, but the same effects can also be attained when using the non-magnetic materials mentioned above.

WORKING EXAMPLE 2

The following elements were produced by magnetron sputtering on a thermally oxidized Si substrate.

Sample 1
Ta(3)/Cu(500)/Ta(3)/CoFe(32)/$Al_2O_3$(X)/CoFe(3)/Ru (0.7)/CoFe(3)/PtMn (20)/Ta(3)

Sample 2
Ta(3)/Cu(500)/Ta(3)/(CoFe(4)/Ta(3)/CoFe(4))*4/$Al_2O_3$ (X)/Fe(3)/Ru(0.7) /CoFe(3)/PtMn(20)/Ta(3)

Sample 3
Ta(3)/Cu(500)/Ta(3)/(CoFe(3)/Ru(0.7)/CoFe(5))*4/ $Al_2O_3$(X)/CoFe(3)/Ru (0.7)/CoFe (3)/PtMn(20)/Ta(3)

Here, (CoFe(4)/Ta(3)/CoFe(4))*4 means that the layers (CoFe(4)/Ta(3)/CoFe(4)) are produced four times in repetition.

The multilayer films were microprocessed using photolithography into mesa shapes with an element area of 2×5, 10×25, 20×50, and 40×100 $\mu m^2$, and after forming an inter-layer insulator film, an upper electrode was formed, yielding vertical current-type magneto-resistive elements with the cross section shown in FIG. 7 and FIG. 8. In these elements, the free magnetic layer 105 is arranged on the substrate side, different from FIG. 1. The film thickness X of the $Al_2O_3$ serving as the intermediate layer of the Samples 1 to 3 was adjusted so that for the respective element areas a value of ca. 100Ω was measured. The parameters for the microprocessing were a temperature of 300° C., a magnetic field of 5 kOe, and a time of 1.5 h.

Then, the coercivity and the MR of the Samples 1 to 3 that have been microprocessed to the shape of FIG. 7 were compared. The results are shown in Table 1. In the samples, in which the element area was in the range of 2×5 to 20×50 $\mu m^2$, the Samples 2 and 3 had a lower coercivity and a higher MR than Sample 1. On the other hand, it can be seen that at an element area of 40×100 $\mu m^2$, even though the MR of Sample 2 and 3 is high, the coercivity of Sample 3 is higher than that of Sample 2.

TABLE 1

| Element shape | Sample 1 MR(%)/ coercivity(Oe) | Sample 2 MR(%)/ coercivity(Oe) | Sample 3 MR(%)/ coercivity(Oe) |
| --- | --- | --- | --- |
| 2 × 5 | 39/49 | 46/40 | 46/3 |
| 10 × 25 | 40/18 | 46/16 | 47/3 |
| 20 × 50 | 41/15 | 48/15 | 49/2 |
| 40 × 100 | 37/9 | 45/10 | 45/3 |

When the same samples were microprocessed into the shape shown in FIG. 8 and the area of the free magnetic layer was larger than the element area, the MR was increased by 1 to 2% each, and the angular shape of the hysteresis was improved.

WORKING EXAMPLE 3

The following sample was produced by magnetron sputtering on a thermally oxidized Si substrate.

Ta(3)/Cu(500)/Ta(3)/PtMn(30)/CoFe(3)/Ru(0.7)/CoFe (3)/$Al_2O_3$(1.5)/CoFe (d1)/Ru(0.7)/NiFe(d2)/Ta(3)

Multilayer films with this configuration were microprocessed using photolithography into mesa shapes with an element area of 2×2 $\mu m$, and after forming an inter-layer insulator film, an upper electrode was formed, yielding a vertical current-type magneto-resistive element with the cross section shown in FIG. 1. The parameters for the thermal processing were a temperature of 260° C., a magnetic field of 5 kOe, and a time of 1.5 h. Then, the MR when applying magnetic fields of ±200 Oe to the resulting element was measured, and the change of the MR in a relatively small external magnetic field was examined. The results are shown in Table 2. With the saturation magnetization M1 of CoFe being 2.15 T and the saturation magnetization M2 of NiFe being 1 T, CoFe has the higher spin polarizability in this composition. Furthermore, "Nm" listed in Table 2 is the demagnetizing factor determined in the film plane in the direction of the applied magnetic field, determined by calculating the effective film thickness $d22=(M2\times d2-M1\times d1)/M2$ responding to the external magnetic field. S is the absolute value of $M1\times d1-M2\times d2$.

TABLE 2

| d1 (nm) | d2 (nm) | (M1 × d1 + M2 × d2)/S | (M2 × d2 − M1 × d1)/ M2 | Nm | MR (%) |
| --- | --- | --- | --- | --- | --- |
| 2 | 4.5 | 44 | 0.2 | 0.00008 | 40 |
| 2 | 4.8 | 18.2 | 0.5 | 0.0002 | 46 |
| 2 | 5 | 13.28571429 | 0.7 | 0.003 | 47 |
| 2 | 10 | 2.50877193 | 5.7 | 0.004 | 49 |
| 2 | 20 | 1.547770701 | 15.7 | 0.008 | 43 |
| 2 | 30 | 1.33463035 | 25.7 | 0.012 | 41 |
| 2 | 50 | 1.188183807 | 45.7 | 0.019 | 40 |
| 2 | 100 | 1.089864159 | 95.7 | 0.036 | 30 |

From Table 2, it can be seen that a high MR can be attained when (M1×d1+M2×d2)/S is larger than 1.1 and smaller than 20, and Nm is smaller than 0.02. It seems that when Nm is large, the magnetic domains are disturbed and MR decreases, and when (M1×d1+M2×d2)/S is large, the influence of the antiferromagnetic coupling is strong, so that the coercivity increases, and the magnetization rotation becomes difficult.

Furthermore, in this working example, $Ni_{81}Fe_{19}$ was used as the soft magnetic material, and FeCo was used as a high spin polarization material, but a similar effect also can be attained when using the materials mentioned above.

WORKING EXAMPLE 4

Figure 9:
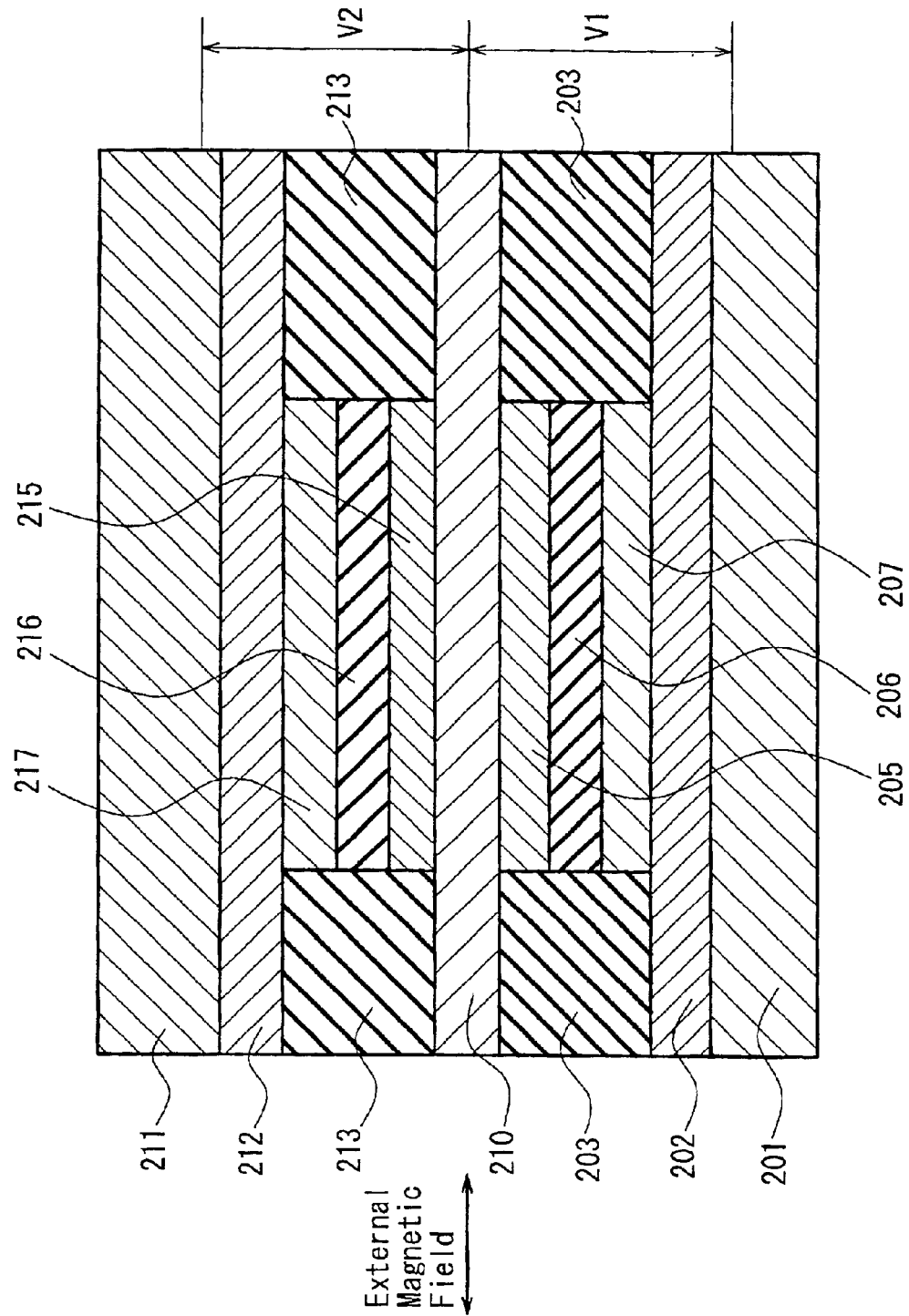
FIG. 9 is a cross-sectional view of a magnetic sensor in accordance with the present invention, using a flux guide.

A flux guide-type sensor as shown in FIG. 9 was produced. Ta serving as both a primer layer and a magnetic separation layer 202, PtMn(20)/CoFe(3)/Ru(0.7)/CoFe(3) serving as a pinned magnetic layer 207, $Al_2O_3$ serving as an intermediate layer 206, CoFe(1)/NiFe(4) serving as a first magnetic layer 205 and Ta(2) serving as a protective layer were formed on a lower shield 201 made of a NiFe plating, microprocessed into mesa shape, and after forming an inter-layer insulator film 203, the Ta was eliminated by ECR etching. Subsequently, after forming a flux guide 210 made of NiFe(10) serving as a second magnetic layer, Ru(0.7)/ CoFe(2) serving as non-magnetic layer/third magnetic layer 215, $Al_2O_3$ serving as an intermediate layer 216, CoFe(3)/ Ru(0.7)/CoFe(3)/(PtMn(20) serving as a pinned magnetic layer 217, and a protective film were formed. Then, after mesa-processing while leaving the flux guide, an inter-layer insulating film 213 was formed, providing a magnetic separation layer 212 and an upper shield 211.

The configuration of the multilayer film was thus as follows:

lower shield 201/magnetic separation layer 202/PtMn (20)/CoFe(3)/Ru (0.7)/CoFe(3)/Al$_2$O$_3$(1.7)/CoFe(1)/ NiFe(4)/NiFe(10)/Ru(0.7)/CoFe (2)/Al$_2$O$_3$(1.7)/CoFe (3)/Ru(0.7)/CoFe(3)/PtMn(20)/magnetic separation layer 212/upper shield 211

Figure 10:
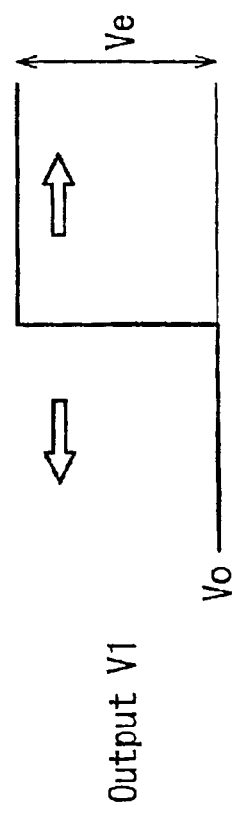
FIG. 10 illustrates the operating principle of the magnetic sensor in accordance with the present invention, using a flux guide.
Figure 10:
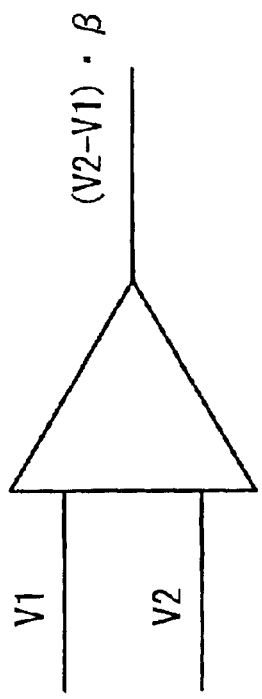
Figure 10:
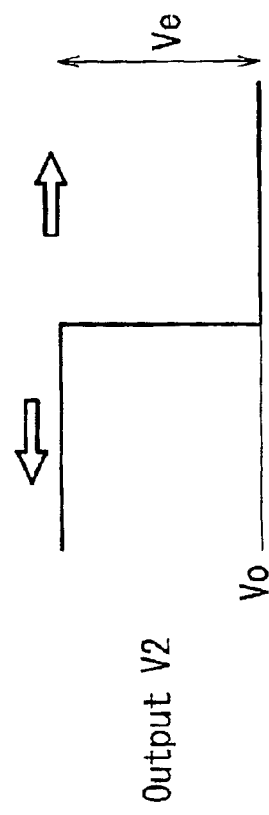
Figure 10:
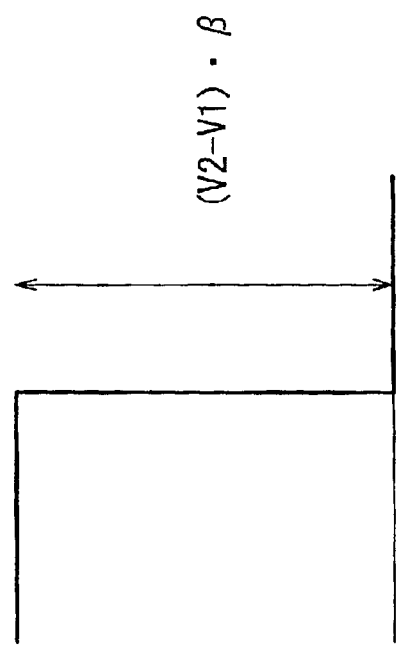

Then, by thermally processing this sensor at 260° C. in a magnetic field, the magnetization of the pinned magnetic layer 207 and the pinned magnetic layer 217 were fixed to the same direction. The magnetic layer 205 and the magnetic layer 210 are ferromagnetically coupled, whereas the magnetic layer 210 and the magnetic layer 215 are antiferromagnetically coupled. Consequently, the magnetization direction of the magnetic layers sandwiching the non-magnetic layer shows different polarities with respect to an external magnetic field introduced through the flux guide. A current flows from the upper electrode (upper shield) to the lower electrode (lower shield), and when the potential between the lower electrode (lower shield) and the flux guide is V1, and the potential between the flux guide and the upper electrode (upper shield) is V2, then the a sensor output with a high S/N ratio was attained by taking the difference of the potentials, as shown in FIG. 10. Here, β means amplification factor.

In this working example, it was also possible to attain a high S/N with an MRAM in which the free magnetic layer served as the memory.

WORKING EXAMPLE 5

The following elements were produced by magnetron sputtering on a thermally oxidized Si substrate.

Sample 1

Ta(3)/Cu(500)/Ta(3)/(CoFe(3)/Ru(0.7)/CoFe(3))/Al$_2$O$_3$ (X)/CoFe(1)/NiFe (4)/Ta(3)/NiFe(6)/Ta(3)

Sample 2

Ta(3)/Cu(500)/Ta(3)/(CoFe(3)/Ru(0.7)/CoFe(3))*10/ Al$_2$O$_3$(X)/CoFe(1)/N iFe(4)/Ta(3)/NiFe(6)/Ta(3)

Sample 3

Ta(3)/Cu(500)/Ta(3)/(CoFe(2)/Ru(0.7)/CoFe(3))*10/ Al$_2$O$_3$(X)/CoFe(1)/N iFe (4)/Ta(3)/NiFe (6)/Ta(3)

Here, (CoFe(Y)/Ru(0.7)/CoFe(Y))*10 means that the layers (CoFe(Y)/Ru(0.7)/CoFe(Y)) are produced ten times in repetition. Furthermore, CoFe with a saturation magnetization of 2 T and NiFe with a saturation magnetization of 1 T was used.

These multilayer films were microprocessed using photolithography into mesa shapes with an element area of 2×5, 10×25, 20×50, and 40×100 μm$^2$, and after forming an inter-layer insulator film, an upper electrode was formed, yielding vertical current-type magneto-resistive elements with the cross section shown in FIG. 1. The film thickness X of the Al$_2$O$_3$ serving as the intermediate layer of the Samples 1 to 3 was adjusted so that in the element areas a value of ca. 100 Ω was measured. After the microprocessing, a thermal process at a temperature of 330° C. and a magnetic field of 5 kOe was performed for 1.5 hours.

Table 3 shows the respective results of the MR measured at ±500 Oe.

TABLE 3

| Element shape (μm) | Sample 1 MR(%) | Sample 2 MR(%) | Sample 3 MR(%) |
| --- | --- | --- | --- |
| 2 × 5 | 25 | 30 | 18 |
| 10 × 25 | 27 | 32 | 18 |
| 20 × 50 | 26 | 31 | 22 |
| 40 × 100 | 17 | 22 | 10 |

Samples 1 and 2 exhibited an MR typical for spin valves, even without an antiferromagnetic material, whereas Sample 3 exhibited MR properties of the coercivity difference type. In the samples with an element area of 40×100 μm, the decrease of MR was large for all Samples 1 to 3. It seems that as the element area increases and exceeds 1000 μm$^2$, multiple orientations of the magnetic domains in the pinned magnetic layer become apparent. Also, for all element shapes, Sample 1 and Sample 2 showed a higher MR than Sample 3. It seems that the decrease of the MR in Sample 3 is due to the generation of a magnetic field leaking from the (CoFe(2)/Ru(0.7)/CoFe(3))*10 layers serving as the pinned magnetic layer, and the generation of disturbances in the domains of the CoFe(1)/NiFe(4)/Ta(3)/NiFe layer serving as the free magnetic layer. Furthermore, it seems that the MR of Sample 2 is higher than that of Sample 1, because the number of non-magnetic and magnetic layers is larger, so that they function as stable pinned magnetic layers.

Thus, it can be seen that in the magnetic layers constituting the pinned magnetic layer, taking the magnetic layers arranged at the position m (m=1, 2, . . . ) from the side of the intermediate layer as the magnetic layers m, and taking the product Mm×dm of the average saturation magnetization Mm of the magnetic layers m and the average layer thickness dm, a high MR can be attained when the sum of the products Mm×dm for odd m is substantially equal to the sum of the products Mm×dm for even m.

Then, the change of the MR when taking V, Nb, Ta, Cr, Mo, W, Re, Ru, Os, Rh, Ir, Cu, Ag or Au as the non-magnetic layer sandwiched by CoFe was examined for Sample 2. The thermal process temperature was set to 200 to 450° C., and the size of the element was set to 2×2 μm$^2$. As in Sample 2, the thickness of the non-magnetic layer attaining a high MR was in the range of 0.3 nm to 2.6 nm. Furthermore, as the thermal process temperature increased, the MR decreased considerably, especially in samples with a film thickness of 0.6 nm or less. It could be confirmed that the same effect also occurs when an alloy of the above metal elements, or an alloy or compound containing at least 50 wt % of these metal elements is used for the non-magnetic material.

Furthermore, a high MR could be realized when the thickness of the magnetic layer was 0.3 nm to 10 nm.

WORKING EXAMPLE 6

The following elements were produced by magnetron sputtering on a thermally oxidized Si substrate.

Sample 1

Ta(3)/Cu(500)/Ta(3)/CoFe(3)/Ru(0.7)/CoFe(3)/Al$_2$O$_3$ (X)/CoFe(1)/NiFe(4)/Ta(3)

Sample 2

Ta(3)/Cu(500)/Ta(3)/CoFe(3)/Ru(0.7)/Al$_2$O$_3$(0.25)/CoFe (3)/Al$_2$O$_3$(X)/CoFe(1)/NiFe(4)/Ta(3)

Sample 3

Ta(3)/Cu(500)/Ta(3)/CoFe(3)/Ru(0.35)/Al$_2$O$_3$(0.25)/Ru (0.35)/CoFe(3)/Al$_2$O$_3$(X)/CoFe(1)/NiFe(4)/Ta(3)

Sample 4

Ta(3)/Cu(500)/Ta(3)/CoFe(3)/RuAlO(0.8)/Ru(0.35)/ CoFe(3)/Al$_2$O$_3$(X)/CoFe(1)/NiFe(4)/Ta(3)

Here, CoFe with a saturation magnetization of 2.2 T and NiFe with a saturation magnetization of 1 T was used.

These multilayer films were microprocessed using photolithography into mesa shapes with an element area of 2×2 $\mu m^2$, and after forming an inter-layer insulator film, an upper electrode was formed, yielding vertical current-type magneto-resistive elements with the cross section shown in FIG. 1. The film thickness X of the $Al_2O_3$ serving as the intermediate layer of the Samples 1 to 4 was adjusted so that the RA in the element areas was about 100 $\Omega\mu m^2$.

After the microprocessing, thermal processes at a temperature of 300° C. and 400° C., and a magnetic field of 5 kOe were performed for 1.5 hours.

Table 3 shows the respective results of the MR measured at ±500 Oe.

TABLE 4

| Temperature °C. | Sample 1 MR(%) | Sample 2 MR(%) | Sample 3 MR(%) | Sample 4 MR(%) |
|---|---|---|---|---|
| 300 | 48 | 43 | 35 | 30 |
| 400 | 2 | 15 | 13 | 11 |

As shown in Table 4, although Sample 1, which used Ru as the non-magnetic layer of the pinned magnetic layer, exhibited the highest MR for thermal processing 300° C., its MR after thermal processing at 400° C. was the lowest. It seems that this is, because compared to the other samples, the deterioration of the pinning magnetic field is largest, so that the layering structure of the CoFe magnetic layer and the Ru layer was disturbed by the thermal process, or they diffused into one another. In the other samples, the pinning magnetic field was strong also after the thermal processing at 400° C. It also seems possible that inadequate oxidation conditions of the $Al_2O_3$ serving as the intermediate layer in the samples of this working example are responsible for the decrease of the MR at 400° C. for Samples 2 to 4.

From further tests, it was found that the thermal resistance improves when using a multiple layer structure of at least two layers X/R of a metal X (X=Cu, Ag, Au, Ru, Rh, Ir, Re, Os) and an R selected from oxides, nitrides, carbides and borides (R=SiO2, SiC, $Si_3N_4$, $Al_2O_3$, AlN, $Cr_2O_3$, $Cr_2N$, TiO, TiN, TiC, $HfO_2$, HfN, HfC, $Ta_2O_5$, TaN, TaC, BN, $B_4C$. or mixtures of the above), or mixtures of X and oxides R.

WORKING EXAMPLE 7

The following elements were produced by magnetron sputtering on a thermally oxidized Si substrate in a uniaxial magnetic field.

Sample 1
Ta(3)/Cu(500)/X(3)/CoFe(3)/Ru(0.7)/CoFe(3)/$Fe_3O_4$(0.25)/$Al_2O_3$(X)/$Fe_3O_4$(0.25)/NiFe(4)/Ta(3)

Sample 2
Ta(3)/Cu(500)/X(3)/Co(3)/Ru(0.7)/Co(3)/$Fe_3O_4$(0.25)/$Al_2O_3$(X)/$Fe_3O_4$NiFe(4)/Ta(3)

(The numbers in parentheses indicate the film thicknesses in nm)

Here, X is one selected from Hf(bcc), Nb(bcc), Ta(bcc), Ru(hcp), Pt(fcc), Cu(fcc), and the composition of CoFe is determined as CoFe having a bcc structure.

These multilayer films were microprocessed using photolithography into mesa shapes with an element area of 2×2 $\mu m^2$, and after forming an inter-layer insulator film, an upper electrode was formed, yielding vertical current-type magneto-resistive elements with the cross section shown in FIG. 1. The film thickness X of the $Al_2O_3$ serving as the intermediate layer of the Samples 1 and 2 was adjusted so that the RA in the element areas was about 100Ω. The results of the measurement of the MR after the film formation are shown in Table 5.

TABLE 5

| X | Crystal structure | Sample 1 bcc MR(%) | Sample 2 hcp MR(%) |
|---|---|---|---|
| Mn | bcc | 3 | 2 |
| Ag | fcc | 3 | 5 |
| Hf | bcc | 15 | 10 |
| Ta | bcc | 15 | 11 |
| Nb | bcc | 13 | 8 |
| Cr | bcc | 15 | 16 |
| Ru | hcp | 7 | 13 |
| Pt | fcc | 7 | 14 |
| Cu | fcc | 8 | 21 |

As the result from other tests, it was found that if the pinned magnetic layer is a multilayer film of magnetic and non-magnetic layers, then strong antiferromagnetic coupling is generated directly after the film formation even when using no antiferromagnetic material, by selecting at least one element from the group consisting of IVa to VIa and VIII elements and Cu as the primer layer. Furthermore, it was confirmed that when using these primers, up to high temperatures the deterioration of the MR was smaller than when using an antiferromagnetic material such as FeMn. In particular, it was confirmed that when the primer layer and the adjacent magnetic layer have at least one crystal structure selected from fcc and hcp structures, or when both are of bcc structure, the antiferromagnetic coupling between the magnetic layers in the pinned layer was strengthened and a high MR can be attained. Furthermore, comparing the MR after thermal processing in a magnetic field at 300 to 450° C. of these samples to that of samples using FeMn or IrMn instead of the primer layer, it was found that the MR of vertical magnetic resistance effect elements using the primer layer of the present working example was higher.

WORKING EXAMPLE 8

The following sample was produced by magnetron sputtering on a thermally oxidized Si substrate in a uniaxial magnetic field.

Ta(3)/Cu(500)/Ta(3)/X(30)/CoFe(3)/$Al_2O_3$(1)/NiFe(4)/Ta(3)/NiFe(4)/Ta(3) Here, X is a Cr-based antiferromagnetic material or a Mn-based antiferromagnetic material.

These multilayer films were microprocessed using photolithography into mesa shapes with an element area of 2×2 $\mu m^2$, and after forming an inter-layer insulator film, an upper electrode was formed, yielding vertical current-type magneto-resistive elements with the cross section shown in FIG. 1. The results of the measurement of the MR after thermal processing at 350° C. in a magnetic field is shown in Table 6.

The table also lists the composition ratio of the examined compositions.

TABLE 6

| Antiferromagnetic material | MR(%) |
|---|---|
| *IrMn | 6 |
| *FeMn | 7 |

TABLE 6-continued

| Antiferromagnetic material | MR(%) |
|---|---|
| $Cr_{80}Mn_{20}$ | 25 |
| $Cr_{50}Mn_{50}$ | 27 |
| CrTc | 10 |
| *$Cr_{99.5}Ru_{0.5}$ | 3 |
| $Cr_{99}Ru_1$ | 20 |
| $Cr_{95}Ru_5$ | 25 |
| $Cr_{80}Ru_{20}$ | 24 |
| *$Cr_{75}Ru_{25}$ | 2 |
| *$Cr_{99.5}Rh_{0.5}$ | 4 |
| $Cr_{99}Rh_1$ | 23 |
| $Cr_{90}Rh_{10}$ | 27 |
| $Cr_{80}Rh_{20}$ | 25 |
| *$Cr_{75}Rh_{25}$ | 7 |
| *$Cr_{99.5}Re_{0.5}$ | 6 |
| $Cr_{99}Re_1$ | 14 |
| $Cr_{90}Re_{10}$ | 25 |
| $Cr_{80}Re_{20}$ | 17 |
| *$Cr_{75}Re_{25}$ | 5 |
| CrOs | 12 |
| CrIr | 19 |
| $Cr_{50}Pd_{50}$ | 12 |
| CrPt | 13 |
| CrAg | 11 |
| $Cr_{50}Au_{50}$ | 19 |
| $Cr_{95}Al_5$ | 13 |
| $Cr_{76}Al_{24}$ | 22 |
| $Cr_{70}Al_{30}$ | 20 |
| CrPtRu | 18 |
| CrPdRu | 17 |
| CrPtRe | 16 |
| CrPdRe | 18 |
| CrPtRh | 15 |
| CrPdRh | 13 |

*not preferable examples

As shown in Table 6, excellent thermal resistance was attained when the antiferromagnetic layer is an alloy of Cr and at least one selected from Mn, Tc, Ru, Rh, Re, Os, Ir, Pd, Pt, Ag, Au and Al. Furthermore, in further tests it was found that a similar effect also can be attained when these alloys include not more than 10 at % of additional elements besides the aforementioned ones.

WORKING EXAMPLE 9

The following elements were produced by magnetron sputtering on a thermally oxidized Si substrate in a uniaxial magnetic field.
Sample 1
  Ta(3)/Cu(500)/Ta(3)/X(30)/CoFe(3)/Al$_2$O$_3$(1)/NiFe(4)/Ta(3)/NiFe(4)/Ta(3)
Sample 2
  Ta(3)/Cu(500)/Ta(3)/NiFeCr(2)/X(30)/CoFe(3)/Al$_2$O$_3$(1)/NiFe(4)/Ta(3)/NiFe(4)/Ta(3)
Sample 3
  Ta(3)/Cu(500)/Ta(3)/NiFeCr(2)/X(30)/Co(2)/CoFe(1)/Al$_2$O$_3$(1)/NiFe(4)/Ta(3)/NiFe(4)/Ta(3)
Here, X is a Mn-based antiferromagnetic material.

These multilayer films were microprocessed using photolithography into mesa shapes with an element area of 2×2 μm$^2$, and after forming an inter-layer insulator film, an upper electrode was formed, yielding vertical current-type magneto-resistive elements with the cross section shown in FIG. 1. The results of the measurement of the MR after the thermal processing at 350° C. in a magnetic field of 5 kOe are shown in Table 7.
The table also lists the composition ratio of the examined compositions.

TABLE 7

| Antiferromagnetic material | Sample 1 MR(%) | Sample 2 MR(%) | Sample 3 MR(%) |
|---|---|---|---|
| *IrMn | 6 | 7 | 9 |
| *FeMn | 7 | 8 | 10 |
| *$Pt_{35}Mn_{65}$ | 1 | 1 | 1 |
| $Pt_{40}Mn_{60}$ | 18 | 24 | 25 |
| $Pt_{48}Mn_{52}$ | 26 | 29 | 31 |
| $Pt_{55}Mn_{45}$ | 17 | 19 | 22 |
| *$Pt_{60}Mn_{40}$ | 2 | 2 | 2 |
| *$Pd_{35}Mn_{65}$ | 1 | 1 | 1 |
| $Pd_{40}Mn_{60}$ | 11 | 14 | 15 |
| $Pd_{50}Mn_{50}$ | 16 | 18 | 20 |
| $Pd_{55}Mn_{45}$ | 12 | 15 | 16 |
| *$Pd_{60}Mn_{40}$ | 1 | 1 | 1 |
| *$(PtPd)_{35}Mn_{65}$ | 1 | 1 | 1 |
| $(PtPd)_{40}Mn_{60}$ | 15 | 17 | 21 |
| (PtPd)Mn | 23 | 26 | 29 |
| (PtPd)Mn | 16 | 18 | 20 |
| *(PtPd)Mn | 1 | 1 | 1 |

*not preferable examples

Table 7 shows that with Mn-based antiferromagnetic material including Pt or Pd, a resistance against thermal processing at 350° C. that is larger than that of IrMn and FeMn can be attained in a certain range of compositions. When the magnetization curves of the samples of this working examples were examined by VSM, it was found that after thermal processing at 450° C., the pinning magnetic field increased further from processing at 350° C., and hardly any reduction of the saturation magnetization of the pinned magnetic layer could be observed. On the other hand, the saturation magnetization of the pinned magnetic layer after thermal processing at 450° C. decreased considerably in elements using IrMn and FeMn, and it seems that the pinning magnetic field is lost and mutual diffusion occurred.

In Sample 2, which used NiFeCr for the primer of Sample 1, the thermal resistance was further improved. A similar effect could be confirmed with a primer layer having an fcc structure of NiFe, Cu or the like, or an hcp or hct structure. Moreover, as the result of an X-ray diffraction analysis, it was found that by providing a primer as in the present working example, the (111) plane orientation of the antiferromagnetic film was strengthened. It also was found that in the Cr-based antiferromagnetic film of the previously explained Working Example 8, when the primer layer had a bcc structure, the thermal resistance was improved further.

It can be seen that by providing a Co layer as the antiferromagnetic material, as in Sample 3, the thermal resistance is improved even further. This seems to be due to the fact that with Co, mutual diffusion tends to occur less easily than with CoFe.

The above shows that the thermal resistance is preferable when the antiferromagnetic layer is given by the composition formula $Mn_{100-x}Me_x$ (wherein Me is at least one of Pd and Pt), and X is in the range of $40 \leq X \leq 55$ (in atomic weight %). This seems to be because a larger amount of noble metals is included compared to IrMn and FeMn. In other tests, an excellent thermal resistance was also found when the MnMe composition contained not more than 10 at % of Tc, Ru, Rh, Re, Os, Ir, Pd, Pt, Ag, Au and Al.

The thermal resistance is improved when an antiferromagnetic layer is formed on the primer layer, and the primer layer and the antiferromagnetic layer have at least one crystal structure selected from fcc and hcp structure, or the primer layer and the antiferromagnetic layer both have bcc structure. This seems to be due to the fact that the crystal growth of the antiferromagnetic material is promoted by the primer layer, and distortions are reduced, thus suppressing the diffusion of elements constituting the antiferromagnetic layer.

The thermal pressing resistance is particularly large when at least the magnetic layer in contact with the antiferromagnetic layer is Co.

WORKING EXAMPLE 10

The following elements were produced by magnetron sputtering on a thermally oxidized Si substrate.

Sample 1

Ta(3)/Cu(500)/Ta(3)/PtMn(30)/X(0.5)/CoFe(3)/Al$_2$O$_3$(1)/CoFe(3)/Ta(3)

Sample 2

Ta(3)/Cu(500)/Ta(3)/PtMn(30)/CoFe(1.5)/X(0.5)/CoFe(1.5)/Al$_2$O$_3$(1)/CoFe(3)/Ta(3)

Here, X is a ferromagnetic material constituting a portion of the pinned magnetic layer.

These multilayer films were microprocessed using photolithography into mesa shapes with an element area of 2×2 $\mu$m$^2$, and after forming an inter-layer insulator film, an upper electrode was formed, yielding vertical current-type magneto-resistive elements with the cross section shown in FIG. 1. The results of the measurement of the MR after the thermal processing at 350° C. in a magnetic field are shown in Table 8.

The table also lists the composition ratio of the examined compositions.

TABLE 8

| Antiferromagnetic material | Sample 1 MR(%) | Sample 2 MR(%) |
| --- | --- | --- |
| *CoFe | 23 | 23 |
| Fe$_3$O$_4$ | 30 | 34 |
| MnZn ferrite | 32 | 33 |
| FeAlO | 36 | 38 |
| FeTaN | 32 | 34 |
| FeHfN | 32 | 35 |
| FeTaC | 33 | 36 |
| FeHfC | 33 | 36 |
| CoFeB | 37 | 38 |
| CoTaZr | 38 | 40 |
| CoTaNb | 33 | 35 |

*not preferable example

From Table 8, it can be seen that the thermal resistance can be improved considerably by using for at least a portion of the magnetic layer in contact with at least one of the antiferromagnetic layer or the non-magnetic layer a ferromagnetic material including at least one element selected from oxygen, nitrogen and carbon.

This seems to be due to the fact that a deterioration of the MR based on inter-layer diffusion during the thermal processing can be suppressed when at least a portion of the magnetic layer is made of a relatively thermally stable material such as an oxide, nitride or carbide. In this working example, the magnetic layer can be of (i) a three-layer structure of metal ferromagnetic material/ferromagnetic material including oxygen, nitrogen or carbon/metal ferromagnetic material, (ii) a two-layer structure of ferromagnetic material including oxygen, nitrogen or carbon/metal ferromagnetic material, or (iii) the magnetic layer can be made entirely of a ferromagnetic material including oxygen, nitrogen or carbon.

It was confirmed that it is also effective when, besides the Fe$_3$O$_4$ and MnZn ferrite of this working example, spinel oxides for which ferrite materials such as NiZn ferrite are typical examples, garnet oxides, or perovskite oxides are used for the oxygen-containing ferromagnetic material. Furthermore, a similar effect could be confirmed with an oxide ferromagnetic material of TMO (with T=Fe, Co, Ni, and M=Al, Si, Ti, Zr, Hf, V, Nb, Ta, Cr, Mg), such as FeAlO in this working example. Furthermore, besides the FeTaN and the FeHfN of this working example, a similar effect could also be confirmed with a nitride ferromagnetic material of TN or TMN (with T and M as above) as the nitrogen-containing ferromagnetic material, or, besides the FeTaC or FeHfC of this working example, with TMC (with T and M as above) as the carbide ferromagnetic material.

Moreover, inter-layer diffusion during the thermal processing can be suppressed when at least a portion of the magnetic layer is made of an amorphous ferromagnetic material. There is no particular limitation to the amorphous material, and the effect of increasing thermal resistance could be confirmed with Co(Fe)NbZr, Co(Fe)TaZr, CoFeB Co(Fe)Ti, Co(Fe)Zr, Co(Fe)Nb, Co(Fe)MoBZr, Co(Fe)VZr, Co(Fe)MoSiZr, Co(Fe)MoZr, Co(Fe)MoVZr, Co(Fe)MnB, among others.

WORKING EXAMPLE 11

The following element was produced by magnetron sputtering on a thermally oxidized Si substrate.

Sample 1

Ta(3)/Cu(500)/Ta(3)/PtMn(da)/CoFe(df)/Al$_2$O$_3$(Y)/CoFe(1)/NiFe(5)/Ta(3)

The film thickness Y of the Al$_2$O$_3$ was adjusted so that ca. 100 $\Omega\mu$m of RA was measured. Multilayer films obtained for various df and da were microprocessed using photolithography into mesa shapes with an element area of 2×2 $\mu$m$^2$, and after forming an inter-layer insulator film, an upper electrode was formed, yielding vertical current-type magneto-resistive elements with the cross section shown in FIG. 1. The results of the MR after the thermal processing at 350° C. in a magnetic able 9.

TABLE 9

| df (nm) | da (nm) | df/da | Sample 1 MR(%) |
| --- | --- | --- | --- |
| *1 | *3 | 0.33 | 6 |
| *2 | *3 | 0.66 | 8 |
| 10 | *3 | 3.3 | 7 |
| 50 | *3 | *17 | 6 |
| *60 | *3 | *20 | 3 |
| *1 | 5 | 0.2 | 9 |
| 2 | 5 | 0.4 | 18 |
| 10 | 5 | 2 | 13 |
| 50 | 5 | *10 | 7 |
| *60 | 5 | *12 | 5 |
| *1 | 10 | 0.1 | 9 |
| 2 | 10 | 0.2 | 24 |
| 10 | 10 | 1 | 32 |
| 50 | 10 | 5 | 21 |
| *60 | 10 | *6 | 9 |
| *1 | 20 | *0.03 | 8 |
| 2 | 20 | 0.1 | 23 |
| 10 | 20 | 0.5 | 29 |
| 50 | 20 | 2.5 | 19 |
| *60 | 20 | 3 | 8 |
| *1 | 100 | *0.01 | 2 |
| 2 | 100 | *0.02 | 4 |
| 10 | 100 | 0.1 | 17 |
| 50 | 100 | 0.5 | 21 |
| *60 | 100 | 0.6 | 9 |
| 1 | *200 | *0.005 | 1 |
| 2 | *200 | *0.01 | 3 |
| 10 | *200 | *0.05 | 6 |

TABLE 9-continued

| df (nm) | da (nm) | df/da | Sample 1 MR(%) |
|---|---|---|---|
| 50 | *200 | 0.25 | 9 |
| *60 | *200 | 0.3 | 7 |

*not preferable example processing the samples before the microprocessing step at 260° C., 350° C., 400° C. and 450° C. in a magnetic field, their magnetization curves were examined by VSM. On the whole, it was found that the thicker the pinned magnetic layer and the thinner the antiferromagnetic layer, the pinning magnetic field after the thermal processing tends to be stronger and the structure of the magnetic material tends to be better preserved, but when the antiferromagnetic material is too thin, the pinning magnetic field tends to be decreased. Also, when the magnetic layer is too thick, a decrease of the stationary field could be observed. Although an increase of the coercivity that seems to be caused by thermal stress or disturbances at the interfaces of the intermediate layers was observed as the thermal processing temperature was increased, the pinning magnetic field itself became stronger, and it became clear that the effect of an increase in the pinning magnetic field of the antiferromagnetic layer was achieved using a high-temperature process with a thermal processing temperature of 350° C. to 400° C. This also can be confirmed in the MR curves.

Figure 11:
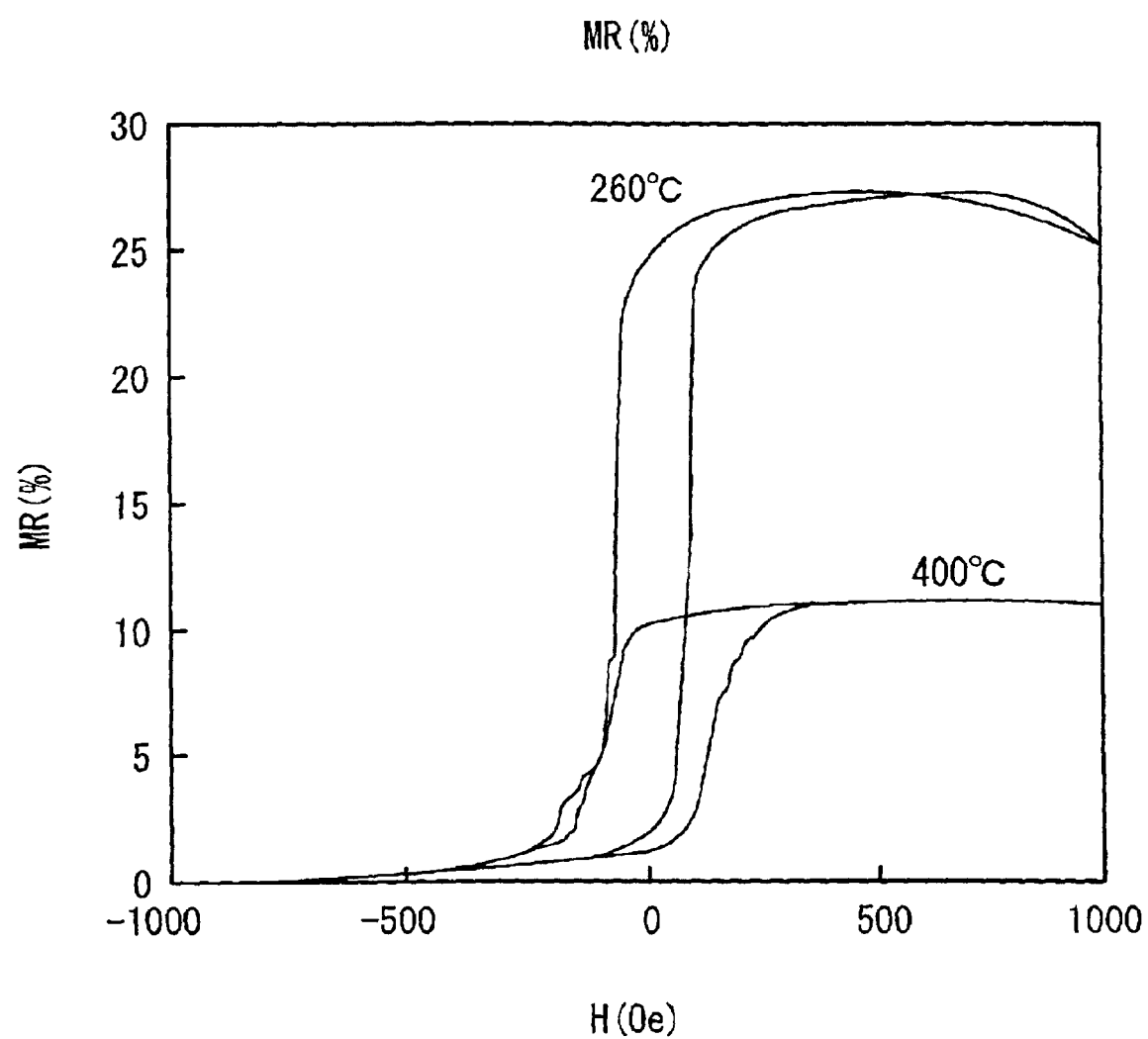
FIG. 11 shows the thermal processing properties of the MR.

As an example, FIG. 11 shows the MR curves when the thermal processing was carried out at 260° C. and at 400° C.

In this example, the sample was of the following form:

Ta(3)/Cu(500)/Ta(3)/PtMn(300)/CoFe(3)/Al$_2$O$_3$(Y)/CoFe(3)/Ta(3)

The film thickness Y of the Al$_2$O$_3$ was adjusted so that ca. 100 Ω$\mu$m of RA was measured.

A decrease of the MR could not be observed, possibly because the intermediate layer was not optimized or because of dispersion due to the relatively low ratio (0.1) of FeCo(3)/PtMn(30), but a clear increase of the pinning magnetic field was observed after thermal processing at 400° C.

In this working example, the best sample had an MR of at least 15% even after thermal processing at 450° C. Since the MR also depends on the condition of the intermediate layer, it can be seen that an excellent thermal resistance is attained substantially within the range of this working example, that is, in the ranges 2 nm≦df≦50 nm, 5 nm≦da≦100 nm, and 0.1≦df/da≦5, wherein df is the layer thickness of the pinned magnetic layer and da is the thickness of the antiferromagnetic material.

Furthermore, PtMn was used for the antiferromagnetic material in this working example, but it could be confirmed that the range in which thermal stability is attained from 350° C. to 450° C. is substantially the same also for other ferromagnetic materials.

WORKING EXAMPLE 12

The following elements were produced by magnetron sputtering on a thermally oxidized Si substrate.

Sample 1
Ta(3)/Cu(500)/Ta(3)/PtMn(20)/CoFe(6)/Al$_2$O$_3$(1.8)/CoFe(1)/NiFe(5)/Ta(3)

Sample 2
Ta(3)/(Cu(250)/Ta(3))*2/PtMn(20)/CoFe(6)/Al$_2$O$_3$(1.8)/CoFe(1)/NiFe(5)/Ta(3)

Sample 3
Ta(3)/(Cu(50)/Ta(3))*10/PtMn(20)/CoFe(6)/Al$_2$O$_3$(1.8)/CoFe(1)/NiFe(5)/Ta(3)

Furthermore, (Cu(50)/Ta(3))*10 means that the layers (Cu(50)/Ta(3)) are produced ten times in repetition.

These multilayer films were microprocessed using photolithography into mesa shapes with an element area of 2×2 $\mu$m$^2$, and after forming an inter-layer insulator film, an upper electrode was formed, yielding vertical current-type magneto-resistive elements with the cross section shown in FIG. 1. Table 10 shows the MR after thermal processing at 300° C., 350° C., 400° C. and 450° C. in a magnetic field.

TABLE 10

| Thermal process temperature ° C. | Sample 1 MR(%) | Sample 2 MR(%) | Sample 3 MR(%) |
|---|---|---|---|
| 300 | 45 | 46 | 47 |
| 350 | 25 | 32 | 37 |
| 400 | 12 | 20 | 25 |
| 450 | 8 | 15 | 20 |

From Table 10, it can be seen that with thermal processing at 300° C., the MR of the Samples 1 to 3 are all substantially the same, and as the thermal processing temperature increases, the deterioration of the MR is smaller when the primer electrode is multilayered, as in Sample 2 and Sample 3.

Regarding the increase of the thermal processing properties when the lower electrode was multilayered like this, a similar effect could be confirmed, other than with the combination of Cu and Ta, with multilayer films of a highly conductive metal film having at least one selected from Ag, Au, Al and Cu as the main component, and a grain-growth suppression layer of a material having at least one selected from groups IVa to VIa and VIII as the main component, or of one selected from a conductive oxide, a conductive nitride and a conductive carbide. These multilayer electrodes seem to suppress the grain growth in the electrodes due to thermal processing, and function so as to decrease disturbances in the layering structure, so that the thermal resistance is increased. With regard to the suppression of grain growth, it is preferable that the thickness of the highly conductive metal layer is ca. 5 nm to 100 nm, and that of the grain-growth suppression layer is 0.7 nm to 5 nm.

The above Working Examples 1 to 12 were described with elements using the tunneling magnetic resistance effect. This tunneling magnetic resistance effect occurs when the intermediate layer is an insulator or a semiconductor including at least one element selected from oxygen, nitrogen, carbon and boron, and more specifically, this effect can be confirmed with oxides, nitrides, carbides, borides or semiconductors, such as $SiO_2$, SiC, $Si_3N_4$, $Al_2O_3$, AlN, $Cr_2O_3$, TiC, $HfO_2$, HfN, HfC, $Ta_2O_5$, TaN, TaC, BN, $B_4C$., DLC or $C_{60}$. Furthermore, when not more than 20 at % of such elements as Cu, Ag, Au, Pt, Pd, Rh, RhIr and Ru are included in the intermediate layer, a similar effect is attained if the resistance is sufficiently high. The intermediate layer can be of a multilayer structure of insulator and conductor, or of a structure in which a conducting element is covered with an insulator.

In the following examples, the intermediate layer is a non-insulator, and the magnetic resistance effect is due to the GMR effect.

WORKING EXAMPLE 13

The following elements were produced by magnetron sputtering on a thermally oxidized Si substrate.

Sample 1
   Ta(3)/Cu(500)/Ta(3)/PtMn(10)/Co(3)/Ru(0.7)/Co(3)/Cu(2.2)/Co(1)/NiFe(2)/Pt(7)/Ta(10)
Sample 2
   Ta(3)/Cu(500)/Ta(3)/PtMn(10)/Co(3)/Ru(0.7)/Co(3)/Cu(2.2)/Co(1)/NiFe(2)/Ta(3)/NiFe(4)/Ta(3)
Sample 3
   Ta(3)/Cu(500)/Ta(3)/PtMn(10)/Co(3)/Ru(0.7)/Co(3)/Cu(2.2)/Al$_2$O$_3$(0.3)/Co(1)/NiFe(2)/Ta(3)/NiFe(4)/Ta(3)
Sample 4
   Ta(3)/Cu(500)/Ta(3)/PtMn(10)/Co(3)/Ru(0.7)/Co(3)/Cu(1.1)/Al$_2$O$_3$(0.3)/Co(1.1)/Co(1)/NiFe(2)/Ta(3)/NiFe(4)/Ta(3)
Sample 5
   Ta(3)/Cu(500)/Ta(3)/PtMn(10)/Co(3)/Ru(0.7)/Co(3)/CuAlO(2.2)/CoFe(1)/NiFe(2)/Ta(3)/NiFe(4)/Ta(3)
Sample 6
   Ta(3)/Cu(500)/Ta(3)/PtMn(10)/FeN(3)/Cr(0.7)/FeN(2)/CoFeB(1)/CuAlO(2.2)/CoFeB(1)/NiFe(2)/Ta(3)/NiFe(4)/Ta(3)

These multilayer films were microprocessed using EB lithography into mesa shapes with an element area of 0.1×0.1 $\mu$m$^2$, and after forming an inter-layer insulator film, an upper electrode was formed, yielding vertical current-type magneto-resistive elements with the cross section shown in FIG. 1. It should be noted that all microprocessed elements had the same thickness.

Table 11 shows the MR and the resistance after thermal processing in a magnetic field.

TABLE 11

| Sample | Resistance ($\Omega$) | MR(%) |
|---|---|---|
| 1 | 0.6 | 2 |
| 2 | 0.5 | 10 |
| 3 | 1 | 12 |
| 4 | 1.1 | 15 |
| 5 | 0.8 | 12 |
| 6 | 1.5 | 8 |

In Sample 1 and Sample 2, the free magnetic layer is configured according to the present invention, so that an increase of the MR can be observed. This seems to be because the domain structure changes due to the free magnetic layer of the present invention, and the demagnetizing field that has been increased by the miniaturization is decreased. Furthermore, by providing a multilayer film of non-magnetic material (which is highly resistant) and transition metals, as in Sample 3 and Sample 4, the resistance is increased, and the MR is improved. A similar effect can be observed with compounds of highly resistant non-magnetic materials and transition elements, as in Sample 5. Furthermore, it can be seen that when the magnetic layer is a highly resistant nitride or amorphous ferromagnetic material, as in Sample 6, the resistance increases, even though the MR drops slightly.

Thus, it can be seen that a vertical current-type magneto-resistive element utilizing the GMR effect and having high MR and high resistance can be produced, when the intermediate layer is made of at least one element selected from the transition elements, or of at least one compound conducting material selected from compounds of a transition element and oxygen, nitrogen or carbon, and when the element area is not more than 0.01 $\mu$m$^2$.

The element area should be not more than 0.01 $\mu$m$^2$, in order to increase the element resistance, and the problem of deterioration of the coercivity due to miniaturization can be solved with the magneto-resistive element of the present invention.

A similar effect is also attained, when the intermediate layer is a transition metal other than the Cu of this working example, and in particular when it is at least one selected from V, Nb, Ta, Cr, Mo, W, Cu, Ag, Au, Ru, Rh, Ir, Re, and Os.

It was confirmed that an increase of the element resistance or the thermal resistance is attained when using, as in the RuAlO compound or multilayer films of Ru/Al$_2$O$_3$/Ru or Ru/Al$_2$O$_3$ a conductive compound of these elements, oxidized, nitrided or carbided to an extent at which their conductivity is not lost; or an oxide, nitride, carbide or boride compound XR of an R (R=SiO$_2$, SiC, Si$_3$N$_4$, Al$_2$O$_3$, AlN, Cr$_2$O$_3$, Cr$_2$N, TiO, TiN, TiC, HfO$_2$, HfN, HfC, Ta$_2$O$_5$, TaN, TaC, BN, B$_4$C. or composites of the above) with the above-mentioned transition metals X; or a two-layer multilayer film of X/R.

Furthermore, the element resistance of the vertical current-type magneto-resistive element due to the CPP-GMR effect can be increased when for the magnetic material sandwiching the intermediate layer, at least a portion of at least one magnetic layer is made of a ferromagnetic material including oxygen, nitrogen or carbon, or of an amorphous ferromagnetic material. More specifically, a similar effect could be observed with spinel oxides for which ferrite materials such as Fe$_3$O$_4$, MnZn ferrite and NiZn ferrite are typical examples, garnet oxides, perovskite oxides, as well as oxide ferromagnetic materials such as TMO (with T=Fe, Co or Ni; M=Al, Si, Ti, Zr, Hf, V, Nb, Ta, Cr or Mg) serving as a ferromagnetic material including oxygen. A similar effect also could be observed with nitride ferromagnetic materials such as TN or TMN (with T and M as above) serving as a ferromagnetic material including nitrogen. A similar effect also could be observed with TMC (with T and M as above) serving as a ferromagnetic material including carbon. A similar effect also was confirmed with Co(Fe)NbZr, Co(Fe)TaZr, CoFeB, Co(Fe)Ti, Co(Fe)Zr, Co(Fe)Nb, Co(Fe)MoBZr, Co(Fe)VZr, Co(Fe)MoSiZr, Co(Fe)MoZr, Co(Fe)MoVZr and Co(Fe)MnB as an amorphous material.

WORKING EXAMPLE 14

Lower electrode wiring was applied by magnetron sputtering on a MOS substrate, and on the following multilayer films were formed on the MOS substrate, which has been subjected to CMP.
Sample 1
   Ta(3)/Cu(500)/Ta(3)/NiFe(1)/FeCo(1)/Al$_2$O$_3$(Y)/CoFe(10)/PtMn(20)/Ta(3)
Sample 2
   Ta(3)/Cu(500)/Ta(3)/NiFe(2)/Ta(3)/NiFe(1)/FeCo(1)/Al$_2$O$_3$(Y)/CoFe(10)/PtMn(20)/Ta(3)
Sample 3
   Ta(3)/Cu(500)/Ta(3)/NiFe(3)/Ru(0.7)/FeCo(1)/Al$_2$O$_3$(Y)/CoFe(10)/PtMn(20)/Ta(3)

Figure 12B:
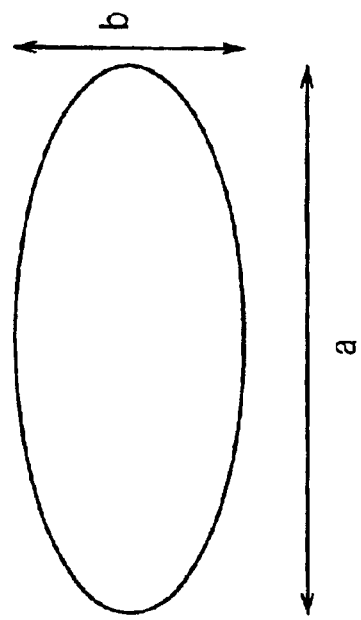
FIG. 12B shows the longest width A and the shortest width B of the free magnetic lalyer.
Figure 12A:
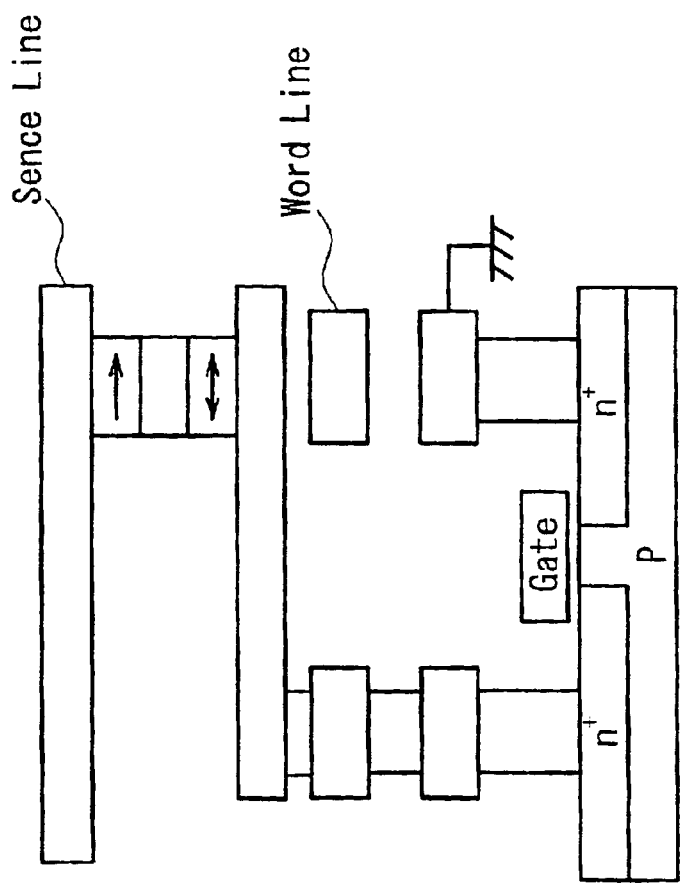
FIG. 12A illustrates a memory using a vertical current-type magneto-resistive element in accordance with the present invention.

The film thickness Y of the Al$_2$O$_3$ was adjusted so that ca. 1 k$\Omega\mu$m of RA was measured. The element shapes of these films were mesa-processed using steppers into substantially elliptical shapes with a major axis "a" and a minor axis "b", and elements were produced, in which the ratio a/b was 1, 1.5, 5, 10 and 12, respectively. In all elements, the length of "a" was set to 1000 nm, and the width of the word line and the sense line of the element was set to 2000 nm. After the microprocessing, the upper wiring was formed, and after hydrogen sintering at 400° C., a memory element as shown in FIG. 12A was obtained. The magnetization direction of the pinned magnetic layer of this memory element was set by applying a magnetic field of 10 kOe in a vacuum of 240° C.

When the MOS was off, a current was sent through the word line and the sense line, writing into the free magnetic layer with the resulting cross magnetic field, and when the MOS was on, a sense current was sent through the elements, and the output when the magnetization of the free magnetic layer was parallel to that of the pinned magnetic layer was compared to the output when the magnetizations were antiparallel. Table 12 shows the normalized power consumption necessary for writing into the elements, and Table 13 shows the normalized output.

TABLE 12

|      | Sample 1 | Sample 2 | Sample 3 |
|------|----------|----------|----------|
| 1    | 1        | 0.01     | 0.04     |
| 1.5  | 1.4      | 0.08     | 0.3      |
| 5    | 1.7      | 2        | 2.3      |
| 10   | 14.6     | 8.6      | 9.2      |
| 12   | 19.6     | 12       | 13       |

TABLE 13

|      | Sample 1 | Sample 2 | Sample 3 |
|------|----------|----------|----------|
| 1    | 1        | 1.2      | 1.1      |
| 1.5  | 1.1      | 1.3      | 1.2      |
| 5    | 1.2      | 1.5      | 1.4      |
| 10   | 1.3      | 1.4      | 1.2      |
| 12   | 0.9      | 1.1      | 1        |

From Table 12 and Table 13, it can be seen that Sample 2 and Sample 3 of this working example attain both a low power consumption and a high output. Of these, the highest output was attained when the ratio a/b of the element shape was in the range 1.5<a/b<10.

WORKING EXAMPLE 15

A magnetic sensor (see FIG. 13) was formed on an AlTiC substrate.
Sample 1
  lower shield 301/magnetic separation layer 302/PtMn (20)/CoFe(3)/Ru(0.7)/CoFe(3)/Al$_2$O$_3$(1.5)/CoFe(1)/NiFe(3)
Sample 2
  lower shield 301/magnetic separation layer 302/PtMn (20)/CoFe(3)/Ru(0.7)/CoFe(3)/Al$_2$O$_3$(1.5)/CoFe(1)/ NiFe(3)/NiFe(4)/Ta(3)/NiFe(4)/magnetic separation layer 312/upper shield 311
Sample 3
  lower shield 301/magnetic separation layer 302/PtMn (20)/CoFe(3)/Ru(0.7)/CoFe(3)/Al$_2$O$_3$(1.5)/CoFe(1)/ NiFe(3)/NiFe(5)/Ru(0.7)/NiFe(3)/magnetic separation layer 312/upper shield 311

Figure 13:
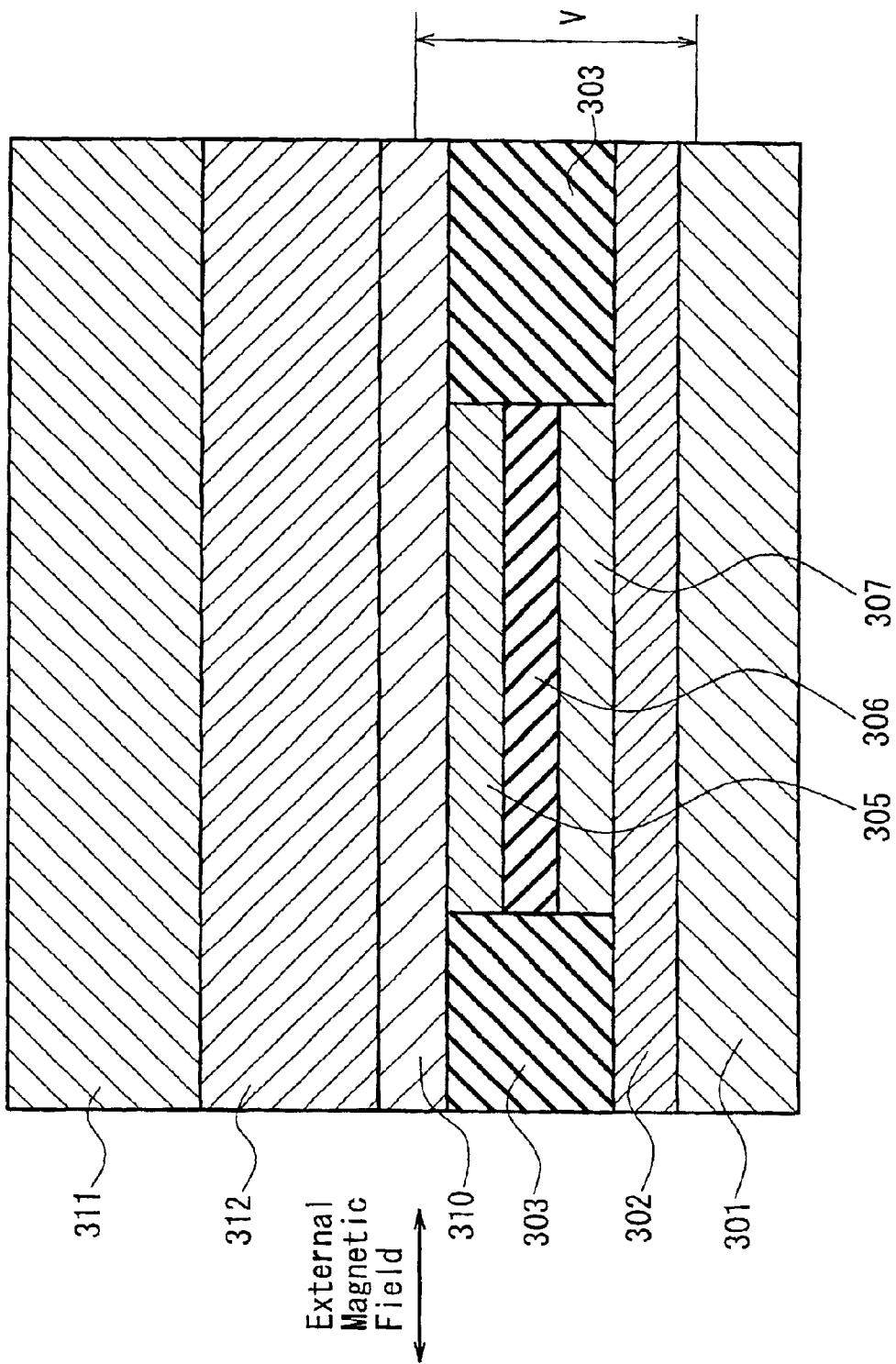
FIG. 13 is a cross-sectional view of a magnetic sensor in accordance with the present invention, using a flux guide.

Here, NiFe/Ta/NiFe and NiFe/Ru/NiFe correspond to the flux guide 310 (in FIG. 13). PtMn is an antiferromagnetic layer, CoFe/Ru/CoFe is a pinned magnetic layer 307, Al$_2$O$_3$ is a non-magnetic layer 306, and CoFe/NiFe is a free magnetic layer 305. These layers are formed with the insulating layer 303. Furthermore, thermal processing was performed first in the direction of the flux guide at 280° C. and 5 kOe for 1.5 hours, and then perpendicular to the flux guide (i.e. perpendicular to the paper plane in FIG. 13) at 1800° C. with a magnetic field of 5 kOe for 1.5 hours.

Using three kinds of sensors, a reproduction test was performed, in which a HDD recording medium recorded at a track density of 9 OkTPI (tracks per inch) and a linear recording density of 550 kBPI (bits per inch) was reproduced at a data transfer speed of 211 Mbit/sec. The floating height of the head was set to 20 nm. The bit error rate of the head was $1 \times^{-7}$ in Sample 1, $1 \times 10^{-8}$ in Sample 2, and $1 \times 10^{-8.5}$ in Sample 3.

Thus, a magnetic sensor using the free magnetic layer of the present invention achieves a high BER.

WORKING EXAMPLE 16

The following elements were produced by magnetron sputtering on a thermally oxidized Si substrate in a uniaxial magnetic field.
Sample 1
  Ta(3)/Cu(500)/Ta(3)/PtMn(15)/CoFe(2)/Ru(0.7)/CoFe (2)/Al$_2$O$_3$(2)/CoFe(1)/NiFe(1)/Ta(3)
Sample 2
  Ta(3)/Cu(500)/Ta(3)/NiFe(4)/PtMn(15)/CoFe(2)/Ru (0.7)/CoFe(2)/Al$_2$O$_3$(2)/CoFe(1)/NiFe(1)/Ta(3)
Sample 3
  Ta(3)/Cu(500)/Ta(3)/NiFeCr(4)/PtMn(15)/CoFe(2)/Ru (0.7)/CoFe(2)/Al$_2$O$_3$(2)/CoFe(1)/NiFe(1)/Ta(3)
Sample 4
  Ta(3)/(Cu(5)/Ta(1))* 100/NiFeCr(4)/PtMn(15)/CoFe(2)/ Ru(0.7)/CoFe(2)/Al$_2$O$_3$(2)/CoFe(1)/NiFe(1)/Ta(3)
Sample 5
  Ta(3)/Cu(500)/NiFe(1)/CoFe(1)/Al$_2$O$_3$(2)/CoFe(3)/Ru (0.7)/Co$_{30}$Fe$_{70}$/PtMn(15)/Ta(3)
Sample 6
  Ta(3)/Cu(500)/NiFe(1)/CoFe(1)/Al$_2$O$_3$(2)/CoFe(3)/Ru (0.7)/Co$_{50}$Fe$_{50}$(3)/PtMn(15)/Ta(3)
Sample 7
  Ta(3)/Cu(500)/NiFe(1)/CoFe(1)/Al$_2$O$_3$(2)/CoFe(3)/Ru (0.7)/Co$_{90}$Fe$_{10}$(3)/PtMn(15)/Ta(3)
Sample 8
  Ta(3)/Cu(500)/NiFe(1)/CoFe(1)/Al2O$_3$(2)/CoFe(3)/Ru (0.7)/Co$_{90}$Fe$_{10}$(1)/NiFe(2)/PtMn(15)/Ta(3)

These multilayer films were microprocessed using photolithography into mesa shapes with an element area of 2×61 $\mu$m$^2$, and after forming an inter-layer insulator film, an upper electrode was formed, yielding vertical current-type magneto-resistive elements with the cross section shown in FIG. 1 or FIG. 7. The results of the measurement of the MR after the thermal processing at 300° C. to 400° C. in a magnetic field of 5 kOe are shown in Table 14.

It should be noted that the CoFe in Samples 1 to 8 was a Co$_{76}$Fe$_{24}$ composition.

TABLE 14

| Sample | MR (%) 300° C. | MR (%) 350° C. | MR (%) 400° C. |
|--------|----------------|----------------|----------------|
| 1      | 48             | 22             | 9              |
| 2      | 49             | 48             | 39             |
| 3      | 50             | 48             | 43             |
| 4      | 50             | 49             | 46             |
| 5      | 45             | 18             | 6              |
| 6      | 44             | 28             | 8              |
| 7      | 47             | 35             | 30             |
| 8      | 43             | 38             | 35             |

From Table 14, it can be seen that in Samples 1 to 4, in which the lower film portion served as the pinned magnetic layer, the thermal resistance of Sample 2 and Sample 3 using a NiFe or NiFeCr primer was better than in Sample 1. It also can be confirmed that in Sample 4, in which the primer electrode of Sample 3 is devised as a multilayer, the thermal resistance further improved. On the other hand, in Samples 5 to 8, in which the upper film portion served as the pinned magnetic layer, an improvement of the thermal resistance was observed when the CoFe composition below the PtMn became richer in Co, or when the layer below the PtMn was NiFe.

It was found by X-ray diffraction that as the Co content increased, the bcc structure changed to a hcp or fcc structure. That the thermal resistance of this working example is higher than in other working examples is not only due to the optimized structure, but also depends on the optimal formation of the $Al_2O_3$ layer.

Also when PtMn was substituted with PtPdMn, a similarly excellent high thermal resistance was confirmed.

Moreover, a preferable composition of the antiferromagnetic layer was $Mn_{100-x}Me_x$ (Me being at least one selected from Pd and Pt), with X in the range of $40 \leq X \leq 55$ (in atomic weight %).

WORKING EXAMPLE 17

The following elements were produced by magnetron sputtering on a thermally oxidized Si substrate.

Sample 1
    Ta(3)/Cu(500)/Ta(3)/NiFe(5)/Ta(3)/NiFe(5)/$Al_2O_3$(0.9)/CoFe(3)/Ru(0.9)CoFe(3)/PtMn(15)/Ta(3)

Sample 2
    Ta(3)/Cu(500)/Ta(3)/NiFe(5)/Ru(0.9)/NiFe(5)/$Al_2O_3$(0.9)/CoFe(3)/Ru(0.9)/CoFe(3)/PtMn(15)/Ta(3)

Sample 3
    Ta(3)/Cu(500)/Ta(3)/NiFe(5)/Ta(3)/NiFe(9)/$Al_2O_3$(0.9)/CoFe(3)/Ru(0.9)/CoFe(3)/PtMn(15)/Ta(3)

Sample 4
    Ta(3)/Cu(500)/Ta(3)/NiFe(5)/Ru(0.9)/NiFe(9)/$Al_2O_3$(0.9)/CoFe(3)/Ru(0.9)/CoFe(3)/PtMn(15)/Ta(3)

Sample 5
    Ta(3)/Cu(500)/Ta(3)/CoFe(4)/Ta(3)/NiFe(9)/$Al_2O_3$(0.9)/CoFe(3)/Ru(0.9)CoFe (3)/PtMn(15)/Ta(3)

Sample 6
    Ta(3)/Cu(500)/Ta(3)/CoFe(4)/Ru(0.9)/NiFe(9)/$Al_2O_3$(0.9)/CoFe(3)/Ru(0.9)/CoFe(3)/PtMn(15)/Ta(3)

For the CoFe(4) and NiFe(9) constituting the free magnetic layers in Sample 5 and Sample 6, the product film thickness×saturation magnetization was set to the same value. The free magnetic layers of the Samples 1, 3 and 5 seem to be coupled mainly by magnetostatic coupling with Ta(3), which is a non-magnetic layer, whereas in the Samples 2, 4 and 6, they seem to be coupled mainly by antiferromagnetic coupling with Ru(0.9).

The multilayer films were thermally processed at 280° C. in a magnetic field of 5 kOe, and microprocessed using EB and photolithography into mesa shapes with element areas of 0.1×0.3, 0.3×0.3 and 1×3 $\mu m^2$. The elements were processed so that the longitudinal direction of the elements was parallel to the direction of the thermal processing. After forming an inter-layer insulator film, an upper electrode was formed, yielding vertical current-type magneto-resistive elements with the cross section shown in FIG. 1 and FIG. 7.

First, the elements with an element shape of 1×3 $\mu m^2$ were studied. The MR when applying ±200 Oe was about 5% for Sample 2, whereas it was about 30% for all other samples. Then, an external magnetic field of 200 Oe was applied in the longitudinal direction of the elements so that the magnetic resistance became maximal, and the magnetization direction was stored in the free magnetic layer. To examine the memory stability of the elements of the Samples 1 and 3 to 6, a one-hour thermal stability test at 250° C., and a disturbing magnetic field stability test in a rotating magnetic field of ca. 5 Oe were performed. As a result, there was no change of the resistance after both tests in the Samples 3 to 6. On the other hand, in Sample 1, a decrease of the element resistance could be observed. Thus, it was found that with the configuration of Samples 3 to 6, a stable storage of the magnetization direction in the free magnetic layer is possible.

When the same tests were performed on the elements of 0.1×0.3 $\mu m^2$, magnetic reversals at 200 Oe could not be performed adequately due to the increase of the reversing field. On the other hand, a similar storage stability as for 1×3 $\mu m^2$ could be confirmed for Sample 5 and Sample 6.

When the same tests were performed on the elements of 0.3×0.3 $\mu m^2$, although magnetic reversals could be performed with the Samples 3 to 6, storage stability could be confirmed only for Sample 5 and Sample 6.

Thus, it can be seen that that a memory effect can be provided when the free magnetic layer is a multilayer film made of a magnetic layer and a non-magnetic layer with a different film thickness×saturation magnetization, or when the film thickness×saturation magnetization is the same, but the coercivity is different, and the dependency of the memory effect on the size and the shape of the element is particularly small in elements in which the film thickness× saturation magnetization is the same.

WORKING EXAMPLE 18

The following elements were produced by magnetron sputtering on a thermally oxidized Si substrate.

Sample 1
    Ta(3)/Cu(500)/Ta(3)/PtMn(30)/CoFe(3)/Ru(0.7)/CoFe(3)/$Al_2O_3$(Y)/NiFe(5)/Ru(0.7)/NiFe (3)/Ta(3)

Sample 2
    Ta(3)/Cu(500)/Ta(3)/PtMn(30)/CoFe(3)/Ru(0.7)/CoFe(3)/$Al_2O_3$(Y)/NiFe(3)/Ru(0.7)/NiFe(5)/Ta(3)

Figure 14B:
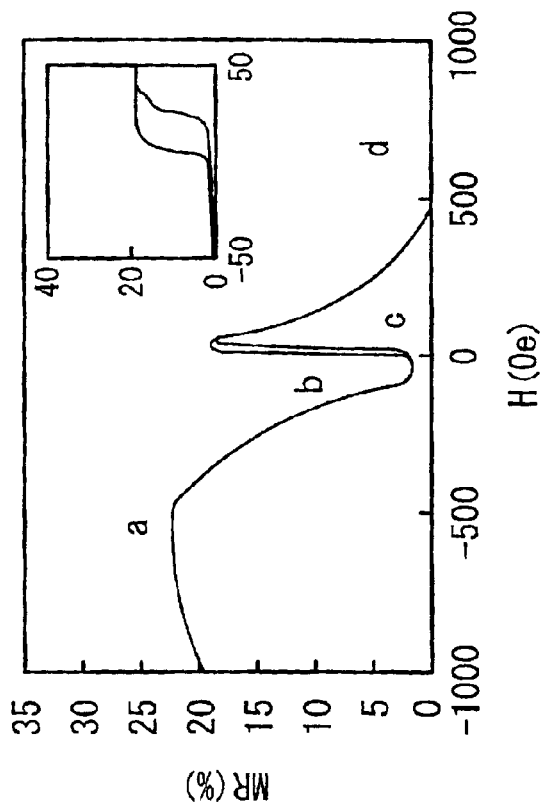
FIGS. 14A and 14B show the MR curve of a free magnetic layer for different film thickness configurations.
Figure 14B:
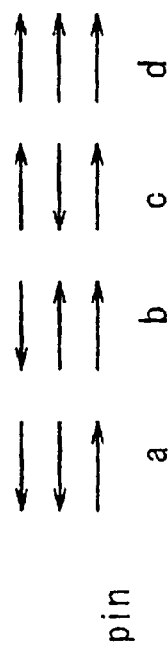
Figure 14A:
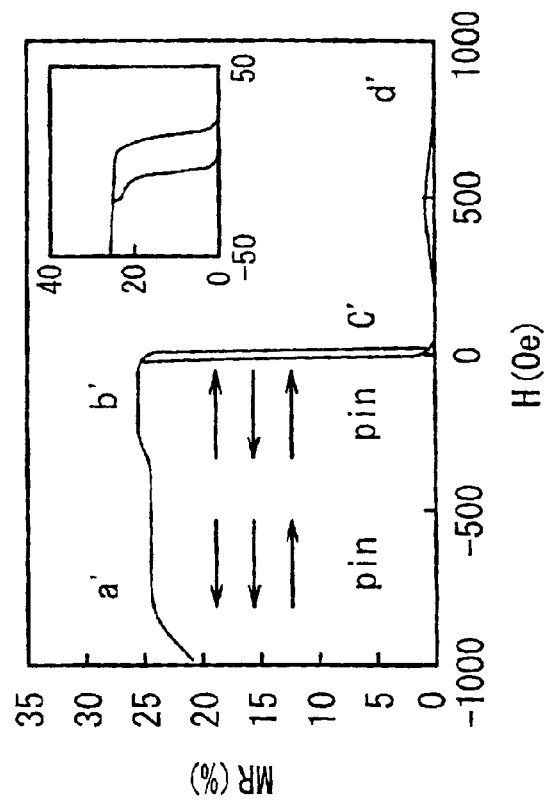

The film thickness Y of the $Al_2O_3$ was adjusted so that ca. 100 $\Omega\mu m$ of RA was measured. The multilayer films were thermally processed at 240° C. in a magnetic field of 5 kOe, and microprocessed using photolithography into mesa shapes with an element area of 3×3 $\mu m^2$. After forming an inter-layer insulator film, an upper electrode was formed, yielding vertical current-type magneto-resistive elements with the cross section shown in FIG. 1 and FIG. 7. FIG. 14 shows MR curves of Sample 1 and Sample 2, and the magnetization state of the NiFe/Ru/NiFe layer serving as the free magnetic layer. In both Sample 1 and Sample 2, it was found that the magnetic layer with large film thickness ratio responds to an external magnetic field. Moreover, in both Sample 1 and Sample 2, different from regular spin-valve-type TMR, a maximum value of the magnetic resistance with respect to external fields could be observed, and it was found that in particular in Sample 2, in which the magnetic layer close to the intermediate layer in the free magnetic layer is thin, a maximum is evident. In Sample 1 and Sample 2, when the external field was increased in the positive direction, the magnetization state in the free magnetic layer changes from b' to c' or from b to c, but since these are at a magnetization level leading to spin flops, they are reversible when the external field has been removed, and the initial magnetization state of the free magnetic layer is not lost. Moreover, at this level, especially in Sample 2, the MR changes considerably. It can be seen that utilizing this it is possible to read out the magnetization state without destroying the magnetization state, with a configuration of the type as in Sample 2, when measuring the magnetic resistance with respect to changes in the external magnetic field.

Here, "configuration of the type as in Sample 2" refers to a magneto-resistive element, in which at least one free magnetic layer is made of three layers, namely a first magnetic layer, a non-magnetic layer and a second magnetic layer, layered in that order from the side of the intermediate layer, and when the average film thickness of the first magnetic layer is d1, its average saturation magnetization is M1, the average film thickness of the second magnetic layer is d2, and its average saturation magnetization is M2, then M2×d2>M1×d1, and the magnetic resistance displays at least one maximum or minimum with respect to changes in the external magnetic field

WORKING EXAMPLE 19

The following elements were produced by magnetron sputtering on a thermally oxidized Si substrate.

Ta(3)/Cu(500)/Ta(3)/PtMn(15)/CoFe(3)/Ru(0.7)/CoFe(3)/Al$_2$O$_3$(Y)/NiFe (4)/Ru(0.9)/NiFe(4)/Ru(0.9)/NiFe(7)/Ta(3)

Figure 15:
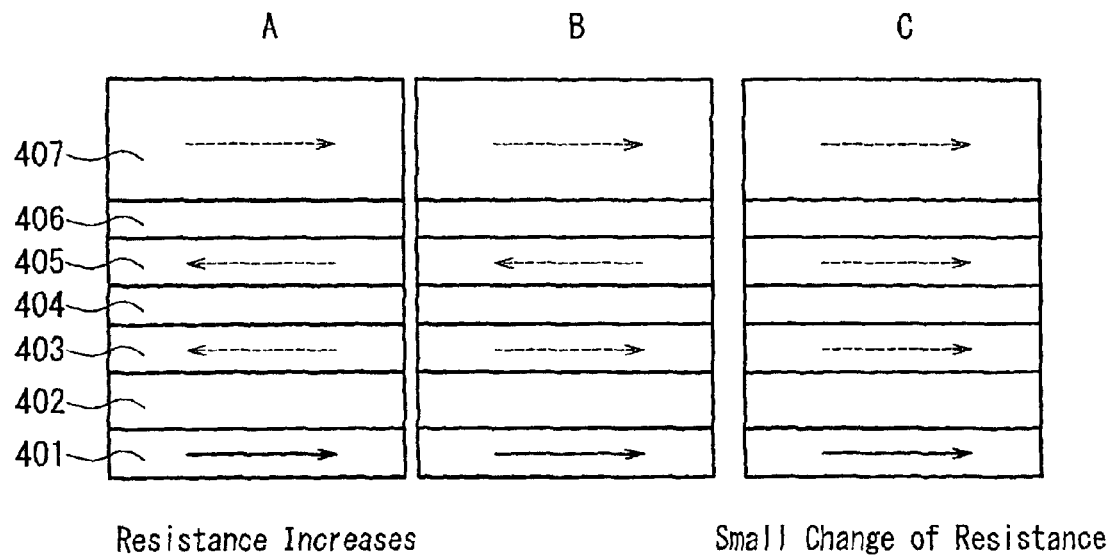
FIG. 15 illustrates the operating principle of a non-destructive read-out magneto-resistive element of the present invention.
Figure 16:
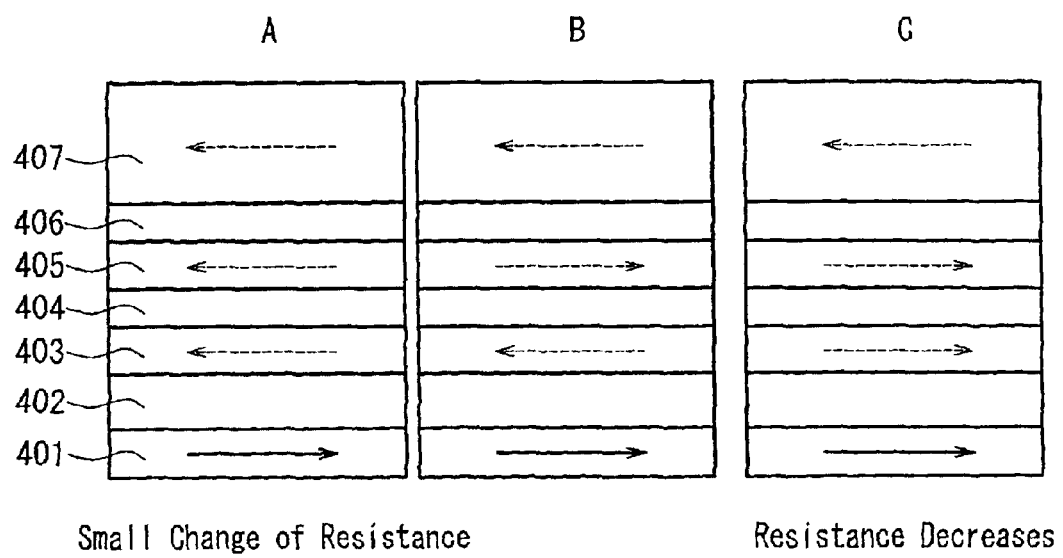
FIG. 16 illustrates the operating principle of a non-destructive read-out magneto-resistive element of the present invention.

The film thickness Y of the Al$_2$O$_3$ was adjusted so that ca. 100 Ω$\mu$m of RA was measured. This multilayer film was thermally processed at 280° C. in a magnetic field of 5 kOe, and microprocessed using EB and photolithography into a mesa shape with an element area of 0.5×1.5 $\mu$m$^2$. After forming an inter-layer insulator film, an upper electrode was formed, yielding vertical current-type magneto-resistive elements with the cross section shown in FIG. 1 or FIG. 7. FIG. 15 is a diagram showing schematically, after the uppermost NiFe(7) layer was magnetically reversed by applying a magnetic field of 500 Oe in the longitudinal direction and then the magnetic field was removed, the magnetization state of the magnetic layer when applying an external magnetic field of ±100 Oe. For the pinned layer 401, FIG. 15 shows only the configuration upward from the CoFe layer nearest to the intermediate layer 402. In FIG. 15, B indicates a magnetically stable state, and when an external magnetic field not greater than the magnetization reversal magnetic field of the third magnetic layer (memory layer) 407 on the second non-magnetic layer 406 is applied, a change to the magnetization state A or C occurs. It should be noted that in order to simplify the illustration of the operation, the spin flop states are not shown in FIG. 15. Since the first magnetic layer 403 and the second magnetic layer 405 are antiferromagnetically coupled through the non-magnetic layer 404, the element returns to the state B when the external magnetic field is relatively small. In this situation, the change of the magnetic resistance increases most with the change from B to A. FIG. 16 illustrates the situation when the magnetization state of the magnetic layer 407 has been reversed. In FIG. 16, the magnetically stable state is B, and a considerable reduction of resistance can be found at the change from B to C.

Using this principle, the memory state of the magneto-resistive element of this working example was detected. FIG. 17 shows the element configuration.

A multilayer film of the reverse configuration order as above was formed on a substrate provided with a CMOS and a lower wiring. This multilayer film was thermally processed at 280° C. in a magnetic field of 5 kOe, and microprocessed using EB and photolithography into a mesa shape with an element area of 0.5×1.5 $\mu$m$^2$. After forming an inter-layer insulator film, an upper electrode was formed, yielding an MRAM element as shown in FIGS. 17A and 17B.

The magnetization state was stored in the third magnetic layer by a writing operation, in which a current flows through both the word line and the bit line. When reading, the CMOS switch connected in series to the element was turned on, thus letting a sense current flow. In this situation, a reading magnetic field was generated by letting a read current flow in the word line, and the change of the voltage across the element was read. FIG. 17B shows a state in which, because the reading magnetic field and the magnetization direction of the intermediate layer match, there is almost no voltage change with respect to the reading magnetic field, so that it can be determined that the magnetization is parallel to the magnetization direction of the pinned magnetic layer.

Thus, it is shown that by devising the free magnetic layer as a multilayer, an MRAM element can be produced, with which the magnetization state of the memory can be read non-destructively.

WORKING EXAMPLE 20

The following elements were produced by magnetron sputtering on a thermally oxidized Si substrate.

Sample 1
Ta(3)/Cu(50)/Ta(3)/PtMn(15)/CoFe(3)/Ru(0.9)/CoFe(3)/Al$_2$O$_3$(Y)/NiFe(4)/Al$_2$O$_3$(Y)/CoFe(3)/Ru(0.9)/CoFe(3)/PtMn(15)/Ta(3)

Sample 2
Ta(3)/Cu(50)/Ta(3)/PtMn(15)/CoFe(3)/Ru(0.9)/CoFe(3)/Al$_2$O$_3$(Y)/NiFe(2)/Al$_2$O$_3$(Y)/CoFe(3)/Ru(0.9)/CoFe(3)/PtMn(15)/Ta(3)

Sample 3
Ta(3)/Cu(50)/Ta(3)/PtMn(15)/CoFe(3)/Ru(0.9)/CoFe(3)/Al$_2$O$_3$(Y)/NiFe(3)/Ta(3)/NiFe(5)/Al$_2$O$_3$(Y)/CoFe(3)/PtMn(15)/Ta(3)

Sample 4
Ta(3)/Cu(50)/Ta(3)/PtMn(15)/CoFe(3)/Ru(0.9)/CoFe(3)/Al$_2$O$_3$(Y)/NiFe(3)/Ta(3)/NiFe(5)/Al$_2$O$_3$(Y)/CoFe(3)/Ru(0.9)/CoFe(3)/PtMn(15)/Ta(3)

Sample 5
Ta(3)/Cu(50)/Ta(3)/PtMn(15)/CoFe(3)/Ru(0.9)/CoFe(3)/Al$_2$O$_3$(Y)/NiFe(3)/Ru(0.9)/NiFe(5)/Al$_2$O$_3$(Y)/CoFe(3)/PtMn(15)/Ta(3)

Sample 6
Ta(3)/Cu(50)/Ta(3)/PtMn(15)/CoFe(2)/Ru(0.9)/CoFe(4)/Ru(0.9)/CoFe(2)/Al$_2$O$_3$(Y)/NiFe(3)/Ru(0.9)/NiFe(5)/Al$_2$O$_3$(Y)/CoFe(3)/Ru(0.9)/CoFe(3)PtMn(15)/Ta(3)

The film thickness Y of the Al$_2$O$_3$ was adjusted so that ca. 300 Ω$\mu$m of RA was measured. These multilayer films were thermally processed at 280° C. in a magnetic field of 5 kOe, and microprocessed using EB and photolithography into a mesa shape with an element area of 0.1×0.3 $\mu$m$^2$. After forming an inter-layer insulator film, an upper electrode was formed, yielding vertical current-type magneto-resistive elements with two intermediate layers. When a magnetic field was applied in the longitudinal direction of the elements and the MR was measured, a change in the magnetic resistance of about 30% was attained at the optimum magnetic field in all elements except for Sample 2. In Sample 2, the NiFe layer was comparatively thin, so that no sufficient softness was attained, an the change of the magnetic resistance was about 10%. Disregarding Sample 2, the coercivity of the elements was the strongest in Sample 1, and it seems that in Sample 1 the influence of the demagnetizing field is stronger than in the other elements. Moreover, in Sample 1, the non-symmetry of the MR curve was largest. It should be noted that in Sample 3 to Sample 5, the number of magnetic layers forming the pinned magnetic layer is non-symmetric with respect to the intermediate layer, because when the external magnetic field is relatively weak, the two magnetic layers constituting the free magnetic layer are anti-parallel to one another. When a sufficiently large external magnetic field is applied, the pinned and magnetic layers also can be configured to be symmetric with respect to the intermediate layer. It should also be noted that in the configuration of Sample 3, when the external magnetic field becomes suitably strong, the MR is reduced substantially by half, and in the configuration of Sample 4, when the external magnetic field becomes suitably strong, the MR is substantially doubled.

In the above working example, the free magnetic layer is sandwiched by two intermediate layers, and the free magnetic layers include two magnetic layers and one non-magnetic layer that are layered in alternation, but a similar effect also can be attained when the free magnetic layer includes 2n (with n=1, 2 . . . ) magnetic layers and 2n−1 non-magnetic layer that are layered in alternation.

WORKING EXAMPLE 21

The following elements were produced by magnetron sputtering on a thermally oxidized Si substrate.

Sample 1
Ta(3)/Cu(50)/Ta(3)/PtMn(15)/CoFe(3)/Ru(0.9)/CoFe(3)/ $Al_2O_3$(Y)/NiFe(3)/Ta(3)/NiFe(3)/Ta(3)/NiFe(3)/$Al_2O_3$(Y)/CoFe(3)/Ru(0.9)/CoFe(3)/PtMn(15)/Ta(3)

Sample 2
Ta(3)/Cu(50)/Ta(3)/PtMn(15)/CoFe(3)/Ru(0.9)/CoFe(3)/ $Al_2O_3$(Y)/NiFe(3)/Ru(0.9)/NiFe(3)/Ru(0.9)/NiFe(3)/ $Al_2O_3$(Y)/CoFe(3)/Ru(0.9)/CoFe(3)/PtMn(15)/Ta(3)

Sample 3
Ta(3)/Cu(50)/Ta(3)/PtMn(15)/CoFe(3)/Ru(0.9)/CoFe(3)/ $Al_2O_3$(Y)/NiFe(3)/Ru(0.9)/NiFe(5)/Ru(0.9)/NiFe(3)/ $Al_2O_3$(Y)/CoFe(3)/Ru(0.9)/CoFe(3)/PtMn(15)/Ta(3)

Sample 4
Ta(3)/Cu(50)/Ta(3)/PtMn(15)/CoFe(3)/Ru(0.9)/CoFe(3)/ $Al_2O_3$(Y)/NiFe(3)/Ru(0.9)/NiFe(6)/Ru(0.9)/NiFe(3)/ $Al_2O_3$(Y)/CoFe(3)/Ru(0.9)/CoFe(3)/PtMn(15)/Ta(3)

Sample 5
Ta(3)/Cu(50)/Ta(3)/PtMn(15)/CoFe(3)/Ru(0.9)/CoFe(3)/ $Al_2O_3$(Y)/NiFe(3)/Ru(0.9)/NiFe(7)/Ru(0.9)/NiFe(3)/ $Al_2O_3$(Y)/CoFe(3)/Ru(0.9)/CoFe(3)/PtMn(15)/Ta(3)

Sample 6
Ta(3)/Cu(50)/Ta(3)/PtMn(15)/CoFe(3)/Ru(0.9)/CoFe(3)/ $Al_2O_3$(Y)/NiFe(4)/$Al_2O_3$(Y)/CoFe(3)/Ru(0.9)/CoFe(3)/PtMn(15)/Ta(3)

The film thickness Y of the Al2O8 was adjusted so that ca. 300 Ω$\mu$m of RA was measured. These multilayer films were thermally processed at 280° C. in a magnetic field of 5 kOe, and microprocessed using EB and photolithography into a mesa shape with an element area of 0.1×0.3 $\mu m^2$. After forming an inter-layer insulator film, an upper electrode was formed, yielding vertical current-type magneto-resistive elements with two intermediate layers. When a magnetic field was applied in the longitudinal direction of the elements and the MR was measured, a change in the magnetic resistance of about 30% was attained at the optimum magnetic field in all elements. However, in Sample 3, the increase of the MR at low magnetic fields was small, and in Sample 6, the coercivity was largest. Furthermore, in Sample 2, an MR curve similar to the left one in FIG. 14 was attained, and in Sample 4 and Sample 5, an MR curve similar to the right one in FIG. 15 was attained. Comparing Sample 3 and Sample 4, the configuration of the free magnetic layer in Sample 3 is NiFe(3)/Ru(0.9)/NiFe(5)/Ru(0.9)/NiFe(3) whereas the configuration of the free magnetic layer in Sample 4 is NiFe(3)/Ru(0.9)/NiFe(6)/Ru(0.9)/NiFe(3). Assuming that the magnetic layers are completely antiferromagnetically coupled, it seems that judging by the configuration, a complete magnetic circuit is formed by the free magnetic layer, and the response to the external magnetic field seems to be poor for low magnetic fields. However, when taking $Al_2O_3$ and Ru as the primer, and measuring by VSM the effective saturation magnetization of the NiFe for various film thicknesses (saturation magnetization reached at the magnetic field level when measuring the MR), it was found that the thinner the film thickness of the NiFe is, the effective smaller the saturation magnetization. Comparing (film thickness)×(saturation magnetization) of Sample 3 and Sample 4 based on this effective saturation magnetization, it was found that the sum of the (film thickness)×(saturation magnetization) of the first and the third layer was substantially equal to the (film thickness)×(saturation magnetization) of second layer, whereas in Sample 4, the value of for the second layer was larger than the sum of the first and the third layer. From this, it can be seen that the effective saturation magnetization reflecting the film thicknesses of the primer and the magnetic layers should be taken into consideration for the film configuration.

The above working example described a configuration in which a first pinned magnetic layer, a first intermediate layer, a first magnetic layer, a first non-magnetic layer, a second magnetic layer, a second non-magnetic layer, a third magnetic layer, a second intermediate layer, and a second pinned magnetic layer were formed in that order, and when an average film thickness of the magnetic layer n is dn, and its average saturation magnetization is Mn (with n=1, 2, 3), then M3×d3+M1×d1≠M2×d2. However, a similar effect can be attained when the free magnetic layer includes 2n+1 magnetic layers (with n=1, 2 . . . ) and 2n non-magnetic layers, layered in alternation.

WORKING EXAMPLE 22

The following elements were produced by magnetron sputtering on a 6-inch thermally oxidized Si substrate.

Sample 1
Ta(3)/Cu(50)/Ta(3)/PtMn(15)/Co Fe(3)/Ru(0.9)/CoFe(3)/ $Al_2O_3$(Y)/CoFe(3)/Ru(0.7)CoFe(5)/Ta(3)

Sample 2
Ta(3)/Cu(50)/Ta(3)/PtMn(15)/CoFe(3)/Ru(0.9)/CoFe(3)/ $Al_2O_3$(Y)/CoFe(3)/Ru(0.7)/NiFe(7)/Ta(3)

The film thickness Y of the $Al_2O_3$ was adjusted so that ca. 1 Ω$\mu$m of RA was measured. Here, the product (saturation magnetization)×(film thickness) is substantially the same for CoFe(5) and NiFe(7) on a Ru primer. These multilayer films were thermally processed at 280° C. in a magnetic field of 10 kOe, and microprocessed using an I-line stepper into a mesa shape with an element area of 0.2×0.6 $\mu m^2$. After forming an inter-layer insulator film, an upper electrode was formed, yielding vertical current-type magneto-resistive elements. When the MR of the elements was measured across the entire six inches of the wafer, it was found that the coercivity variations were about 10% with Sample 1, whereas the coercivity variations were about 5% with Sample 2. The film thickness distribution of CoFe and NiFe in the six-inch wafer was in both cases 3%, so that these variations cannot be explained easily. One possible reason for the coercivity variations seems to be the dependency of the effective saturation magnetization on the film thickness. When the effective saturation magnetization was determined while changing the film thicknesses of the CoFe and NiFe on the Ru primer, there was a 20% change in the effective saturation magnetization when changing the thickness of the 5 nm CoFe thin film by 1 nm, and there was a 5% change for the case of NiFe. Furthermore, the change of the coercivity of the CoFe single layer and NiFe single layer with respect to similar film thicknesses was about 15% for CoFe and about 2% for NiFe. Thus, it can be said that in order to suppress variations of the coercivity when making the area large, it is useful to use for the free magnetic layers with multilayer structure magnetic layers with different saturation magnetization or magnetic layers with different coercivity.

WORKING EXAMPLE 23

The following elements were produced by magnetron sputtering on a 6-inch thermally oxidized Si substrate.
Sample 1
    Ta(3)/Cu(50)/Ta(3)/PtMn(15)/CoFe(3)/Al$_2$O$_3$(Y)/CoFe(3)/Ru(0.9)/NiFe(5)/Ta(3)
Sample 2
    Ta(3)/Cu(50)/Ta(3)/PtMn(15)/CoFe(3)/Ru(0.9)/CoFe(3)/Al$_2$O$_3$(Y)/CoFe(3)/Ru(0.9)/NiFe(5)/Ta(3)
Sample 3
    Ta(3)/Cu(50)/Ta(3)/PtMn(15)/CoFe(2)/Ru(0.9)/CoFe(3.5)/Ru(0.9)/CoFe(2)/Al$_2$O$_3$(Y)/CoFe(3)/Ru(0.9)/NiFe(5)/Ta(3)

The film thickness Y of the Al203 was adjusted so that ca. 1 Ω$\mu$m of RA was measured. These multilayer films were thermally processed at 280° C. in a magnetic field of 10 kOe, and microprocessed using lithography into mesa shape with an element area of 0.2×0.6 $\mu$m$^2$. After forming an inter-layer insulator film, an upper electrode was formed, yielding vertical current-type magneto-resistive elements. The MR of the elements was measured, making the direction of the external magnetic field constant with respect to the thermal processing direction. In both Sample 1 and Sample 3, the polarity of the magnetic field matched with the direction attaining the maximum or the minimum in the MR, and in Sample 2, the opposite magnetic field characteristics were attained. When Sample 1 and Sample 2 or Sample 2 and Sample 3 were combined and the operational output of the two elements was measured as shown in FIG. 10, the output voltage was non-symmetrical at low magnetic fields with the combination of Sample 1 and Sample 3. This seems to be because in Sample 1, the pinned magnetic layer does not have a layered ferrimagnetic structure, thus leading to non-symmetric components. Consequently, to attain an operational output with good symmetry, as is desirable for magnetic heads and MRAMs or the like, it is apparently important to combine a magneto-resistive element with a pinned magnetic layer in which 2n magnetic layers and (2n−1) non-magnetic layers are layered in alternation from the intermediate layer, and a magneto-resistive element with a pinned magnetic layer in which (2n+1) magnetic layers and 2n non-magnetic layers are layered in alternation from the intermediate layer.

WORKING EXAMPLE 24

The following elements were produced by magnetron sputtering on a CMOS substrate.
Sample 1
    Ta(3)/Cu(50)/Ta(3)/PtMn(15)/CoFe(3)/Al$_2$O$_3$(Y)/CoFe(5)/Ta(3)/CoFe(3)
Sample 2
    Ta(3)/Cu(50)/Ta(3)/NiFeCr(4)/PtMn(15)/CoFe(3)/Al$_2$O$_3$(Y)/CoFe(5)/Ta(3)/CoFe(3)

The film thickness Y of the Al$_2$O$_3$ was adjusted so that ca. 1 Ω$\mu$m of RA was measured. These multilayer films were thermally processed at 260° C. in a magnetic field of 10 kOe, and microprocessed using lithography into mesa shape with an element area of 0.2×0.6 $\mu$m$^2$. After forming an inter-layer insulator film, an upper electrode was formed, yielding vertical current-type magneto-resistive elements. After measuring the MR of the elements, the elements were repeatedly subjected to a thermal process at 400° C. for 30 min in a 5% hydrogen atmosphere without applying a magnetic field, after which the MR was measured.

In Sample 1, the MR directly after forming the element was 30%, and after the first 400° C. thermal process the MR decreased to 12%, and after the second 400° C. thermal process the MR decreased to 10%. In Sample 2, on the other hand, the MR directly after forming the element was 30%, after the first 400° C. thermal process, the MR decreased to 20%, and after the second 400° C. thermal process, the MR decreased to 19%. Both samples showed excellent thermal resistance, in spite of being subjected to a high temperature thermal process without magnetic field after the thermal process for the uniaxial anisotropic formation of the pinned magnetic layer. Especially in Sample 2, in which NiFeCr was used for the primer layer of antiferromagnetic material, there was only a small deterioration of the MR. When further samples were examined, it was found that the thermal resistance in reducing atmospheres and without magnetic fields was about 450° C. When the wiring resistance of the elements was examined, it was found that after regular thermal processing under a magnetic field, the wiring resistance decreased considerably when subjecting the elements to further thermal processes in a reducing atmosphere.

WORKING EXAMPLE 25

The following elements were produced by magnetron sputtering on a thermally oxidized Si substrate.
Sample 1
    Ta(3)/Cu(50)/Ta(3)/NiFeCr(4)/PtMn(15)/CoFe(3)/Ru(0.9)/CoFe(3)/Al(0.4)—O/Al(0.3)—O/NiFe(5)/Ru(0.9)/NiFe(3)/Ta(3)
Sample 2
    Ta(3)/Cu(50)/Ta(3)/NiFeCr(4)/PtMn(15)/CoFe(3)/Ru(0.9)/CoFe(3)/Al(0.4)—O/Al(0.35)—O/NiFe(5)/Ru(0.9)/NiFe(3)/Ta(3)
Sample 3
    Ta(3)/Cu(50)/Ta(3)/NiFeCr(4)/PtMn(15)/CoFe(3)/Ru(0.9)/CoFe(3)/Al(0.4)—O/Al(0.3)—O./NiFe(5)/Ru(0.9)/NiFe(6)/Ru(0.9)/NiFe(5)/Al(0.4)—O/Al(0.3)—O./CoFe(3)/Ru(0.9)/CoFe(3)/PtMn(15)/Ta(3)
Sample 4
    Ta(3)/Cu(50)/Ta(3)/NiFeCr(4)/PtMn(15)/CoFe(3)/Ru(0.9)/CoFe(3)/Al(0.4)—O/Al(0.3)—O./NiFe(5)/Ru(0.9)/NiFe(3)/Cu(5)/NiFe(3)/Ru(0.9)/NiFe(5)/Al(0.4)—O/Al(0.3)—O./CoFe(3)/Ru(0.9)/CoFe(3)/PtMn(15)/Ta(3)
Sample 5
    Ta(3)/Cu(50)/Ta(3)/NiFeCr(4)/PtMn(15)/CoFe(3)/Ru(0.9)/CoFe(3)/Al(0.4)—O/Al(0.3)—O./NiFe(5)/Ru(0.9)/NiFe(3)/Cu(5)/NiFe(5)/Ru(0.9)/NiFe(3)/Al(0.4)—O/Al(0.3)—O./CoFe(3)/Ru(0.9)/CoFe(3)/PtMn(15)/Ta(3)

Here, Co$_{75}$Fe$_{25}$ was used for the CoFe, Ni$_{60}$Fe$_{40}$ was used for the NiFe, Ni$_{49}$Fe$_{12}$Cr$_{39}$ was used for the NiFeCr, and Pt$_{50}$Mn$_{50}$ was used for PtMn.

"Al(0.4)—O/Al(0.3)—O" means an Al$_2$O$_3$ tunneling insulating layer made by forming a 0.4 nm thick film of Al, oxidizing that film in an oxygen atmosphere at 100 mTorr for 1 min, forming a 0.3 nm thick film of Al, and again oxidizing that film in an oxygen atmosphere at 100 mTorr for 1 min. Also for Al(0.4)—O/Al(0.35)—O, similar Al films were formed and oxidized at 100 mTorr. Regarding the oxidation conditions, no large difference could be observed from pressures of 10 mTorr to 600 mTorr when the oxidation time was about 1 min.

The multilayer films were thermally processed at 280° C. in a magnetic field of 5 kOe, and microprocessed using EB and photolithography into mesa shapes with an element area of 0.8×1.2 $\mu m^2$. After forming an inter-layer insulator film, an upper electrode was formed, yielding vertical current-type magneto-resistive elements.

When applying a longitudinal magnetic field and measuring the MR of the elements, setting an element bias of about 1 mV in the optimum magnetic fields for all elements, Sample 1 showed an MR of 40%, Sample 2 showed an MR of 43%, and Samples 3, 4 and 5 showed MRs of 39%, 40%, and 42%, respectively. When measuring with an element bias of about 500 mV, Sample 1 dropped to 23% and Sample 2 to 20%, thus cutting the MR in half due to the bias dependency. On the other hand, the MRs of Samples 3, 4 and 5 were 35%, 36% and 35%, respectively. The RAs were 30 $\Omega \mu m^2$ for Sample 1, 70 $\Omega \mu m^2$ for Sample 2, and 60 $\Omega \mu m^2$ for Samples 3, 4 and 5. The RA of Samples 3, 4 and 5 was twice as high as that of Sample 1, and also the MR at high device voltages of 500 mV was improved considerably. This seems to be due to the fact that the two tunneling insulating layers are connected in series in Sample 3, 4 and 5. When the non-symmetry with respect to external magnetic fields was examined in Samples 3, 4 and 5, the symmetry increased from Sample 3 to Sample 4 to Sample 5. This seems to be due to the fact that the magnetic layers near the $Al_2O_3$ responding to the external magnetic field are adjacent to one another in Sample 3, and magnetization rotations are performed while maintaining a parallel state, whereas in Sample 4, the distance between the magnetic layers responding to the external magnetic field is enlarged by the non-magnetic conductive layer, and in Sample 5, the magnetizations that are adjacent to one another through the non-magnetic conductive layer can rotate while maintaining an anti-parallel state, so that the magnetostatic energy is reduced. Moreover, when in the configuration of Sample 4 and Sample 5 a write test was performed with two matching currents, as shown in FIG. 17, a high MR was attained with the same writing current when the thickness of the Cu was 2.6 nm to 50 nm. A similar effect was attained when using other common non-magnetic materials, such as Al, TiN, TiWN, CuAl, CuAlTi, Ag, Au or Pt instead of Cu as the conductive electrode material.

WORKING EXAMPLE 26

The following elements were produced by magnetron sputtering on a thermally oxidized Si substrate.

Sample 1
  Ta(3)/Cu(500)/Ta(3)/NiFeCr(4)/PtMn(15)/CoFe(3)/Ru(0.9)/CoFe(3)/Cu(5)/CoFe(1)/NiFe(3)/Ru(0.9)/NiFe(3)/Ta(3)

Sample 2
  Ta(3)/Cu(500)/Ta(3)/NiFeCr(4)/PtMn(15)/CoFe(3)/Ru(0.9)/CoFe(3)/Cu(10)/CoFe(1)/NiFe(3)/Ru(0.9)/NiFe(3)/Ta(3)

Sample 3
  Ta(3)/Cu(500)/Ta(3)/NiFeCr(4)/PtMn(15)/CoFe(3)/Ru(0.9)/CoFe(3)/Cu(5)/CoFe(1)/NiFe(3)/Ru(0.9)/NiFe(6)/Ru(0.9)/NiFe(3)/CoFe(1)/Cu(5)/CoFe(3)/Ru(0.9)/CoFe(3)/PtMn(15)/Ta(3)

Sample 4
  Ta(3)/Cu(500)/Ta(3)/NiFeCr(4)/PtMn(15)/CoFe(3)/Ru(0.9)/CoFe(3)/Cu(5)/CoFe(1)/NiFe(3)/Ru(0.9)/NiFe(3)/Cu(5)/NiFe(3)/Ru(0.9)/NiFe(5)/CoFe(1)/Cu(5)/CoFe(3)/Ru(0.9)/CoFe(3)/PtMn(15)/Ta(3)

Sample 5
  Ta(3)/Cu(500)/Ta(3)/NiFeCr(4)/PtMn(15)/CoFe(3)/Ru(0.9)/CoFe(3)/Cu(5)/CoFe(1)/NiFe(3)/Ru(0.9)/NiFe(3)/Cu(5)/NiFe(5)/Ru(0.9)/NiFe(3)/CoFe(1)/Cu(5)/CoFe(3)/Ru(0.9)/CoFe(3)/PtMn(15)/Ta(3)

Here, $Co_{90}Fe_{10}$ was used for the CoFe, $Ni_{60}Fe_{40}$ was used for the NiFe, $Ni_{49}Fe_{12}Cr_{39}$ was used for the NiFeCr, and $Pt_{50}Mn_{50}$ was used for PtMn.

The multilayer films were thermally processed at 280° C. in a magnetic field of 5 kOe, and microprocessed using EB and photolithography into mesa shapes with an element area of 0.5×0.5 $\mu m^2$. After forming an inter-layer insulator film, an upper electrode was formed, yielding vertical current-type magneto-resistive elements.

When applying a magnetic field in the longitudinal direction of the elements and measuring the MR of the elements, setting an element bias of about 1 mV in the optimum magnetic fields for all elements, Sample 1 showed an MR of 28%, Sample 2 showed an MR of 15%, and Samples 3, 4 and 5 showed MRs of 49%, 47%, and 42%, respectively. When the non-symmetry with respect to external magnetic fields was examined in Samples 3, 4 and 5, the symmetry increased from Sample 3 to Sample 4 to Sample 5.

WORKING EXAMPLE 27

The following elements were produced by magnetron sputtering on a thermally oxidized Si substrate.

Ta(3)/Cu(50)/Ta(3)/NiFeCr(4)/PtMn(15)/CoFe(3)/Ru(0.9)/CoFe(3)/$Al_2O_3$/NiFe(5)/Ru(0.9)/NiFe(3)/Ru(0.9)/NiFe(5)/$Al_2O_3$/CoFe(3)/Ru(0.9)/CoFe(3)/PtMn(20)/CoFe(3)/Ru(0.9)/CoFe(3)/$Al_2O_3$/NiFe(5)/Ru(0.9)/NiFe(3)/Ru(0.9)/NiFe(5)/$Al_2O_3$/CoFe(3)/Ru(0.9)/CoFe(3)/PtMn(15)/Ta(3)

Here, $Co_{76}Fe_{24}$ was used for the CoFe, $Ni_{60}Fe_{40}$ was used for the NiFe, $Ni_{49}Fe_{12}Cr_{39}$ was used for the NiFeCr, and $Pt_{50}Mn_{50}$ was used for PtMn.

The multilayer films were thermally processed at 280° C. in a magnetic field of 5 kOe, and microprocessed using EB and photolithography into mesa shapes with an element area of 0.5×0.5 $\mu m^2$. After forming an inter-layer insulator film, an upper electrode was formed, yielding a vertical current-type magneto-resistive element.

When applying a magnetic field in the longitudinal direction of the elements and measuring the MR of the elements, setting an element bias of about 1 mV in the optimum magnetic fields for all elements, an MR of 41% was measured, at 500 mV, an MR of 40% was measured, and at 1 V, an MR of 37% was measured. This showed that the bias dependency was improved considerably.

WORKING EXAMPLE 28

Sample 1
  Ta(3)/Cu(50)/Ta(3)/NiFeCr(4)/PtMn(15)/CoFe(3)/Ru(0.9)/CoFe(3)/$Al_2O_3$/NiFe(2)/Ta(3)

Sample 2
  Ta(3)/Cu(50)/Ta(3)/NiFe(2)/$Al_2O_3$(Y)/CoFe(3)/Ru(0.9)/CoFe(3)/PtMn(15)/Ta(3)

Sample 3
  Ta(3)/Cu(50)/Ta(3)/NiFeCr(4)/PtMn(15)/CoFe(3)/Ru(0.9)/CoFe(3)/$Al_2O_3$(Y)/NiFe(2)/NiFeCr(4)/Ta(3)

Sample 4
  Ta(3)/Cu(50)/Ta(3)/NiFeCr(4)/NiFe(2)/$Al_2O_3$(Y)/CoFe(3)/Ru(0.9)/CoFe(3)/PtMn(15)/Ta(3)

Here, $Co_{76}Fe_{24}$ was used for the CoFe, $Ni_{81}Fe_{19}$ was used for the NiFe, $(Ni_{81}Fe_{19})_{100-x}Cr_x$ was used for the NiFeCr, and $Pt_{50}Mn_{50}$ was used for PtMn. The film thickness Y of the $Al_2O_3$ was adjusted so that ca. 1 k$\Omega\mu$m of RA was measured.

The multilayer films were thermally processed at 280° C. in a magnetic field of 5 kOe, and microprocessed using EB and photolithography into mesa shapes with an element area of 0.3×0.9 $\mu m^2$. After forming an inter-layer insulator film, an upper electrode was formed, yielding vertical w current-type magneto-resistive elements.

When a magnetic field was applied in the longitudinal direction of the elements, and the MR was measured, a typical spin-valve type MR could not be observed in Sample 1 and Sample 2, and it seems that this is due to the magnetism of the thinner NiFe layer. On the other hand, an MR of about 30% was attained with Sample 2 and Sample 3. When the MR was measured for various X in $(Ni_{81}Fe_{19})_{100-x}Cr_x$, it was found that a spin-valve type MR is attained when X is 50 or less. However, when X is 10 or less, the coercivity increases considerably, which is due to a larger magnetization of the NiFeCr and an increase of the demagnetizing field. At this limit, the saturation magnetization of the NiFeCr was about 0.2 T. When X was 25, the saturation magnetization was substantially zero. A similar effect was also observed with Mo or W instead of Cr. In this working example, the free magnetic layer was a single layer with the composition $Ni_{81}Fe_{19}$, but the MR characteristics were improved when making the free magnetic layer thinner (to about 1 to 4 nm) with a buffer layer having a composition selected from $(Ni_{60}Fe_{40})_{100-x}(Cr, Mo, W)_x$ for $Ni_{60}Fe_{40}$, and $(Ni_{75}Fe_{25})_{100-x}(Cr, Mo, W)_x$ for $Co_{75}Fe_{25}$.

WORKING EXAMPLE 29

The following elements were produced by magnetron sputtering on a thermally oxidized Si substrate.
Sample 1
  Ta(3)/Cu(50)/Ta(3)/CoFe(1.25)/Ru(0.8)/CoFe(2.25)/ $Al_2O_3$(Y)/CoFe(3)/Ru(0.9)/CoFe(3)/PtMn(20)/Ta(3)
Sample 2
  Ta(3)/Cu(50)/Ta(3)/CoFe(1.5)/Ru(0.8)/CoFe(2.5)/$Al_2O_3$(Y)/CoFe(3)/Ru(0.9)/CoFe(3)/PtMn(20)/Ta(3)
Sample 3
  Ta(3)/Cu(50)/Ta(3)/CoFe(2)/Ru(0.8)/CoFe(3)/$Al_2O_3$(Y)/CoFe(3)/Ru(0.9)/CoFe(3)/PtMn(20)/Ta(3)
Sample 4
  Ta(3)/Cu(50)/Ta(3)/CoFe(2)/Ru(0.8)/CoFe(4)/Ru(0.8)/CoFe(3)/$Al_2O_3$(Y)/CoFe(3)/Ru(0.9)/CoFe(3)/PtMn(20)/Ta(3)
Sample 5
  Ta(3)/Cu(50)/Ta(3)/CoFe(3)/Ru(0.8)/CoFe(5)/Ru(0.8)/CoFe(3)/$Al_2O_3$(Y)/CoFe(3)/Ru(0.9)/CoFe(3)/PtMn(20)/Ta(3)

Here, $Co_{75}Fe_{25}$ was used for the CoFe. The film thickness Y of the $Al_2O_3$ was adjusted so that ca. 100 $\Omega\mu$m of RA was measured.

The multilayer films were thermally processed at 280° C. in a magnetic field of 5 kOe, and microprocessed using EB and photolithography into mesa shapes with an element area of 0.1×0.2 $\mu m^2$. After forming an inter-layer insulator film, an upper electrode and a protective film were formed, yielding vertical current-type magneto-resistive elements.

Ten elements were made with each multilayer film. When a magnetic field was applied in the longitudinal direction of the elements and the MR was measured, the magnetization reversal magnetic field (coercivity) of all elements was substantially the same. Letting the elements perform magnetization reversal in the direction in which the MR becomes largest, increasing the element temperature to 200° C. and 300° C. in an inert gas, and then letting the elements stand for 24 hours, the memory stability for those temperatures was examined. As a result, it was found that at 200° C., 20% of the elements of Sample 1 lost the initial memory state, whereas in the other samples, the initial memory state was preserved. At 350° C., 40% of the elements of Sample 1, and 10% of the elements of Sample 2 lost their memory state, whereas the elements of the other samples preserved their initial memory state.

From the above, it can be seen that the total thickness of the magnetic material constituting the free magnetic layer should be at least 4 nm. Moreover, in this working example, CoFe was used for the magnetic layers, and when the tests were performed using NiFe, it was found that the total thickness should be at least 7 nm, and with $Fe_3O_4$ at least 10 nm.

When measuring at an element bias of about 1 mV at the optimum magnetic field for all elements, Sample 1 showed an MR of 40%, Sample 2 showed an MR of 43%, and Samples 3, 4 and 5 showed an MR of 39%, 40% and 42%, respectively. When measuring at an element bias of about 500 mV, the MR dropped almost by half to 23% in Sample 1 and 20% in Sample 2, due to the bias dependency. On the other hand, it was 35%, 36% and 35% in Samples 3, 4, and 5, respectively. The RAs were 30 $\Omega\mu m^2$ for Sample 1, 70 $\Omega\mu m^2$ for Sample 2, 60 $\Omega\mu m^2$ for Samples 3, 4 and 5. The RA of Samples 3, 4 and 5 was twice as high as that of Sample 1, and at a high bias of 500 mV, a significant improvement of the MR could be observed. This seems to be due to the fact that the two tunneling insulating layers are connected in series in Sample 3, 4 and 5. When the non-symmetry with respect to external magnetic fields was examined in Samples 3, 4 and 5, the symmetry increased from Sample 3 to Sample 4 to Sample 5. This seems to be due to the fact that the magnetic layers near the $Al_2O_3$ responding to the external magnetic field are adjacent to one another in Sample 3, and magnetization rotations are performed while maintaining a parallel state, whereas in Sample 4, the distance between the magnetic layers responding to the external magnetic field is enlarged by the non-magnetic conductive layer, and in Sample 5, the magnetizations that are adjacent to one another through the non-magnetic conductive layer can rotate while maintaining an anti-parallel state, so that the magnetostatic energy is reduced. Moreover, when in the configuration of Sample 4 and Sample 5 a write test was performed with two matching currents, as shown in FIG. 17, a high MR was attained with the same writing current when the thickness of the Cu was 50 nm or less.

From the above, it can be seen that the total thickness of the magnetic material constituting the free magnetic layer should be at least 4 nm. Moreover, in this working example, CoFe was used for the magnetic layers, and when the tests were performed using NiFe, it was found that the total thickness should be at least 7 nm, and with $Fe_3O_4$ at least 10 nm.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A magneto-resistive element, comprising:
   an intermediate layer; and
   a pair of magnetic layers sandwiching the intermediate layer;
   wherein one of the magnetic layers is a free magnetic layer in which magnetization rotation with respect to an external magnetic field is easier than in the other magnetic layer;
   wherein the free magnetic layer is a multilayer film including at least one non-magnetic layer and magnetic layers sandwiching the non-magnetic layer; and
   wherein an element area, which is defined by the area of the intermediate layer through which current flows perpendicular to the film plane, is not larger than 1000 $\mu m^2$,
   the non-magnetic layer is a conductor including a multilayer film with at least one layer of non-magnetic metal and at least one layer of non-magnetic material selected from the group consisting of oxides, nitrides, carbides and borides.

2. The magneto-resistive element according to claim 1, wherein an area of the free magnetic layer is larger than the element area.

3. The magneto-resistive element according to claim 1, wherein at least one of the magnetic layers in the free magnetic layer has a coercivity or saturation magnetization that is different from at least one of the other magnetic layers.

4. The magneto-resistive element according to claim 1, further comprising a lower electrode made of a metal multilayer film, wherein the magneto-resistive element is formed on the lower electrode.

5. The magneto-resistive element according to claim 1, wherein the intermediate layer is made of an insulator or a semiconductor including at least one element selected from the group consisting of oxygen, nitrogen, carbon and boron.

6. The magneto-resistive element according to claim 1, wherein the free magnetic layer serves as a magnetic memory layer.

7. The magneto-resistive element according to claim 1, wherein, when "a" is the longest width of the element shape of the free magnetic layer, and "b" is its shortest width, then a/b is in the range of 1.5<a/b<10.

8. A method for manufacturing a magneto-resistive element according to claim 1, comprising additional heat treatment in a magnetic field at 200° C. to 400° C., after heat treatment at 300° C. to 450° C.

9. A method for manufacturing a magneto-resistive element according to claim 1, comprising heat treatment in a magnetic field at 300° C. to 450° C.

10. A method for manufacturing a magneto-resistive element according to claim 1, comprising:
    forming a multilayer film including an antiferromagnetic layer, a pinned layer, an intermediate layer and a free magnetic layer on a substrate;
    providing a uniaxial anisotropy by performing heat treatment in a magnetic field at 200° C. to 350° C.;
    performing additional heat treatment in a reducing atmosphere at 300° C. to 450° C.

11. A data communication terminal equipped with a plurality of magneto-resistive elements according to claim 1, wherein data that have been communicated by electromagnetic waves are stored in the free magnetic layers of the magneto-resistive elements.

12. The magneto-resistive element according to claim 1, comprising a pinned magnetic layer, an intermediate layer and a free magnetic layer, wherein the free magnetic layer is in contact with a buffer layer, wherein the buffer layer is made of a composition in which 10 wt % to 50 wt % of a non-magnetic element is added to a composition of a magnetic layer in contact with the buffer layer, and wherein the saturation magnetization of said composition is not more than 0.2T.

13. The magneto-resistive element according to claim 12, wherein the buffer layer comprises at least one selected from the group consisting of Cr, Mo and W.

14. The magneto-resistive element according to claim 1, further comprising a flux guide.

15. The magneto-resistive element according to claim 14, wherein at least a portion of the free magnetic layer serves as the flux guide.

16. The magneto-resistive element according to claim 1,
    wherein the intermediate layer is made of at least one metal selected from transition metals, or at least one conductive compound selected from compounds of transition metals with oxygen, nitrogen and boron; and
    wherein the element area is not larger than 0.01 $\mu m^2$.

17. The magneto-resistive element according to claim 16, wherein at least one of the magnetic layers sandwiching the intermediate layer comprises a ferromagnetic material including oxygen, nitrogen or carbon, or an amorphous ferromagnetic material.

18. The magneto-resistive element according to claim 1, wherein, when the magnetic layers m are the magnetic layers in the free magnetic layer that are arranged at positions m from the intermediate layer, where m is an integer of 1 or greater, Mm is an average saturation magnetization of the magnetic layers m and dm is their respective average layer thickness, then the sum of the products Mm×dm for odd m is substantially equal to the sum of the products Mm×dm for even m.

19. The magneto-resistive element according to claim 18, the non-magnetic layer has a thickness d in the range of 2.6 nm≦d<10 nm.

20. The magneto-resistive element according to claim 1, wherein, when the magnetic layers m are the magnetic layers in the free magnetic layer that are arranged at positions m from the intermediate layer, where m is an integer of 1 or greater, Mm is an average saturation magnetization of the magnetic layers m and dm is their respective average layer thickness, then the sum of the products Mm×dm for odd m is different from the sum of the products Mm×dm for even m.

21. The magneto-resistive element according to claim 20, the non-magnetic layer has a thickness d in the range of 2.6 nm≦d<10 nm.

22. The magneto-resistive element according to claim 20, wherein the non-magnetic layer has a thickness d in the range of 0.3 nm<d<2.6 nm.

23. The magneto-resistive element according to claim 20, wherein, when the free magnetic layer comprises a first magnetic layer, a non-magnetic layer and a second magnetic layer, layered in that order from the intermediate layer, and when an average film thickness of the first magnetic layer is d1, its average saturation magnetization is M1, an average film thickness of the second magnetic layer is d2, and its average saturation magnetization is M2, then $$M2 \times d2 > M1 \times d1; \text{ and}$$

wherein the second magnetic layer is made of a soft magnetic material or a hard magnetic material, and the first magnetic layer is made of a high spin polarization material at least at an interface with the intermediate layer.

24. The magneto-resistive element according to claim 20, wherein, when the free magnetic layer comprises a first magnetic layer, a non-magnetic layer and a second magnetic layer, layered in that order from the intermediate layer, and when an average film thickness of the first magnetic layer is d1, its average saturation magnetization is M1, an average film thickness of the second magnetic layer is d2, and its average saturation magnetization is M2, then $$M2 \times d2 > M1 \times d1; \text{ and}$$

the magnetic resistance displays at least one maximum or minimum with respect to a change in the external magnetization.

25. The magneto-resistive element according to claim 20, wherein the free magnetic layer comprises a first magnetic layer, a first non-magnetic layer, second magnetic layer, a second non-magnetic layer, and a third magnetic layer, layered in that order from the intermediate layer, and when an average film thickness of the magnetic layer n is dn, and its average saturation magnetization is Mn with being equal to 1, 2, or 3, $$M3 \times d3 > M1 \times d1 \text{ and } M3 \times d3 > M2 \times d2; \text{ and}$$

wherein a coupling magnetic field of the first magnetic layer and the second magnetic layer is smaller than a memory reversal magnetic field, and the magnetization state of the third magnetic layer is detected by applying a magnetic field that is smaller than the memory reversal magnetic field but larger than the coupling magnetic field in a memory direction of the magnetization of the third magnetic layer.

26. A magneto-resistive element comprising:
a magneto-resistive element A according to claim 20, wherein the free magnetic layer comprises a first magnetic layer, a non-magnetic layer and a second magnetic layer, layered in that order from the intermediate layer, and wherein M2×d2>M1×d1, when an average film thickness of the first magnetic layer is d1, its average saturation magnetization is M1, an average film thickness of the second magnetic layer is d2, and its average saturation magnetization is M2;
and further comprising a magneto-resistive element B having a second intermediate layer and a free magnetic layer that comprises a third magnetic layer and a fourth magnetic layer positioned in that order from the second intermediate layer, and wherein M3×d3>M4×d4, when an average film thickness of the third magnetic layer is d3, its average saturation magnetization is M3, an average film thickness of the fourth magnetic layer is d4, and its average saturation magnetization is M4;
wherein the element A and the element B respond to the same external magnetic field, and the output of element A and element B are added to or subtracted from one another.

27. The magneto-resistive element according to claim 20, further comprising a second intermediate layer, wherein the free magnetic layer, which is made of a multilayer film, is sandwiched by the intermediate layers.

28. The magneto-resistive element according to claim 27 wherein the free magnetic layer, which is made of a multilayer film, is made of 2n magnetic layers when n being an integer of 1 or greater, and 2n−1 non-magnetic layers layered in alternation.

29. The magneto-resistive element according to claim 28, further comprising a first pinned magnetic layer and a second pinned magnetic layer, wherein the first pinned magnetic layer, the first intermediate layer, the free magnetic layer, the second intermediate layer and the second pinned magnetic layer formed in that order, wherein the free magnetic layer is a multilayer film comprising a first magnetic layer, a non-magnetic layer and a second magnetic layer formed in that order from the side of the first pinned magnetic layer, and wherein, when an average film thickness of the magnetic layer n is dn, with n being 1 or 2, and its average saturation magnetization is Mn, then M2×d2≠M1×d1.

30. The magneto-resistive element according to claim 27, wherein the free magnetic layer, which is made of a multilayer film, is made of 2n+1 magnetic layers with n being an integer of 1 or greater, and 2n non-magnetic layers layered in alternation.

31. The magneto-resistive element according to claim 30, further comprising a first pinned magnetic layer and a second pinned layer, wherein the first pinned magnetic layer, the first intermediate layer, the free magnetic layer, the second intermediate layer and the second pinned magnetic layer formed in that order, wherein the free magnetic layer is a multilayer film comprising a first magnetic layer, a first non-magnetic layer, a second magnetic layer, a second non-magnetic layer and a third magnetic layer formed in that order from the side of the first pinned magnetic layer, and wherein, when an average film thickness of the magnetic layer n is dn, with n being 1, 2, or 3, and its average saturation magnetization is Mn, then M3×d3+M1×d1 ≠M2×d2.

32. The magneto-resistive element according to claim 27, comprising a first pinned magnetic layer, a first intermediate layer, a first free magnetic layer, a non-magnetic conductive layer, a second free magnetic layer, an second intermediate layer and a second pinned magnetic layer formed in that order, wherein at least one of the first free magnetic layer and the second free magnetic layer includes one or more magnetic layers and one or more non-magnetic layers layered in alternation.

33. The magneto-resistive element according to claim 32, wherein magnetic layers that are adjacent but spaced apart by a non-magnetic conductive layer are magnetized antiparallel to one another.

34. The magneto-resistive element according to claim 32, wherein the non-magnetic conductive layer has a thickness of 2.6 nm to 50 nm.

35. The magneto-resistive element according to claim 27, comprising four pinned magnetic layers, two free magnetic layers, and four intermediate layers, wherein at least one of the free magnetic layers is made of one or more magnetic layers and one or more non-magnetic layers layered in alternation.

36. A magneto-resistive element, comprising:
an intermediate layer; and
a pair of magnetic layers sandwiching the intermediate layer;
wherein one of the magnetic layers is a pinned magnetic layer in which magnetization rotation with respect to an external magnetic field is more difficult than in the other magnetic layer;
wherein the pinned magnetic layer is a multilayer film comprising at least one non-magnetic layer and magnetic layers sandwiching the non-magnetic layer;
wherein a thickness d of the non-magnetic layer is in the range of 0.3 nm<d<2.6 nm;
wherein the pinned magnetic layer is in contact with a primer layer or an antiferromagnetic layer; and wherein an element area, which is defined by the area of the intermediate layer through which current flows perpendicular to the film plane, is not larger than 1000 $\mu m^2$, the non-magnetic layer is a conductor including a multilayer film with at least one layer of non-magnetic metal and at least one layer of non-magnetic material selected from the group consisting of oxides, nitrides, carbides and borides.

37. The magneto-resistive element according to claim 36, wherein, when the magnetic layers m are the magnetic layers in the pinned magnetic layer that are arranged at positions m from the intermediate layer, where m is an integer of 1 or greater, Mm is an average saturation magnetization of the magnetic layers m and dm is their respective average layer thickness, then the sum of the products Mm×dm for odd m is substantially equal to the sum of the products Mm×dm for even m.

38. A magneto-resistive element comprising:
a magneto-resistive element A including a first pinned magnetic layer, in which 2n magnetic layers and 2n−1 non-magnetic layers (with n being an integer of 1 or greater) are layered in alternation from the intermediate layer; and
a magneto-resistive element B, including a second pinned magnetic layer, in n which 2n+1 magnetic layers and 2n non-magnetic layers are layered in alternation from the intermediate layer;
wherein at least one of the element A and the element B is as claimed in claim 19;
wherein the element A and the element B respond to the same external magnetic field; and
wherein the outputs of element A and element B are added to or subtracted from one another.

39. The magneto-resistive element according to claim 36, wherein the primer layer includes at least one element selected from Cu and the elements of groups IVa to VIa and VIII but excluding Fe, Co, and Ni.

40. The magneto-resistive element according to claim 36, wherein the primer layer is in contact with a magnetic layer, and the primer layer and that magnetic layer have at least one crystal structure selected from fcc and hcp structure, or the primer layer and that magnetic layer both include a bcc structure.

41. The magneto-resistive element according to claim 36, wherein the antiferromagnetic layer has a composition that can be expressed by $Mn_{100-x}Me_x$ wherein Me is at least one selected from the group consisting of Pd, and Pt, and $40 \leq x \leq 55$.

42. The magneto-resistive element according to claim 36, wherein at least the magnetic layer in contact with the antiferromagnetic layer is made of Co.

43. The magneto-resistive element according to claim 36, wherein the magnetic layer in contact with at least one selected from the antiferromagnetic layer and the non-magnetic layer is made of a ferromagnetic material including at least one element selected from the group consisting of oxygen, nitrogen and carbon.

44. The magneto-resistive element according to claim 36, wherein the magnetic layer in contact with at least one selected from the antiferromagnetic layer and the non-magnetic layer is made of an amorphous ferromagnetic material.

45. The magneto-resistive element according to claim 36, further comprising a lower electrode made of a metal multilayer film, wherein the magneto-resistive element is formed on the lower electrode.

46. The magneto-resistive element according to claim 36, wherein the intermediate layer is made of an insulator or a semiconductor including at least one element selected from the group consisting of oxygen, nitrogen, carbon and boron.

47. The magneto-resistive element according to claim 36, wherein the free magnetic layer serves as a magnetic memory layer.

48. The magneto-resistive element according to claim 36, wherein, when "a" is the longest width of the element shape of the free magnetic layer, and "b" is its shortest width, then a/b is in the range of 1.5<a/b<10.

49. A method for manufacturing a magneto-resistive element according to claim 36, comprising additional heat treatment in a magnetic field at 200° C. to 400° C., after heat treatment at 300° C. to 450° C.

50. A method for manufacturing a magneto-resistive element according to claim 36, comprising heat treatment in a magnetic field at 300° C. to 450° C.

51. A method for manufacturing a magneto-resistive element according to claim 36, comprising:
forming a multilayer film including an antiferromagnetic layer, a pinned layer, an intermediate layer and a free magnetic layer on a substrate;
providing a uniaxial anisotropy by performing heat treatment in a magnetic field at 200° C. to 350° C.;
performing additional heat treatment in a reducing atmosphere at 300° C. to 450° C.

52. A data communication terminal equipped with a plurality of magneto-resistive elements according to claim 36, wherein data that have been communicated by electromagnetic waves are stored in the free magnetic layers of the magneto-resistive elements.

53. The magneto-resistive element according to claim 36, comprising a pinned magnetic layer, an intermediate layer and a free magnetic layer, wherein the free magnetic layer is in contact with a buffer layer, wherein the buffer layer is made of a composition in which 10 wt % to 50 wt % of a non-magnetic element is added to a composition of a magnetic layer in contact with the buffer layer, and wherein the saturation magnetization of said composition is not more than 0.2T.

54. The magneto-resistive element according to claim 53, wherein the buffer layer comprises at least one selected from the group consisting of Cr, Mo and W.

55. The magneto-resistive element according to claim 36, further comprising a flux guide.

56. The magneto-resistive element according to claim 55, wherein at least a portion of the free magnetic layer serves as the flux guide.

57. The magneto-resistive element according to claim 36,
wherein the intermediate layer is made of at least one metal selected from transition metals, or at least one conductive compound selected from compounds of transition metals with oxygen, nitrogen and boron; and
wherein the element area is not larger than 0.01 $\mu m^2$.

58. The magneto-resistive element according to claim 57, wherein at least one of the magnetic layers sandwiching the intermediate layer comprises a ferromagnetic material including oxygen, nitrogen or carbon, or an amorphous ferromagnetic material.

59. The magneto-resistive element according to claim 36, wherein the antiferromagnetic layer is formed on a primer layer, and the primer layer and the antiferromagnetic layer include at least one crystal structure selected from fcc, fct, hcp and hct structure, or the primer layer and the antiferromagnetic layer both include a bcc structure.

60. The magneto-resistive element according to claim 59, wherein the primer layer is made of NiFe or NiFeCr; and which has been thermally processed at a temperature of at least 300° C.

61. The magneto-resistive element according to claim 36, wherein the antiferromagnetic layer is made of Cr and at least one selected from the group consisting of Mn, Te, Ru, Rh, Re, Os, Ir, Pd, Pt, Ag, Au and Al.

62. The magneto-resistive element according to claim 61, wherein the antiferromagnetic layer has a composition that can be expressed by $Cr_{100-x}Me_x$, where Me is at least one selected from the group consisting of Re, Ru, and Rh, and $0.1 \leq x \leq 20$.

* * * * *

UNITED STATES PATENT AND TRADEMARK OFFICE
CERTIFICATE OF CORRECTION

PATENT NO. : 6,767,655 B2
DATED : July 27, 2004
INVENTOR(S) : Hiramoto et al.

It is certified that error appears in the above-identified patent and that said Letters Patent is hereby corrected as shown below:

Column 54,
Line 21, "larger than 0.01 $\mu m^{2.}$" should read -- larger than 0.01 $\mu m^2$. --

Column 55,
Lines 21-22, "is Mn with being equal to 1, 2, or 3," should read -- is Mn, with n being equal to 1, 2, or 3, then --
Line 61, "claim 27" should read -- claim 27, --
Line 63, "magnetic layers when n" should read -- magnetic layers, with n --

Column 56,
Line 14, "magnetic layers with n" should read -- magnetic layers, with n --

Column 57,
Line 14, "layer, where m is" should read -- layer, wherein m is --

Column 57,
Lines 24-25, "layers (with n being an integer of 1 or greater) are" should read -- layers, with n being an integer of 1 or greater, are --
Line 32, "claim 19;" should read -- claim 36; --
Line 40, "VIII but excluding" should read -- VIII, but excluding --
Line 49, "by $Mn_{100-x}Me_x$ wherein Me" should read
-- by $Mn_{100-x}Me_x$, wherein Me --
Line 50, "consisting of Pd, and Pt, and" should read -- consisting of Pd and Pt, --

Column 58,
Line 59, "larger than 0.01 $\mu m^{2.}$" should read -- larger than 0.01 $\mu m^2$. --

Column 60,
Line 1, "consisting of Mn, Te, Ru," should read -- consisting of Mn, Tc, Ru --
Line 5, "where Me is" should read -- wherein Me is --

UNITED STATES PATENT AND TRADEMARK OFFICE
CERTIFICATE OF CORRECTION

PATENT NO. : 6,767,655 B2
DATED : July 27, 2004
INVENTOR(S) : Hiramoto et al.

It is certified that error appears in the above-identified patent and that said Letters Patent is hereby corrected as shown below:

Column 60, (cont)
Line 6, "consisting of Re, Ru, and Rh, and" should read -- consisting of Re, Ru, and Rh, and --

Signed and Sealed this

Twenty-fourth Day of May, 2005

JON W. DUDAS
*Director of the United States Patent and Trademark Office*